United States Patent

Yamada et al.

[11] Patent Number: 5,864,178
[45] Date of Patent: Jan. 26, 1999

[54] SEMICONDUCTOR DEVICE WITH IMPROVED ENCAPSULATING RESIN

[75] Inventors: Hiroshi Yamada; Takasi Togasaki; Masayuki Saito, all of Yokohama; Soichi Honma, Yamato; Miki Mori; Kazuki Tateyama, both of Yokohama, all of Japan

[73] Assignee: Kabushiki Kaisha Toshiba, Kawasaki, Japan

[21] Appl. No.: 580,978

[22] Filed: Jan. 3, 1996

[30] Foreign Application Priority Data

| Jan. 12, 1995 | [JP] | Japan | 7-003518 |
| Jun. 29, 1995 | [JP] | Japan | 7-163393 |
| Jul. 17, 1995 | [JP] | Japan | 7-180441 |
| Aug. 29, 1995 | [JP] | Japan | 7-220642 |
| Dec. 21, 1995 | [JP] | Japan | 7-333323 |

[51] Int. Cl.[6] .............................. H01L 21/60; H01L 23/28
[52] U.S. Cl. .......................... 257/737; 257/787; 257/788; 257/738; 257/790
[58] Field of Search ...................... 257/778, 787, 257/790, 789, 737, 738

[56] References Cited

U.S. PATENT DOCUMENTS

| 4,604,644 | 8/1986 | Beckham et al. | 357/80 |
| 5,121,190 | 6/1992 | Hsiao et al. | 357/80 |
| 5,371,404 | 12/1994 | Juskey et al. | 257/778 |
| 5,385,869 | 1/1995 | Liu et al. | 437/209 |
| 5,629,566 | 5/1997 | Doi et al. | 257/790 |

FOREIGN PATENT DOCUMENTS 0082708  10/1994  Japan .

*Primary Examiner*—Peter Toby Brown
*Assistant Examiner*—Hung Van Duong
*Attorney, Agent, or Firm*—Oblon, Spivak, McClelland, Maier & Neustadt, P.C.

[57] ABSTRACT

A semiconductor device comprising a wiring circuit board and a semiconductor chip mounted through a bump electrode on the circuit board, a space between the circuit board and the semiconductor chip as well as a periphery of the semiconductor chip being encapsulated with a resin containing a filler. The resin is constituted by a first resin disposed in a region surrounded by bump electrodes positioned on the outermost periphery of the semiconductor chip, and by a second resin disposed in a region not surrounded by bump electrodes positioned on the outermost periphery of the semiconductor chip, the first and second resins being distinct from each other in at least one feature selected from a content, a maximum particle diameter and an average particle diameter of the filler.

18 Claims, 48 Drawing Sheets

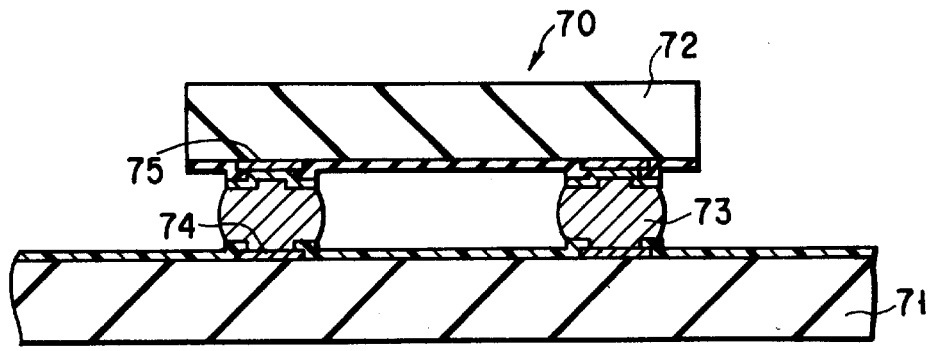
F I G. 1
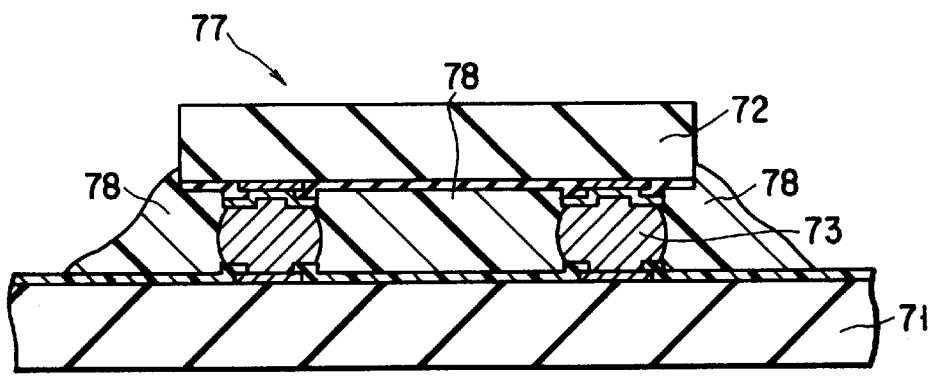
F I G. 2
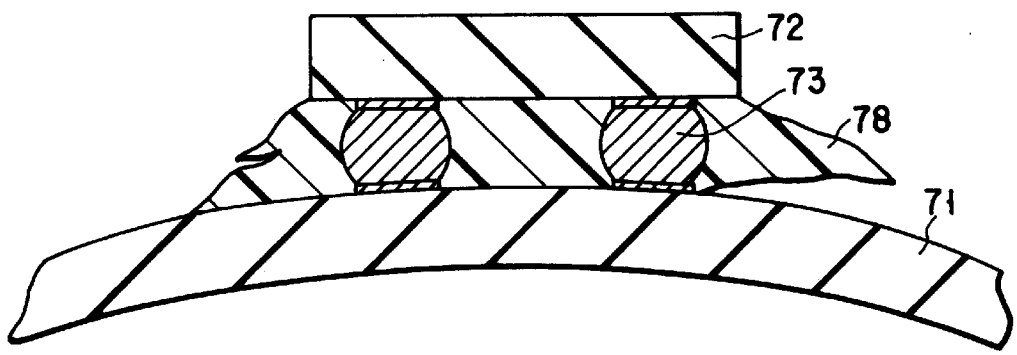
F I G. 3

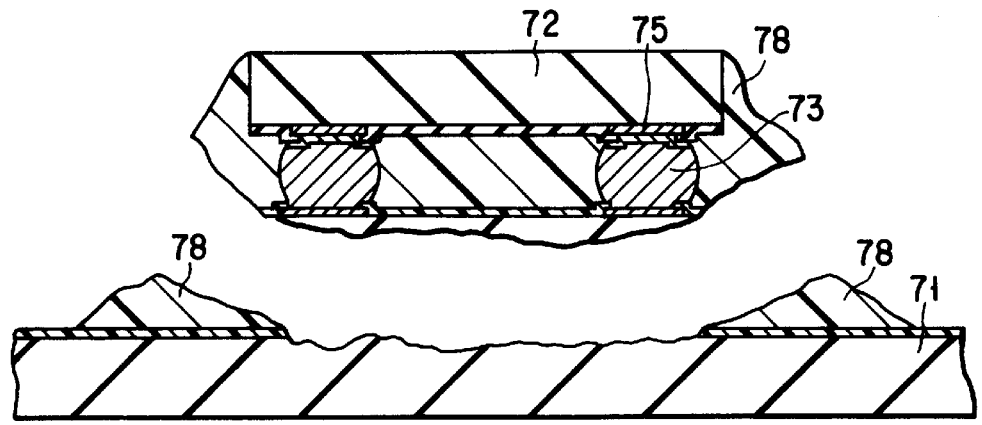
F I G. 4A
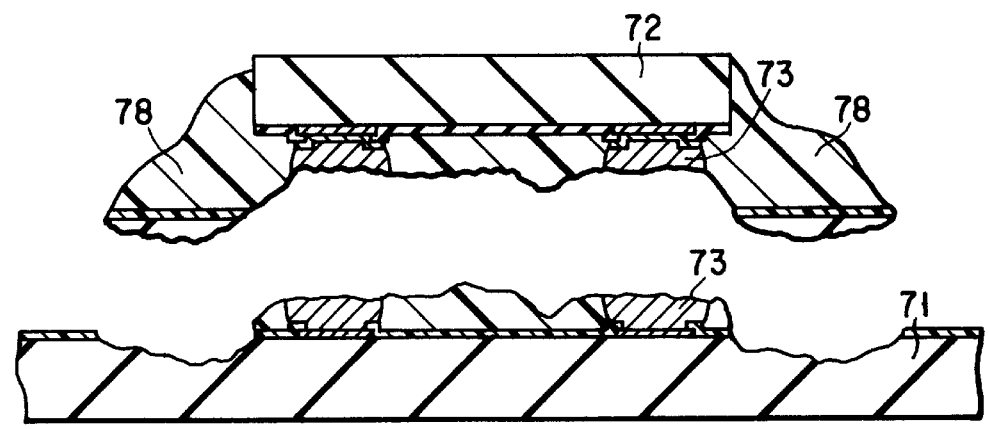
F I G. 4B
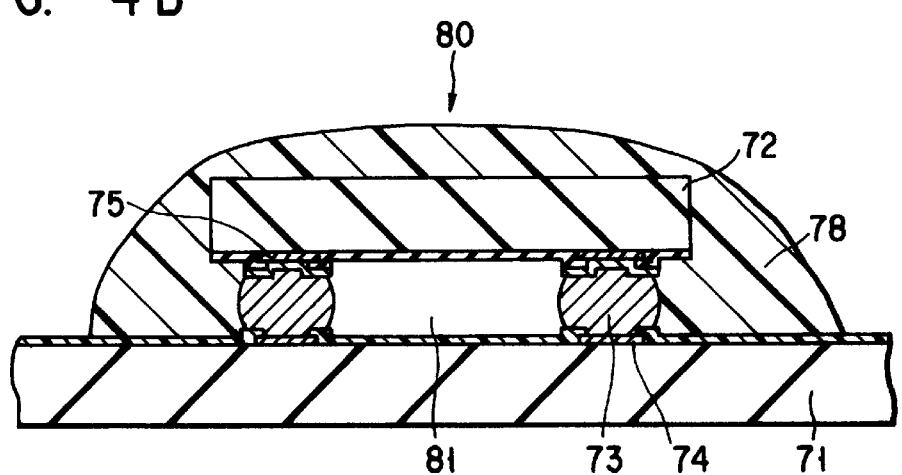
F I G. 5

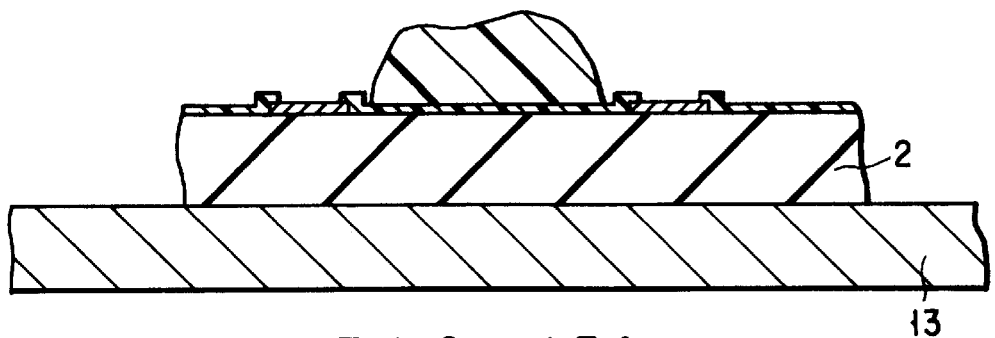
F I G. 15A
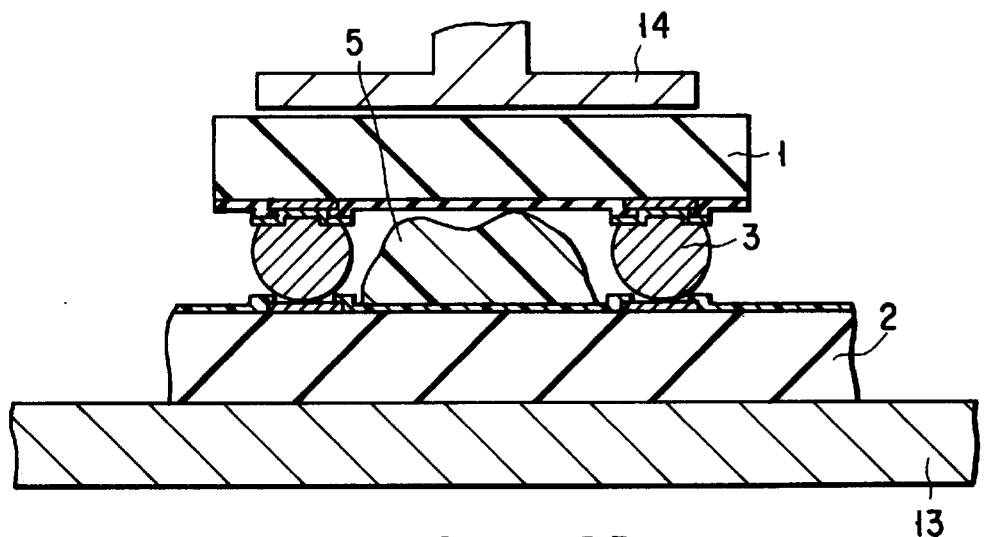
F I G. 15B
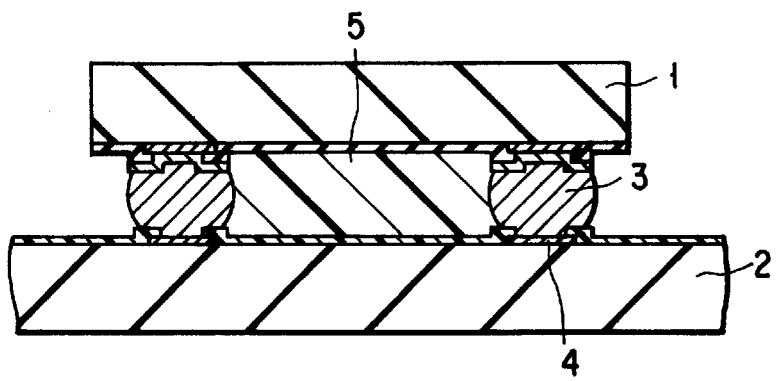
F I G. 15C

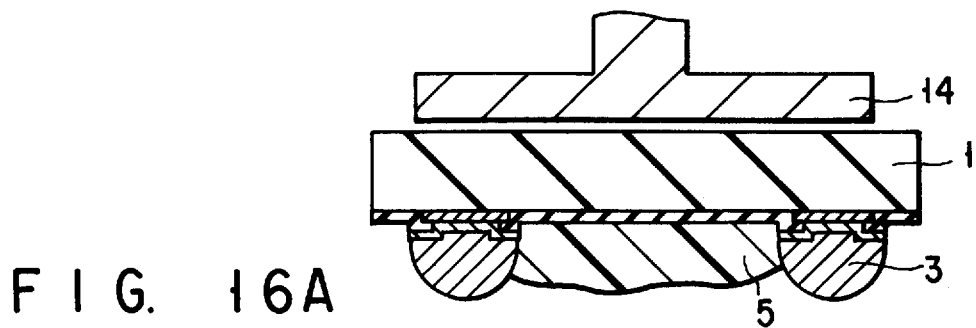
F I G. 16A
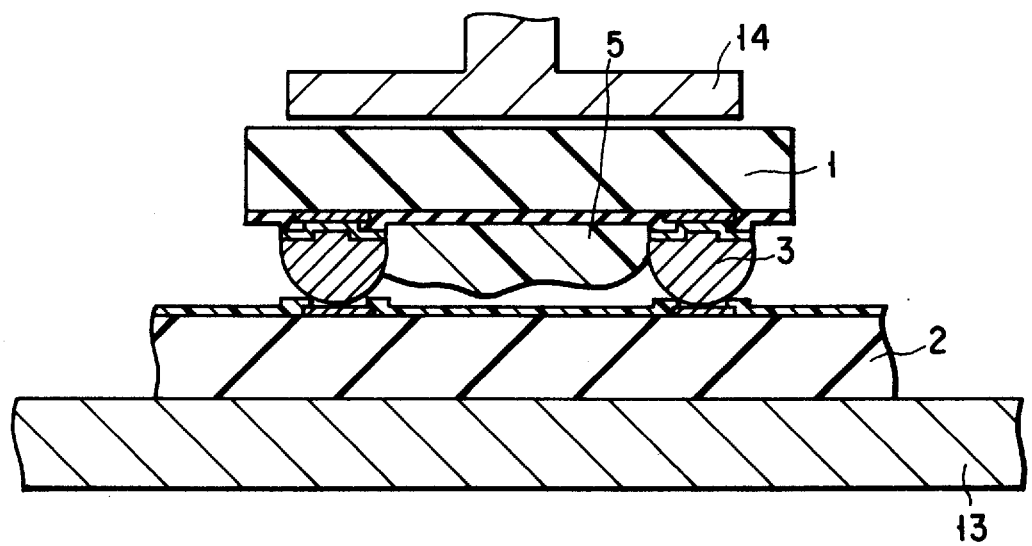
F I G. 16B
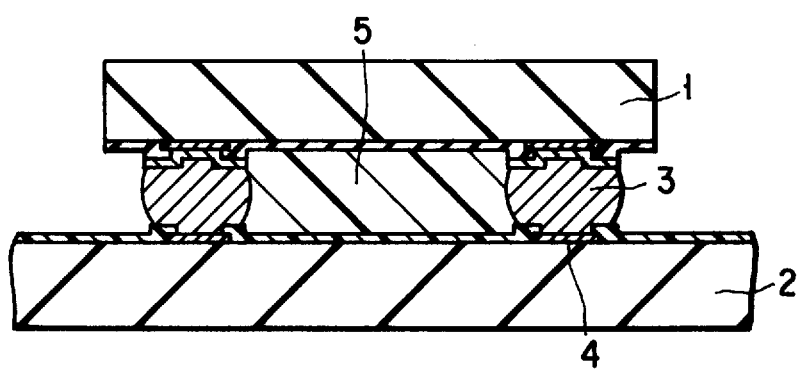
F I G. 16C

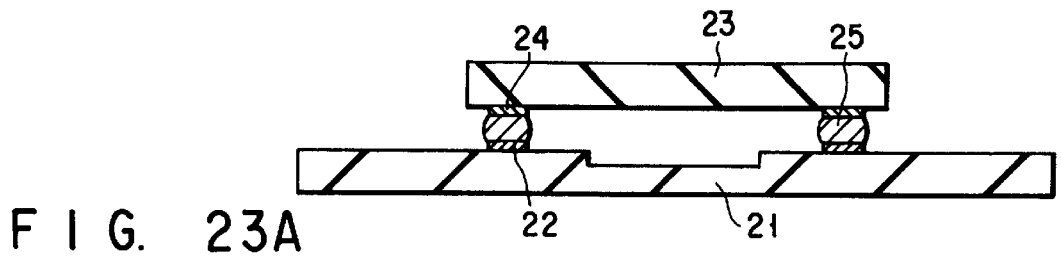
F I G. 23A
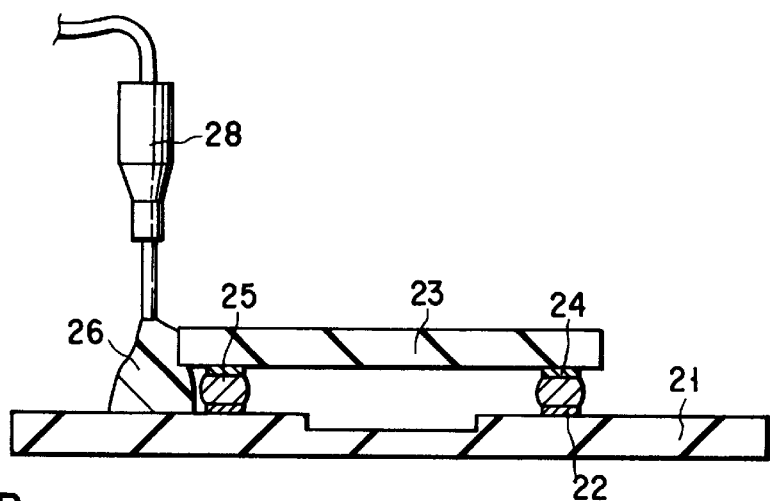
F I G. 23B
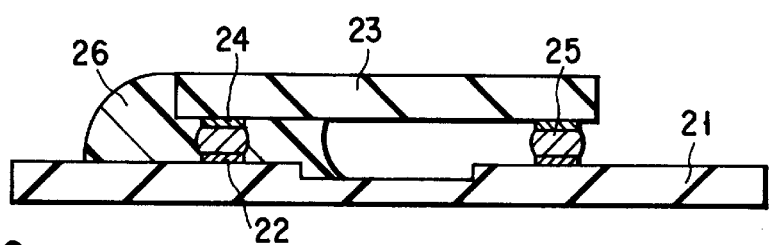
F I G. 23C
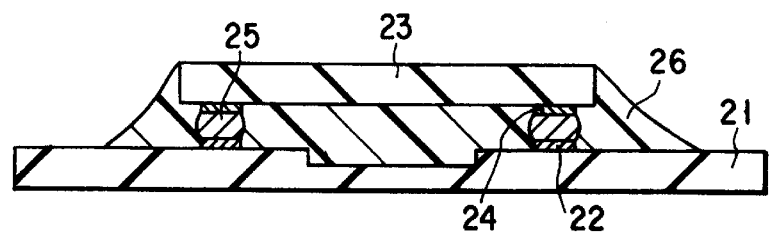
F I G. 23D

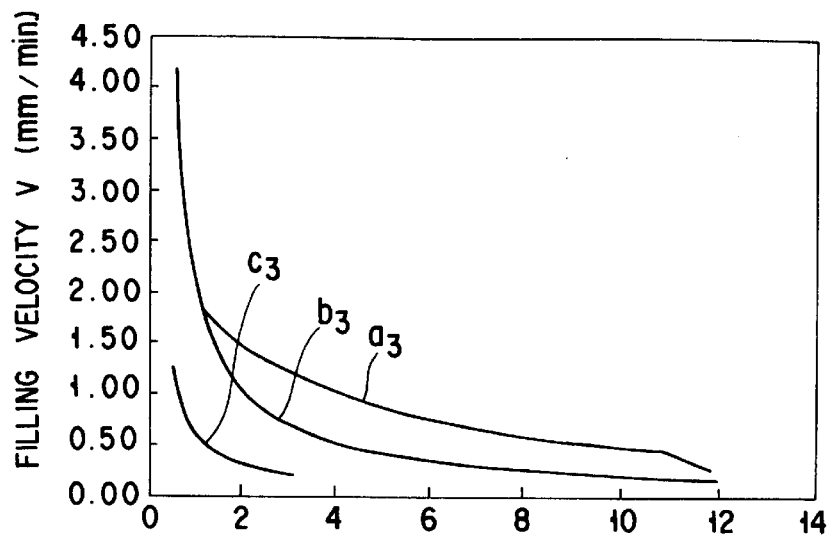
F I G. 24A
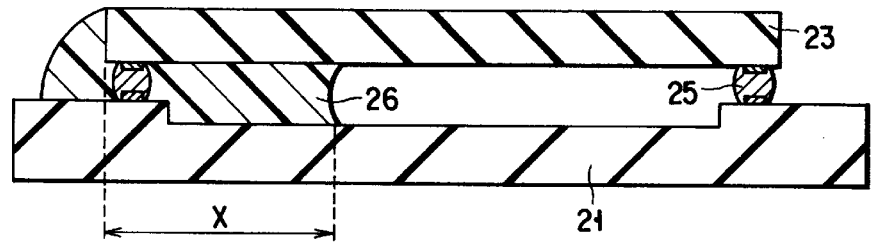
F I G. 24B
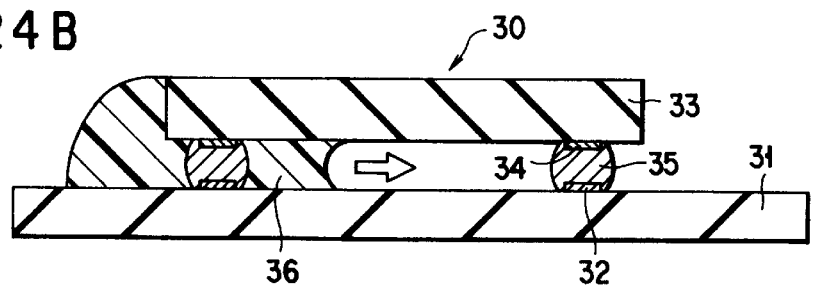
F I G. 25A
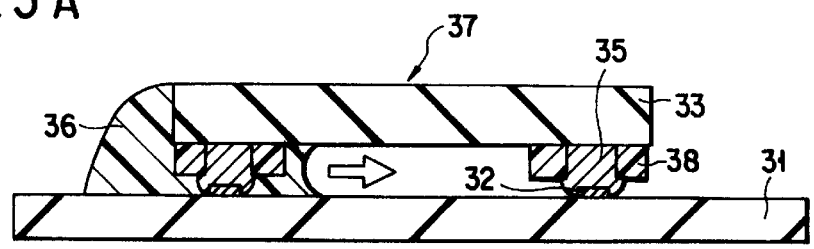
F I G. 25B

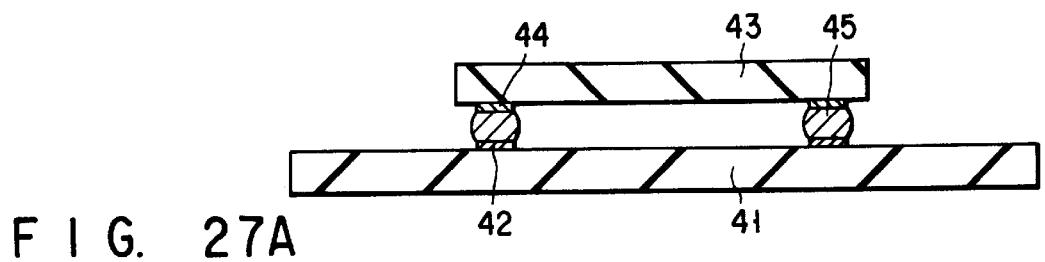
F I G. 27A
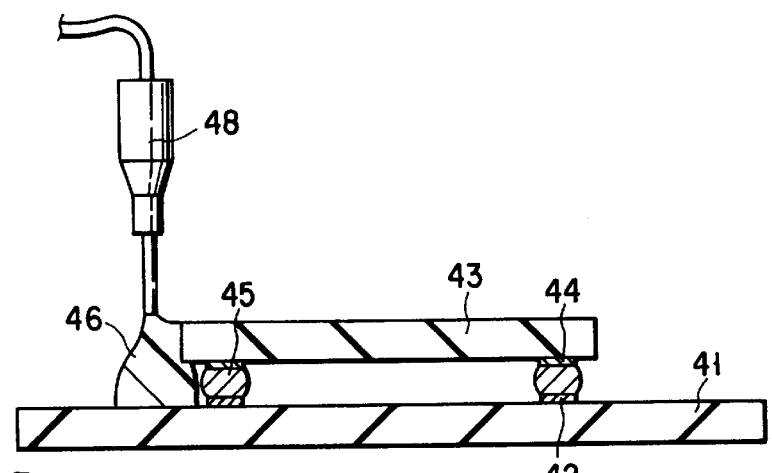
F I G. 27B
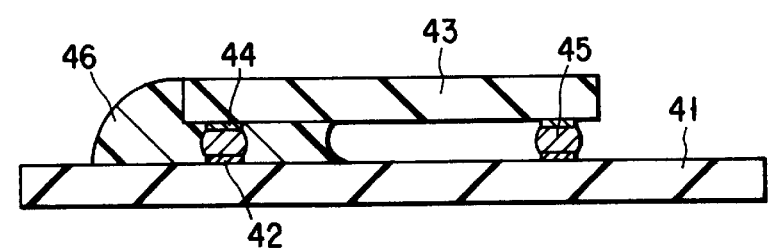
F I G. 27C
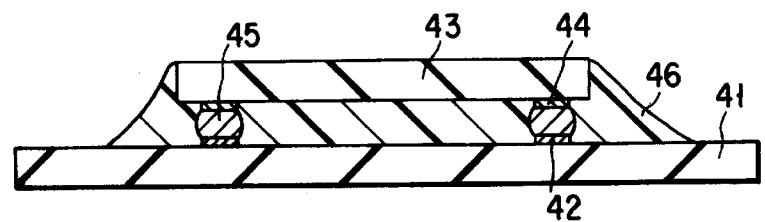
F I G. 27D

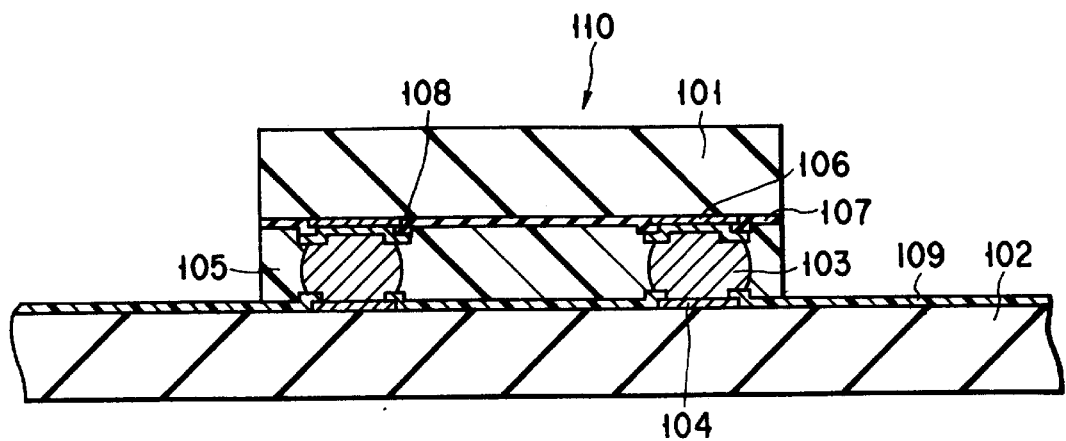
F I G. 29
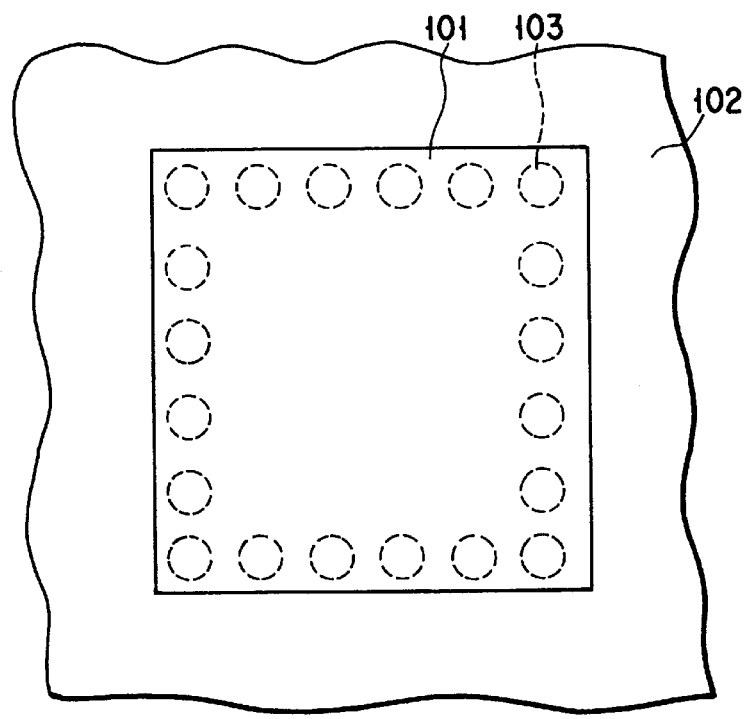
F I G. 30

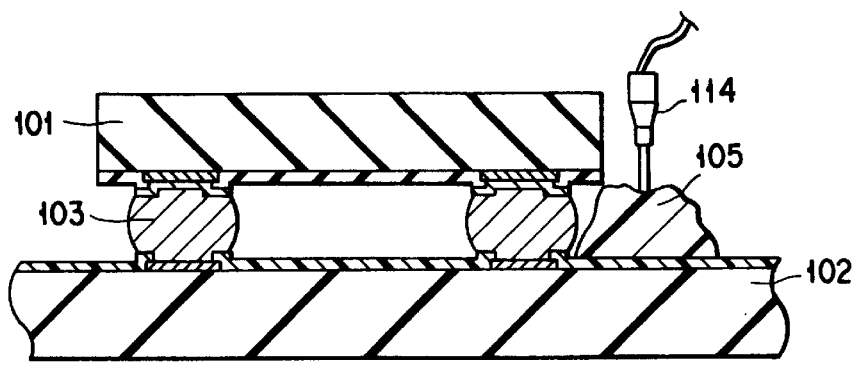
F I G. 31E
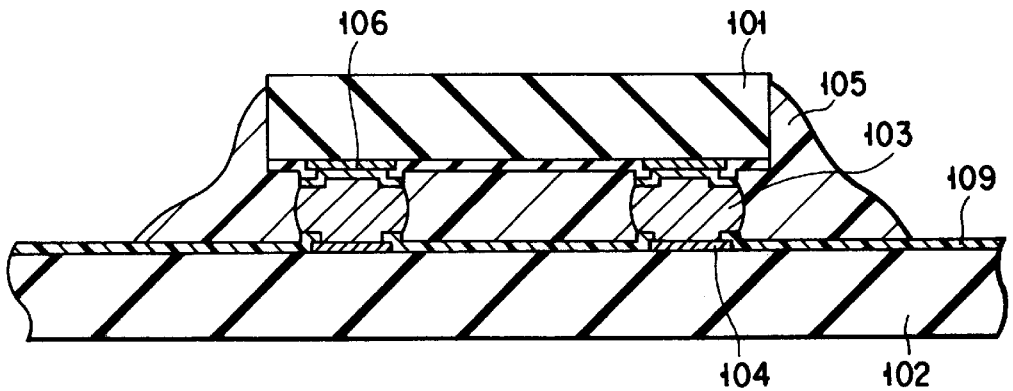
F I G. 31F
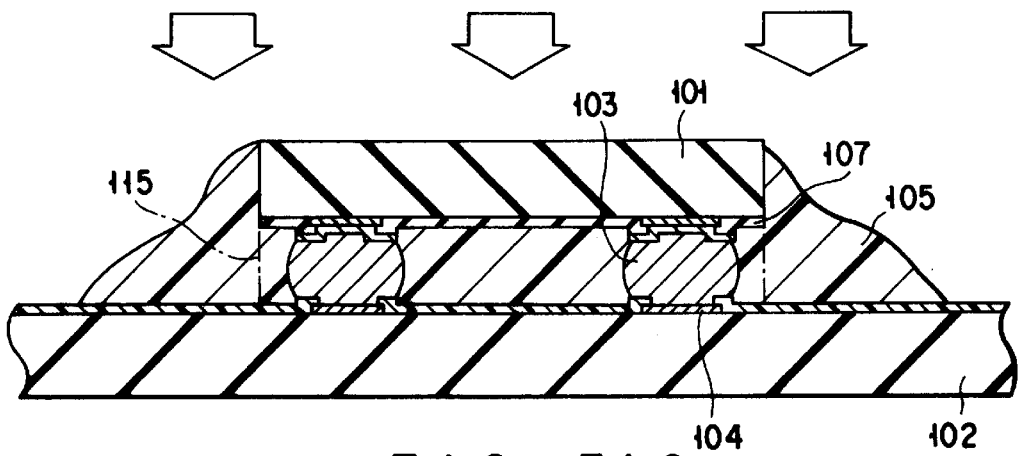
F I G. 31G

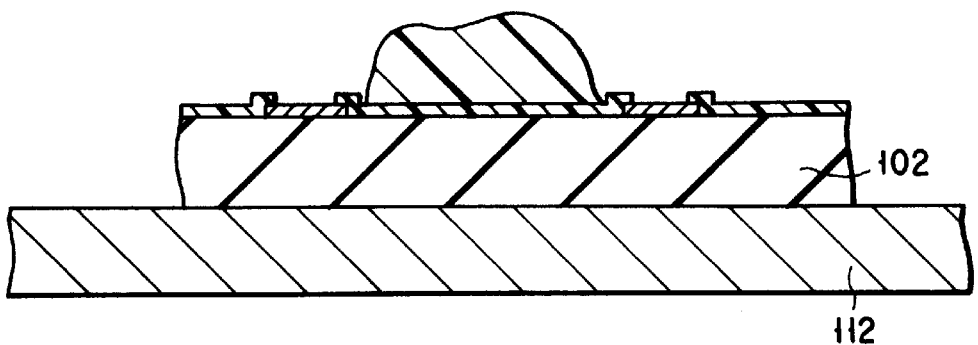
F I G. 32A
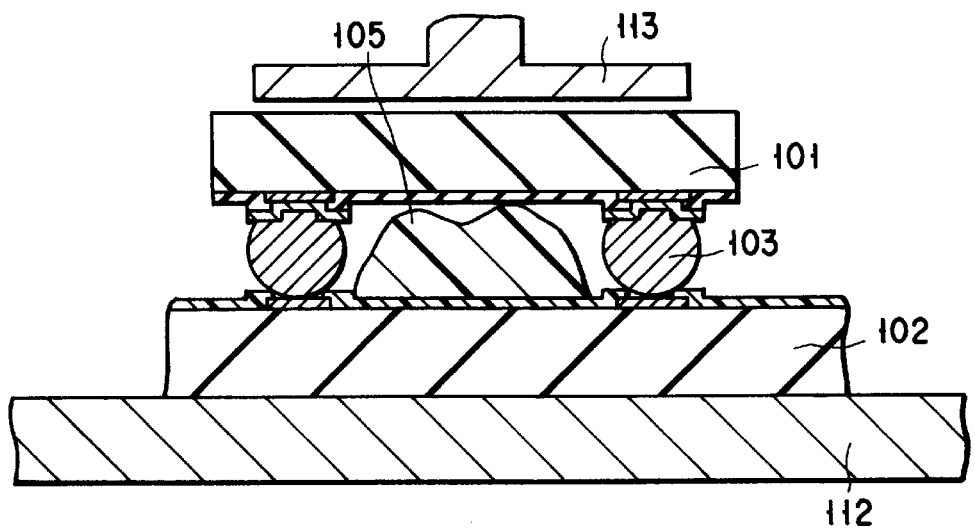
F I G. 32B
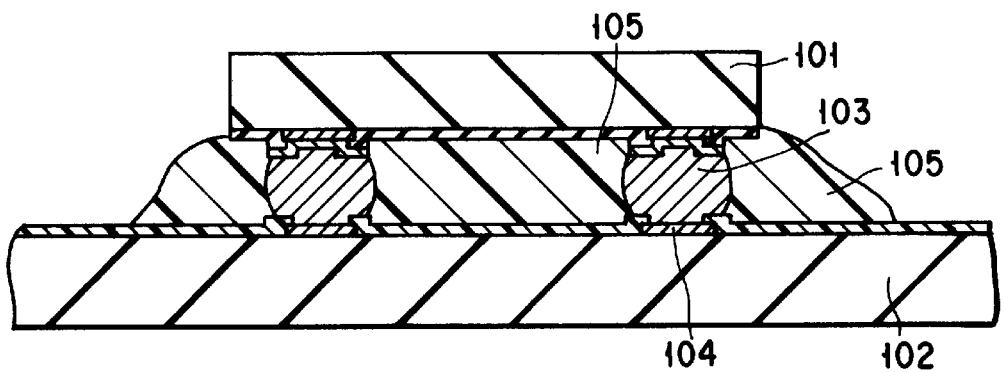
F I G. 32C

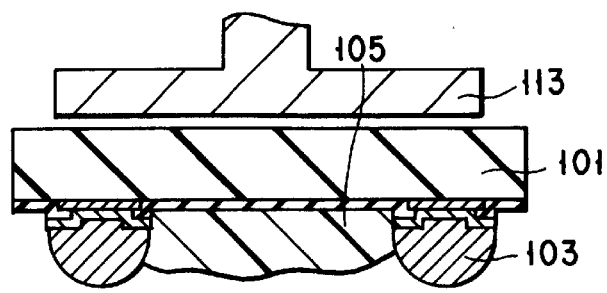
F I G. 33A
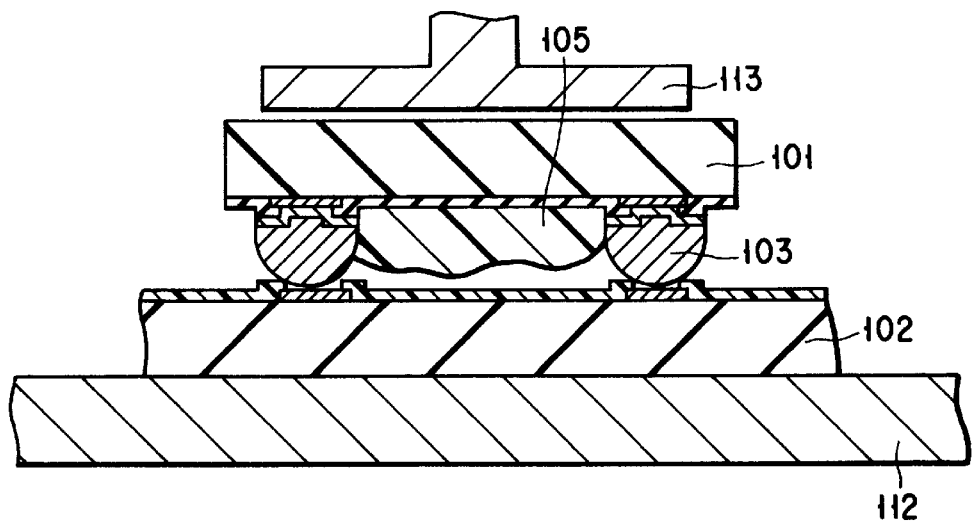
F I G. 33B
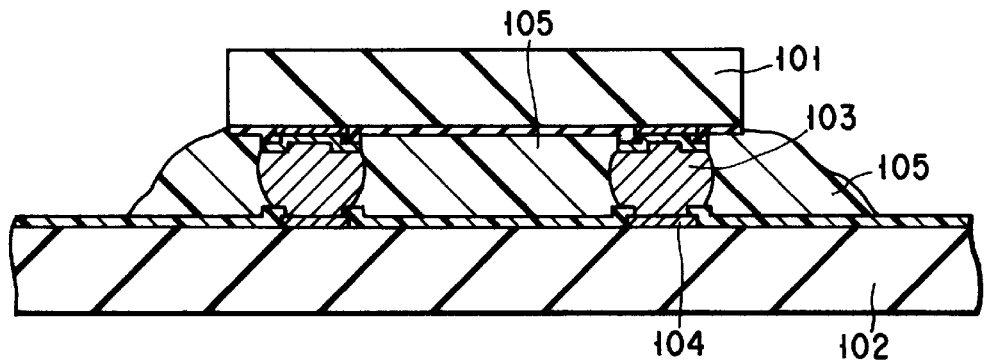
F I G. 33C

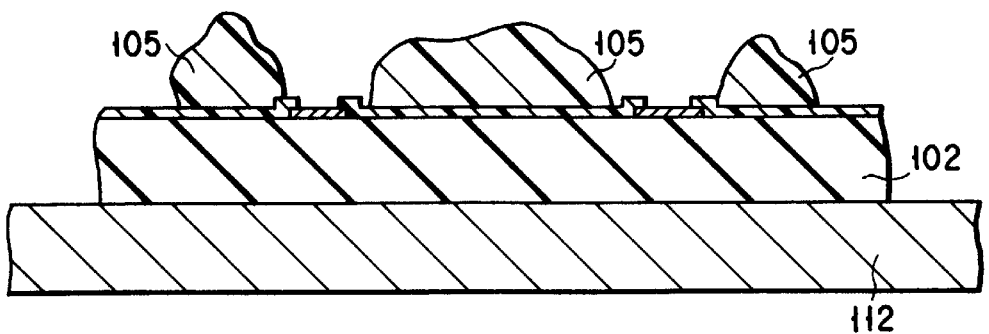
F I G. 34A
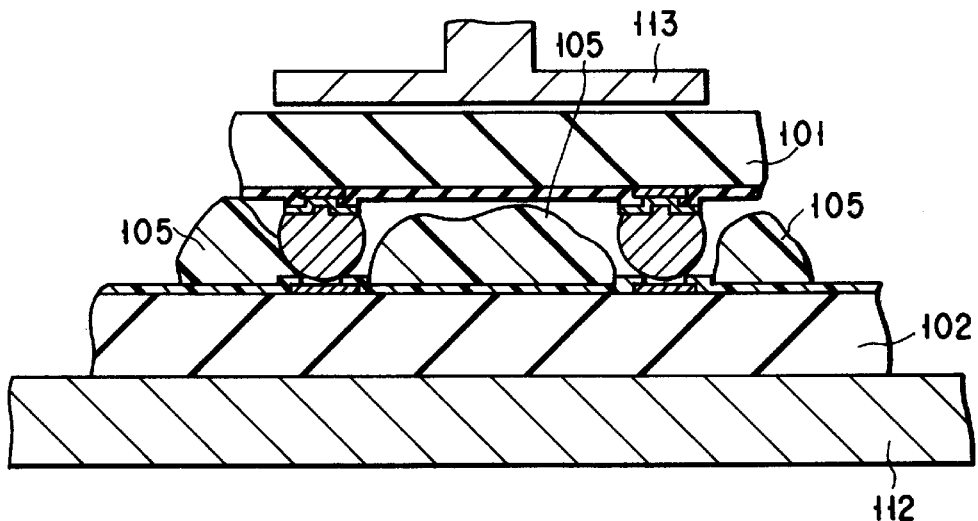
F I G. 34B
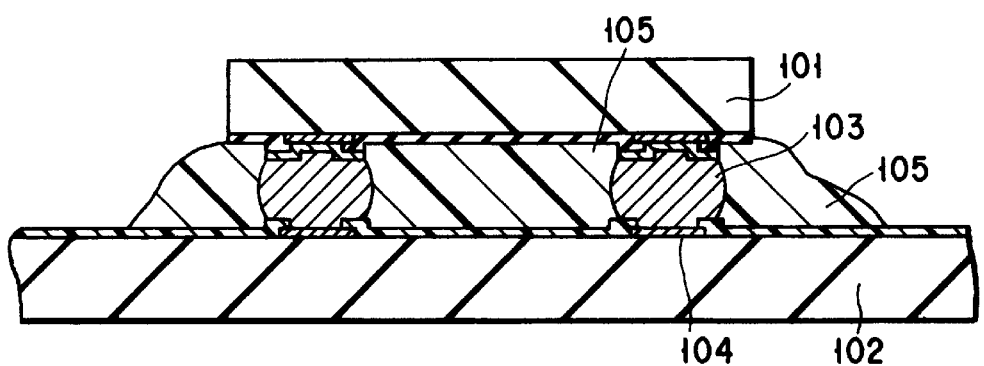
F I G. 34C

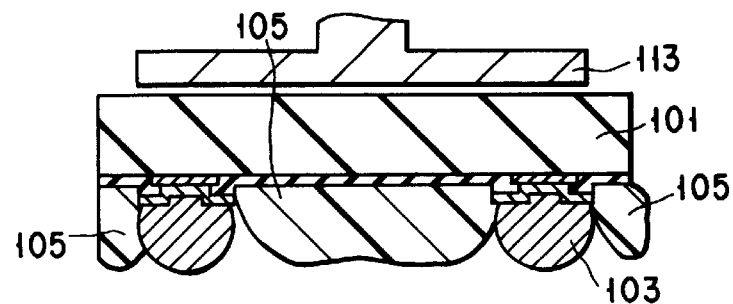
F I G. 35A
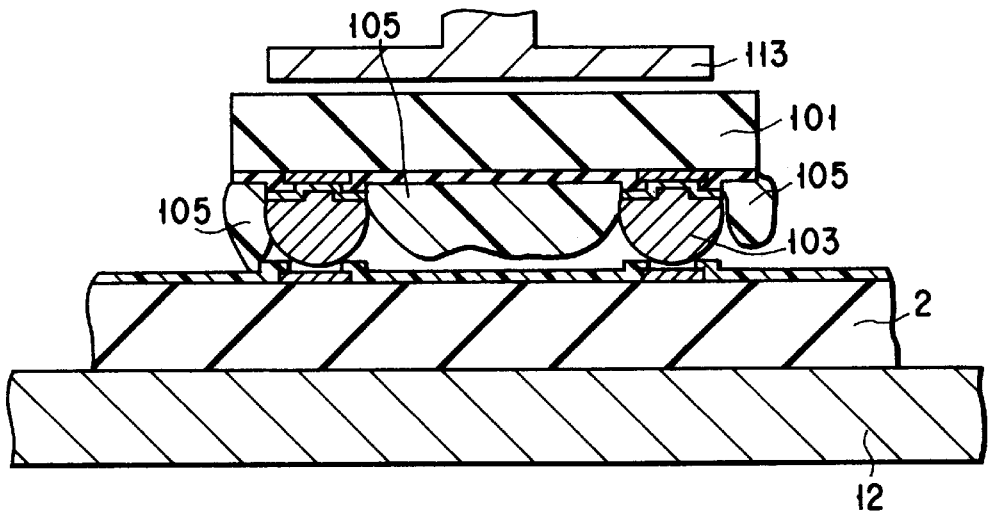
F I G. 35B
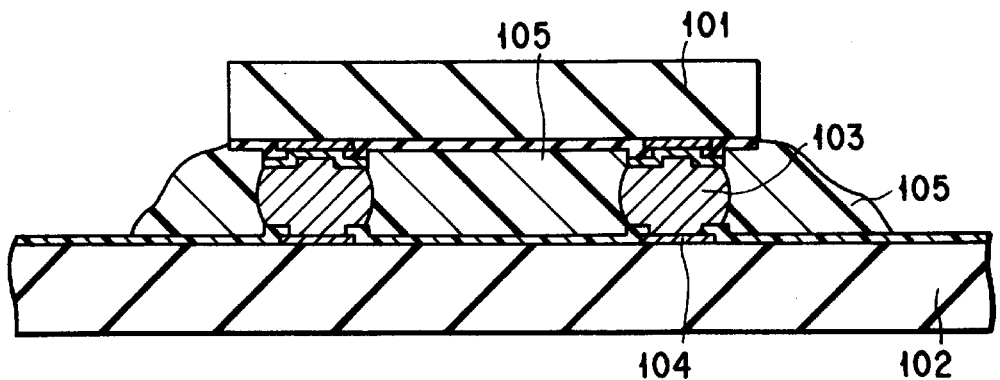
F I G. 35C

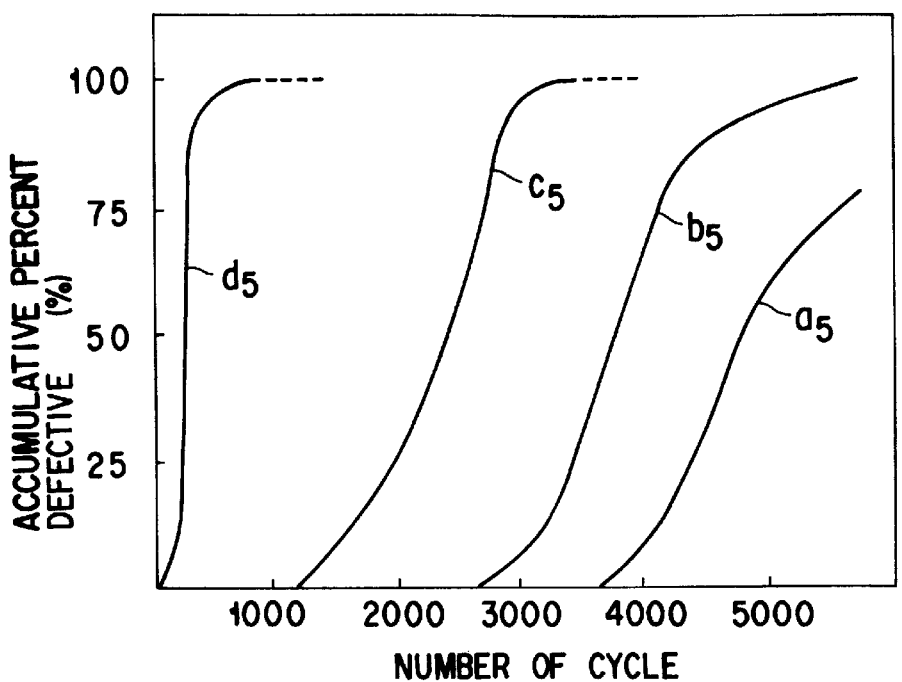
F I G. 36
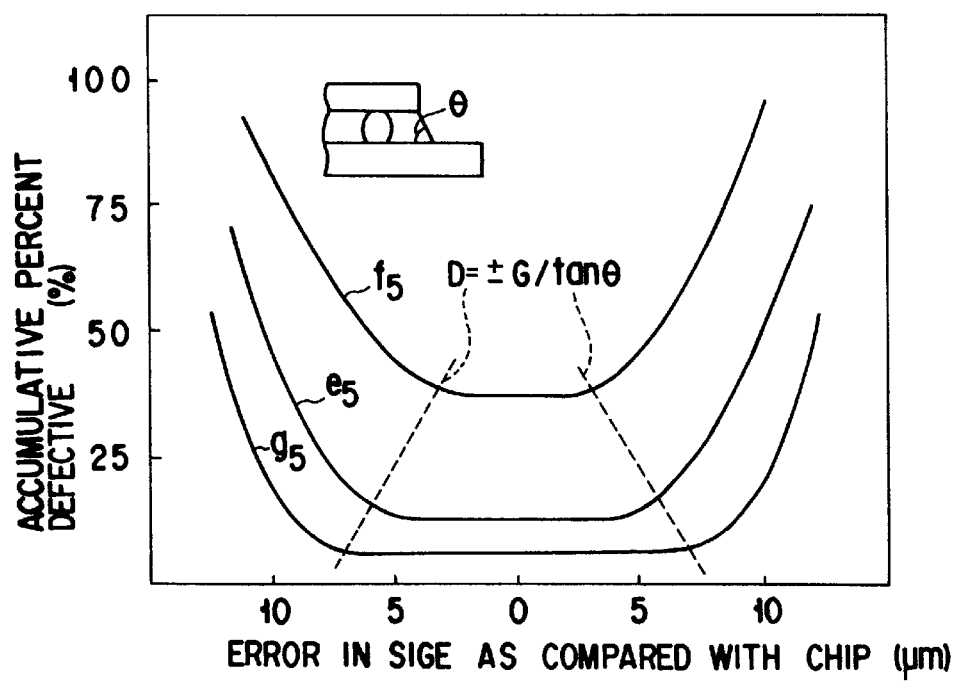
F I G. 37

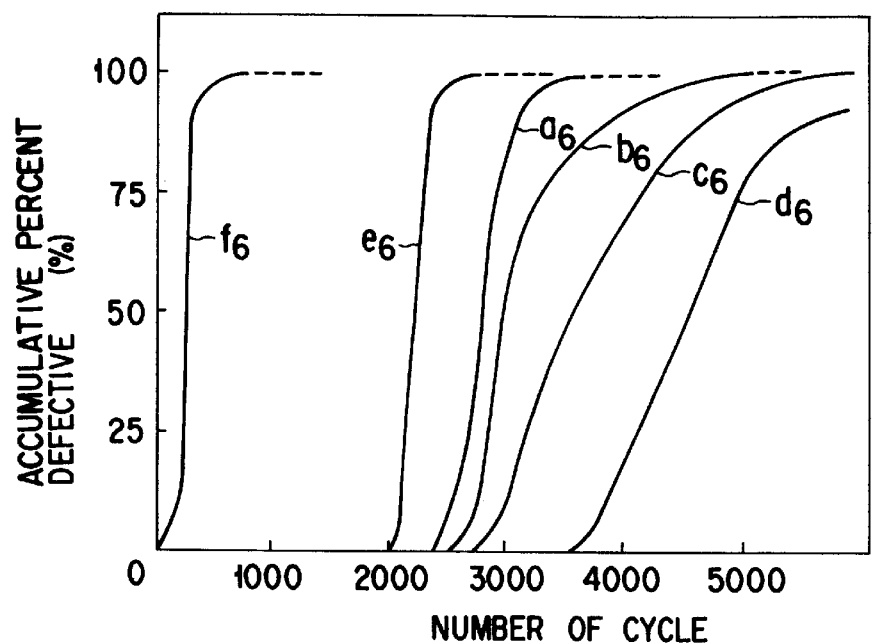
F I G. 44
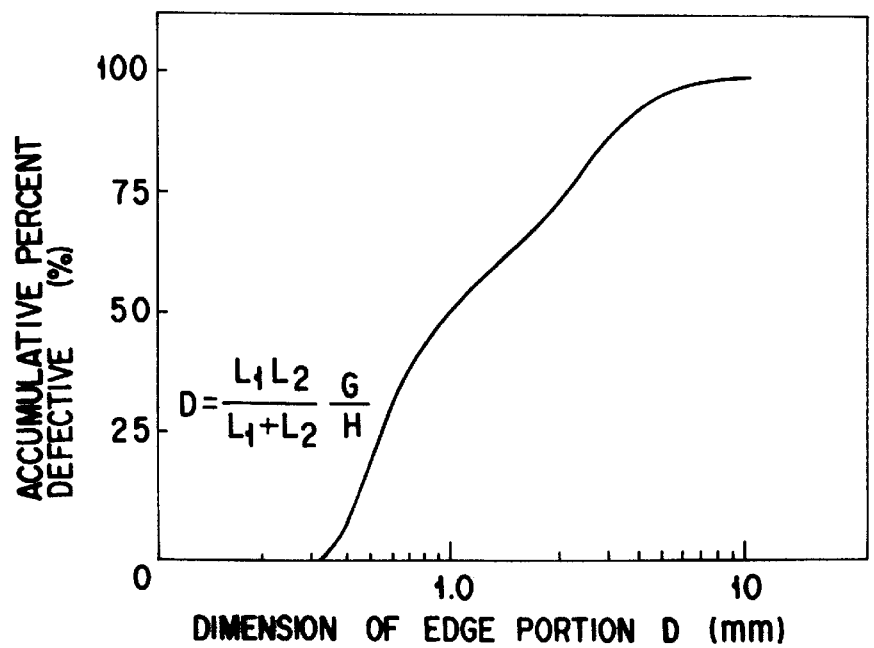
F I G. 45

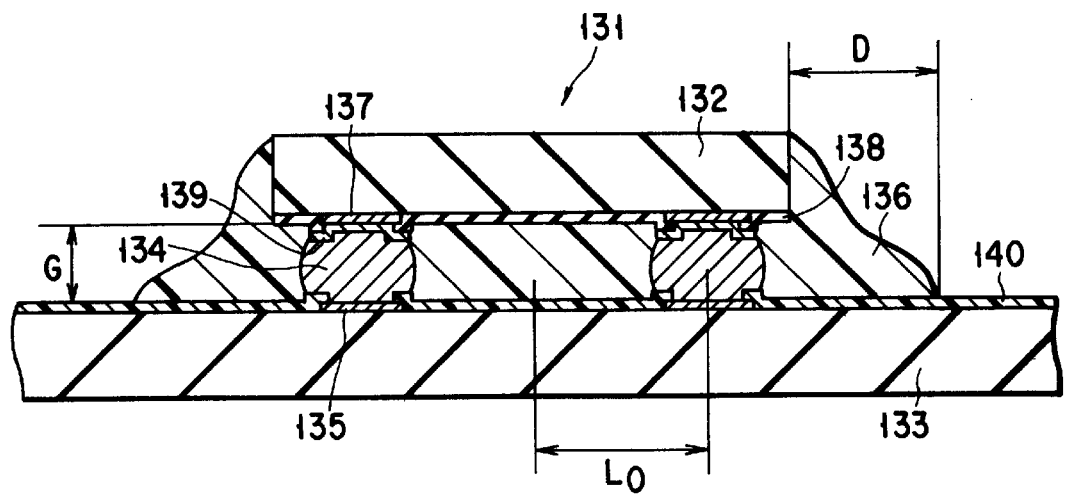
F I G. 46
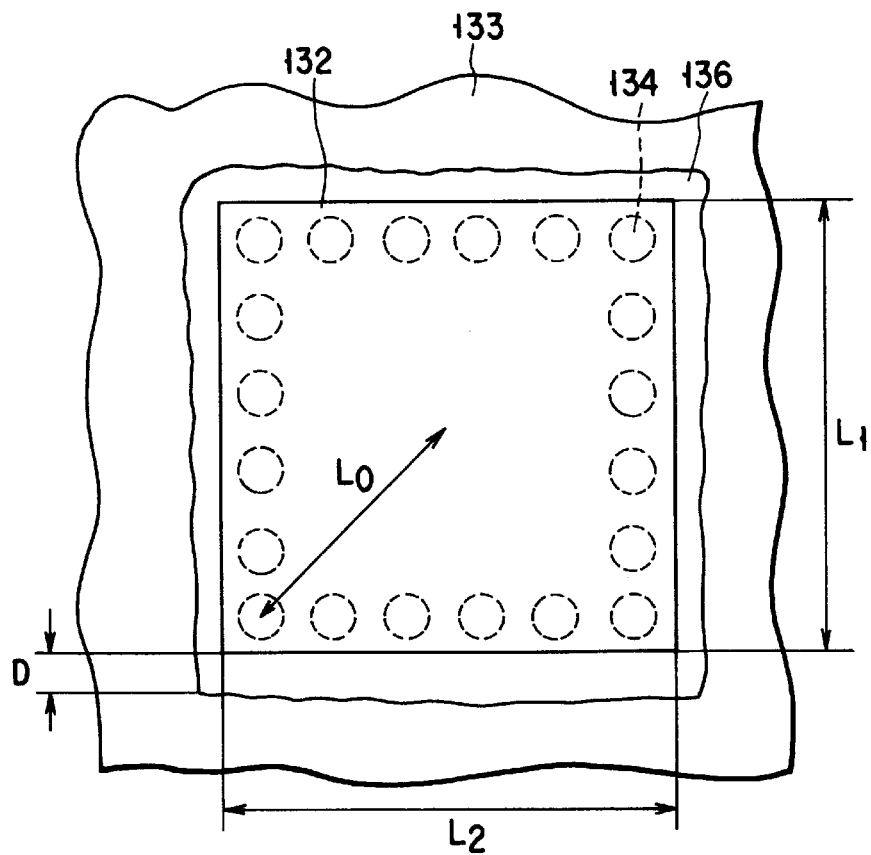
F I G. 47

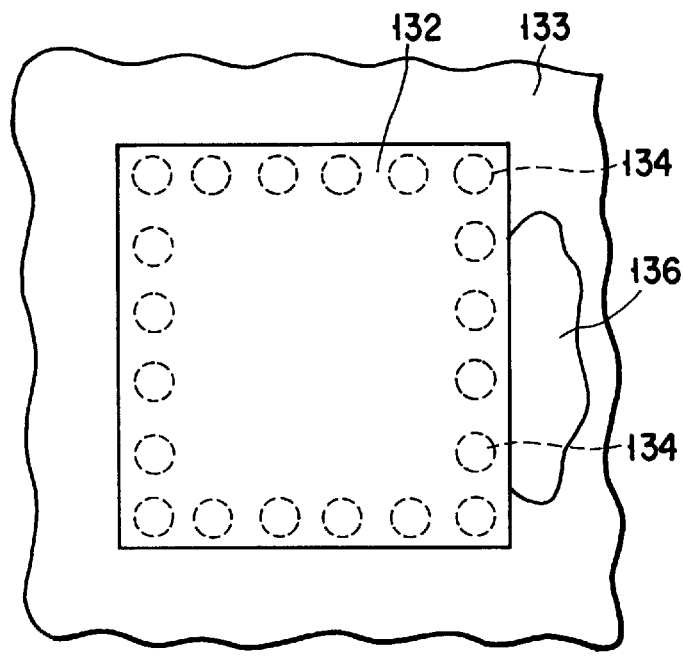
F I G. 48A
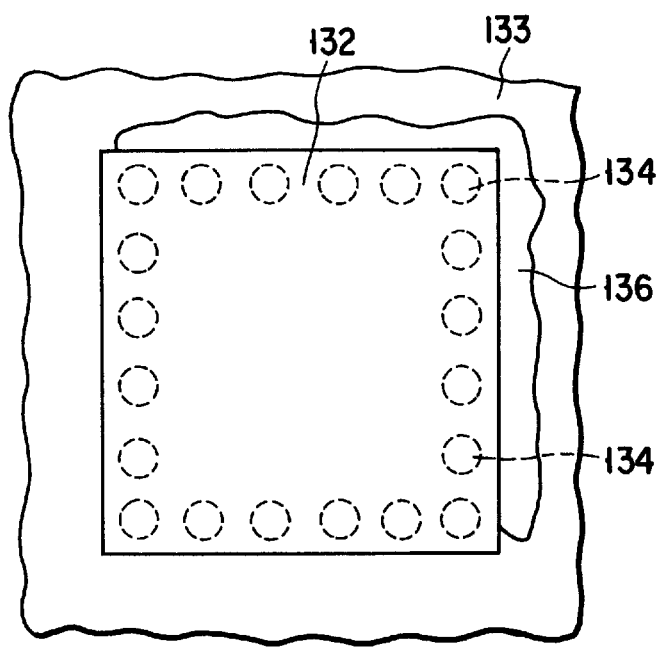
F I G. 48B

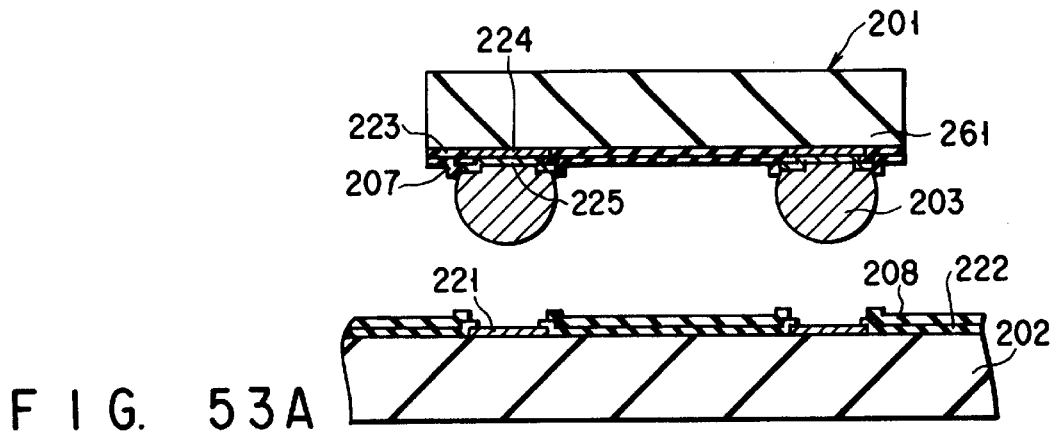
F I G. 53A
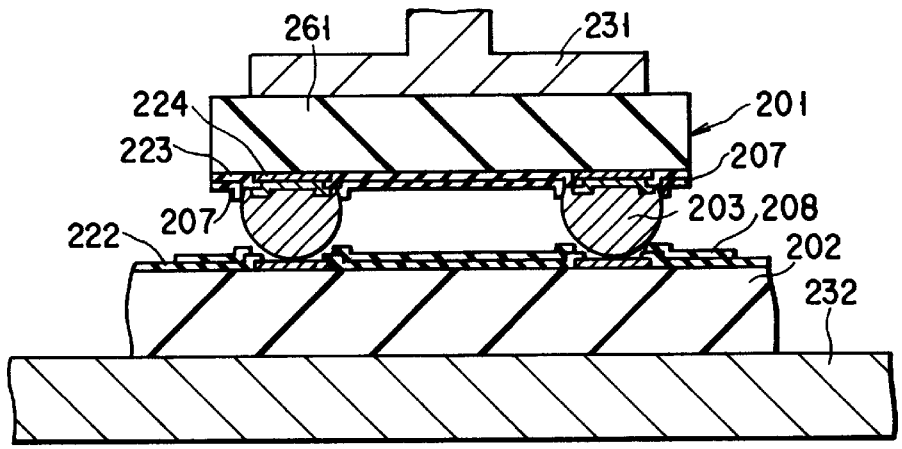
F I G. 53B
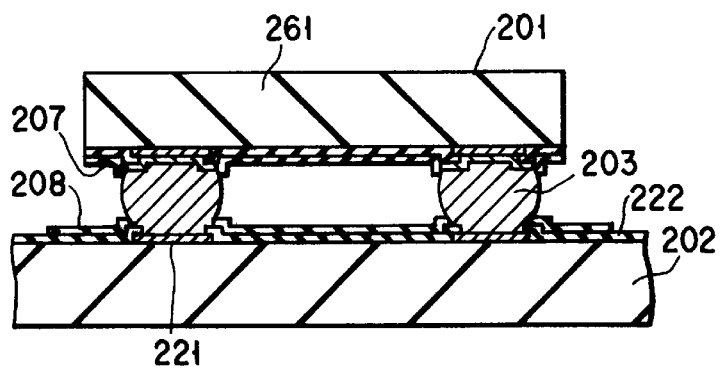
F I G. 53C

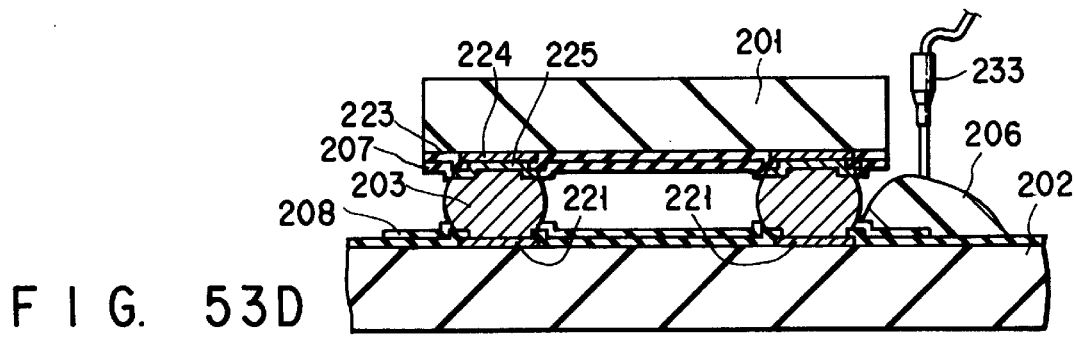
F I G. 53D
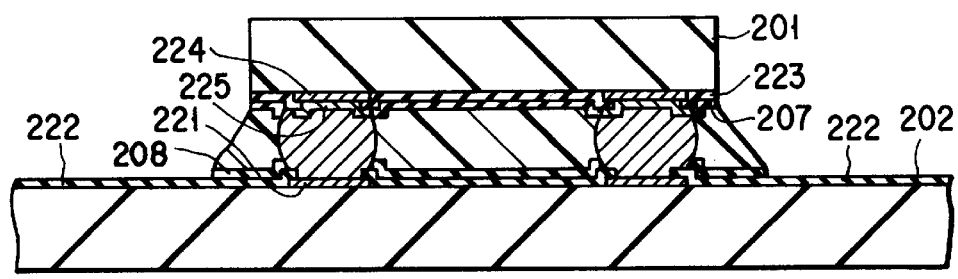
F I G. 54
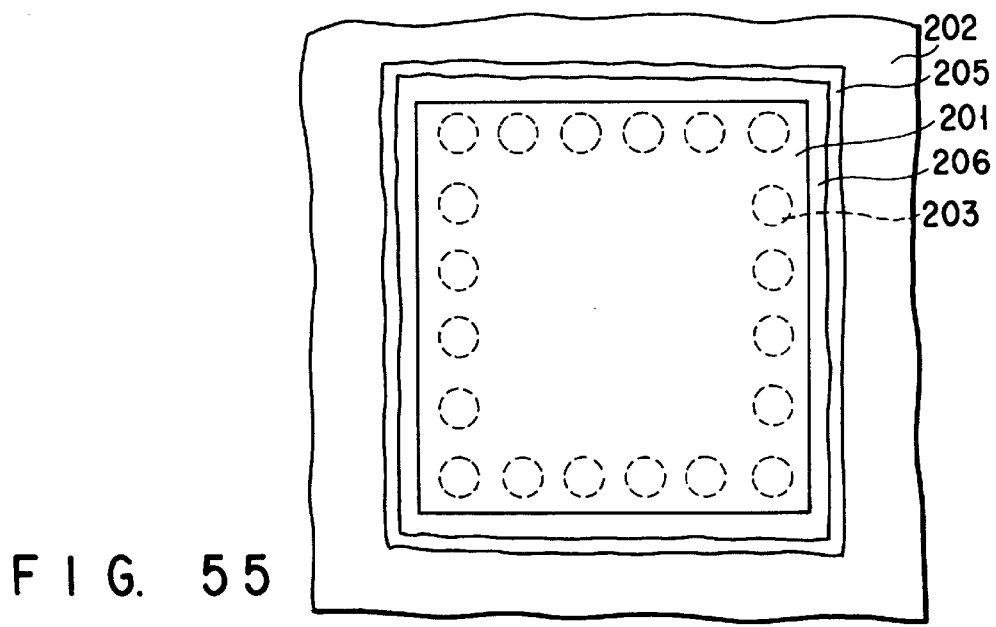
F I G. 55

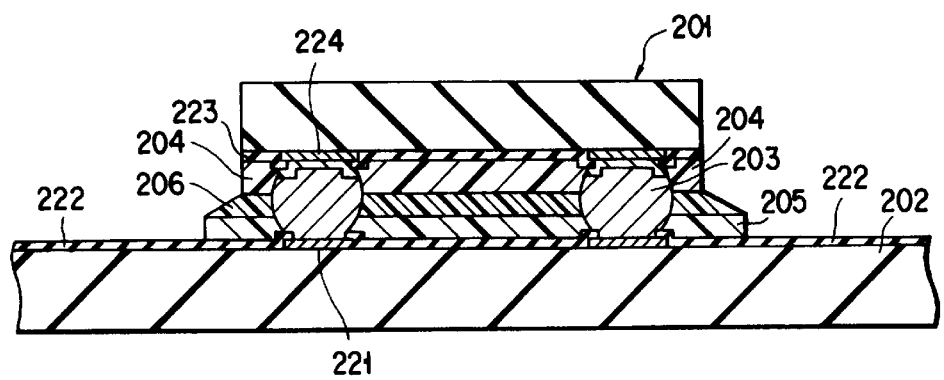
F I G. 57
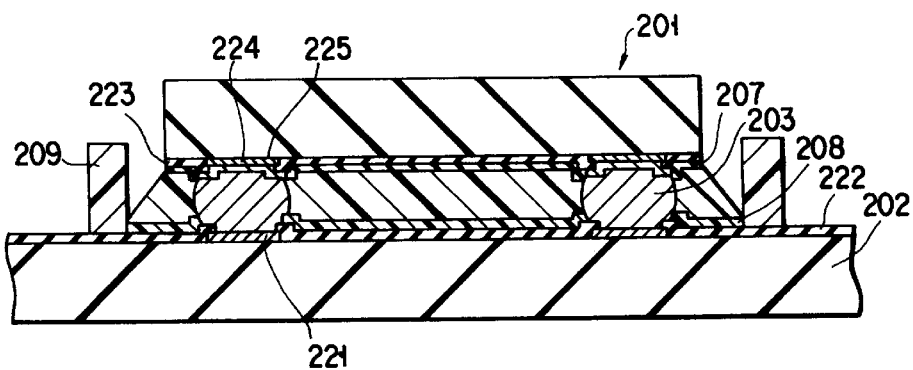
F I G. 58
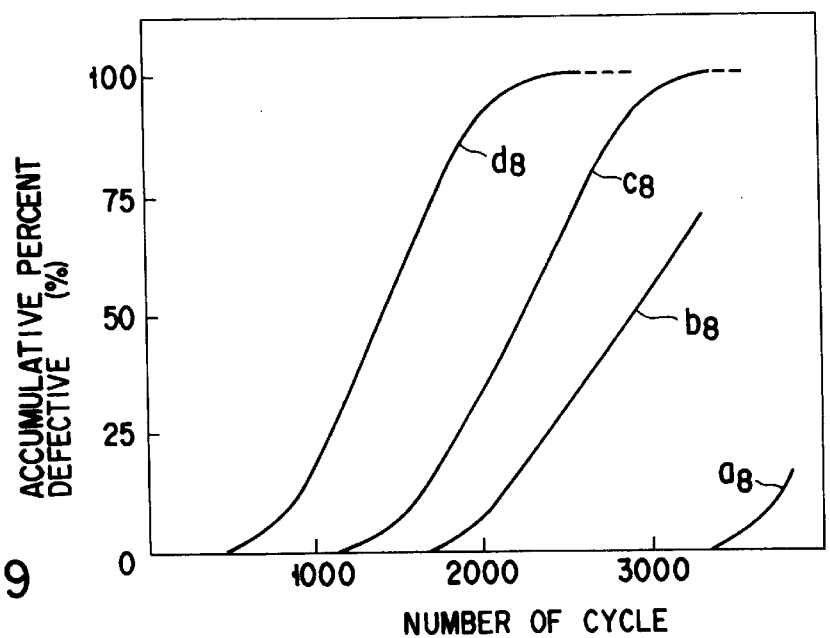
F I G. 59

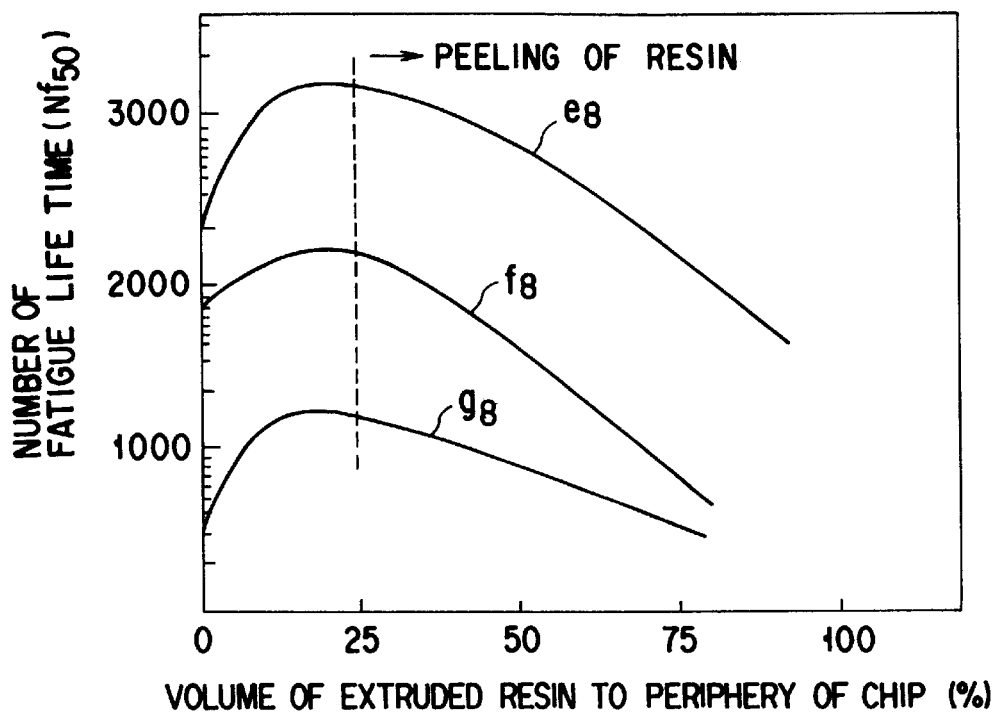
F I G. 60
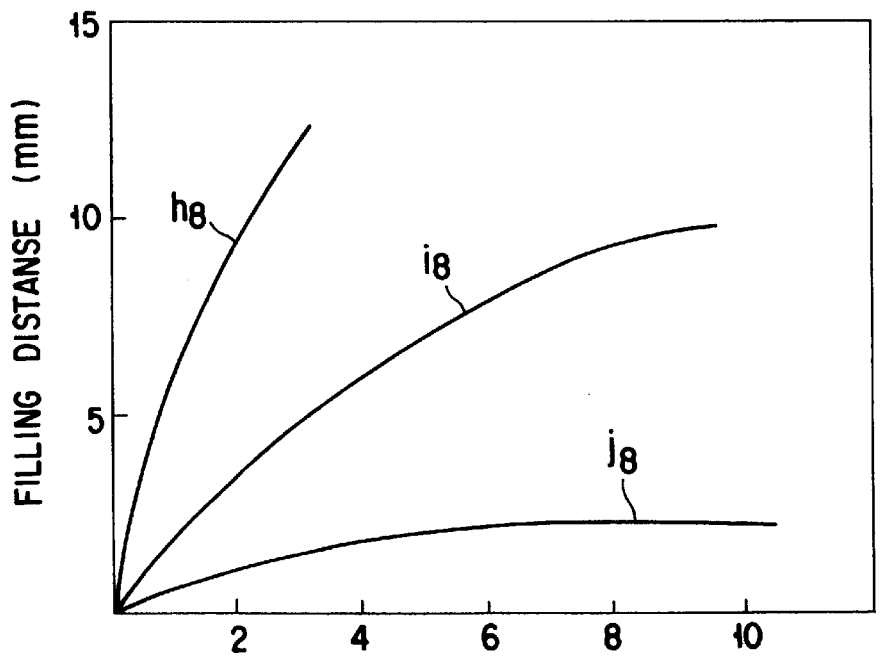
F I G. 61

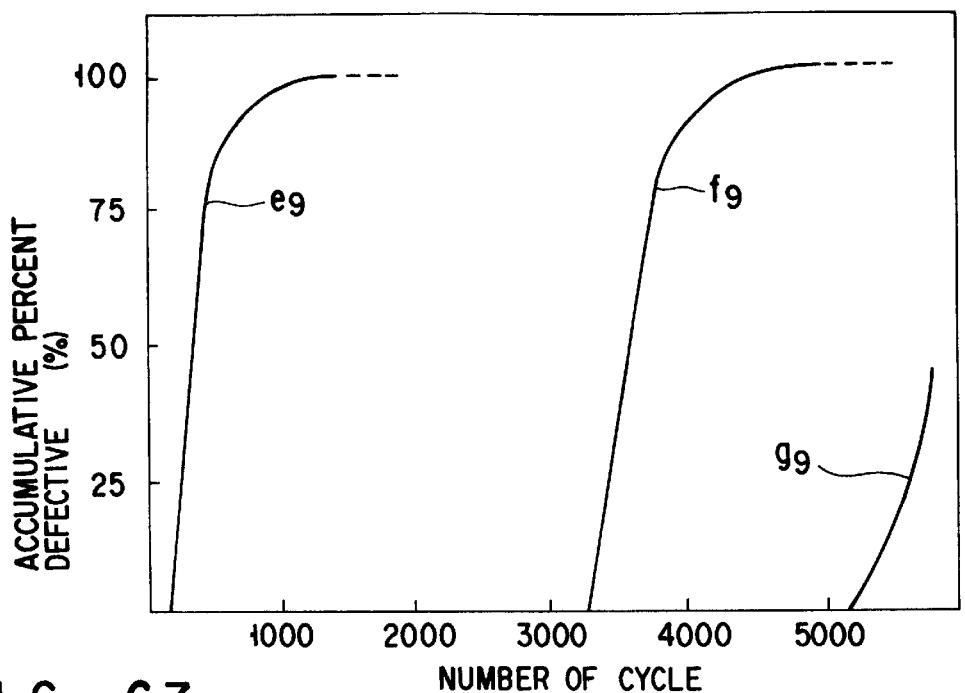
F I G. 67
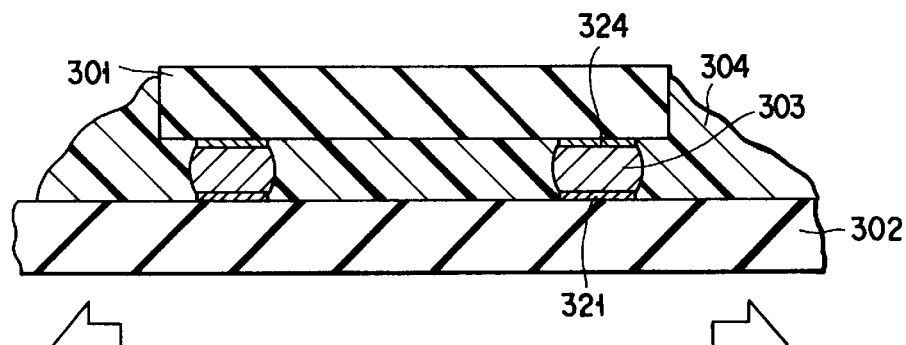
F I G. 68
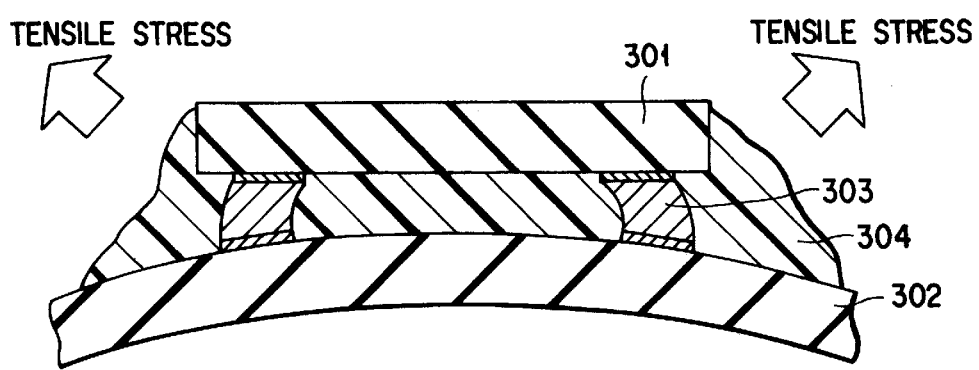
F I G. 69

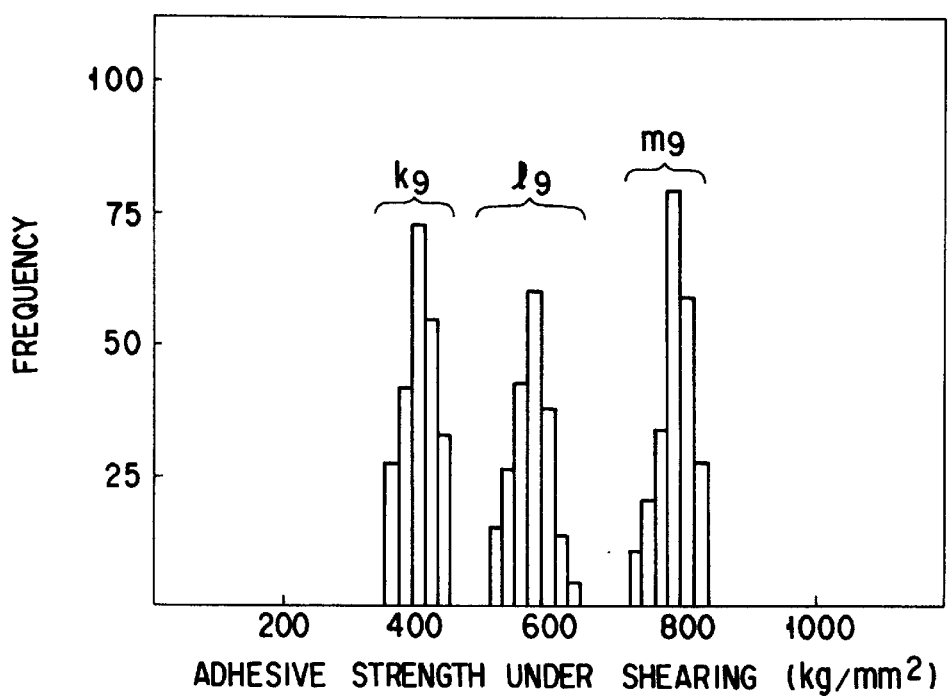
F I G. 76
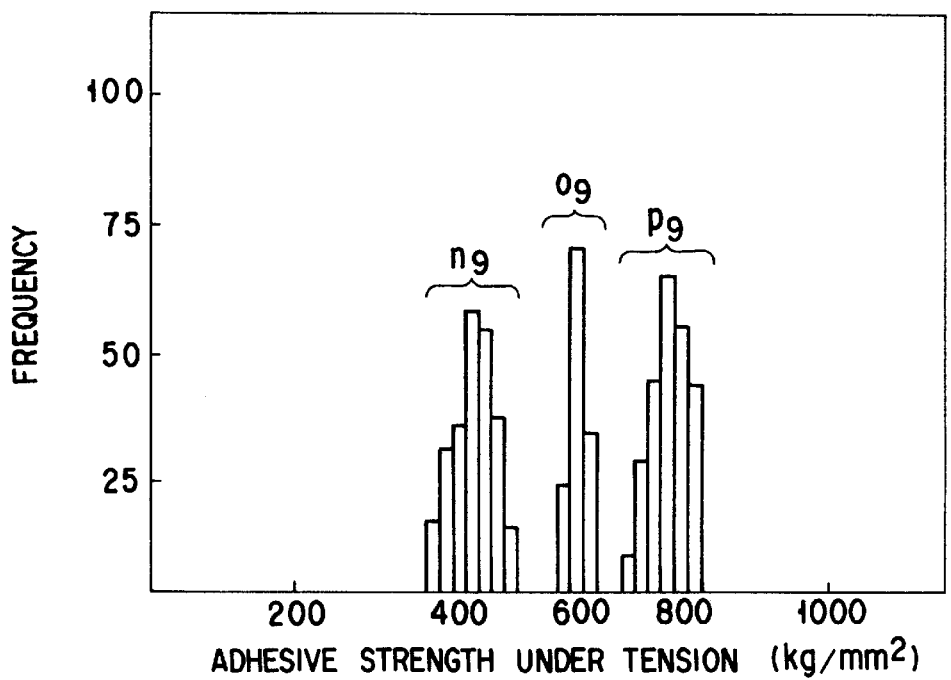
F I G. 77

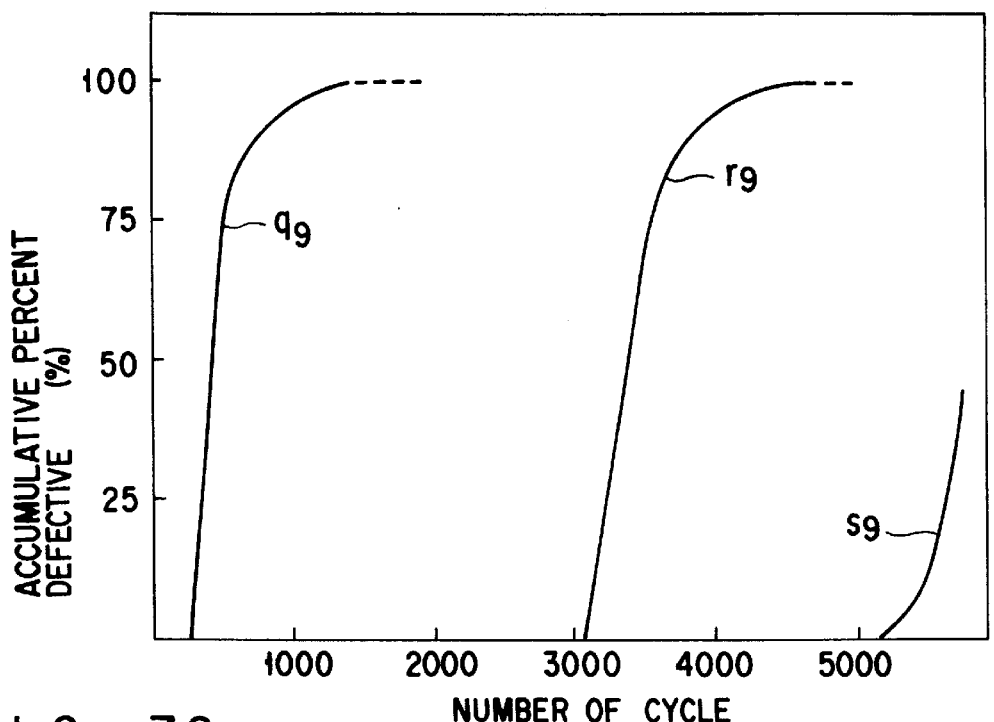
F I G. 78
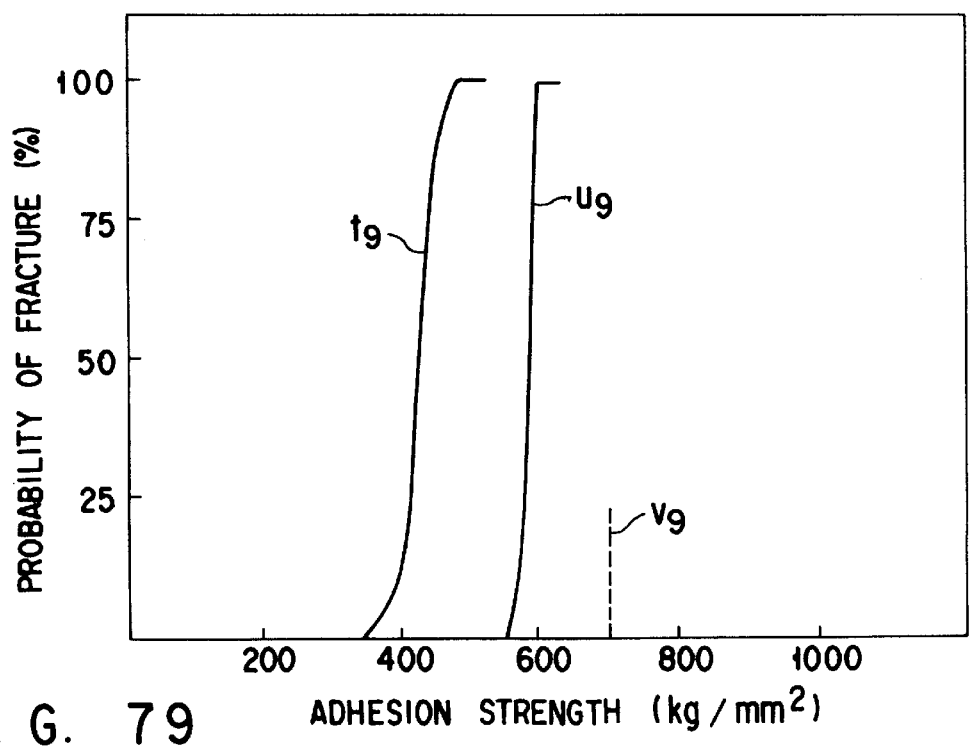
F I G. 79

SEMICONDUCTOR DEVICE WITH IMPROVED ENCAPSULATING RESIN

BACKGROUND OF THE INVENTION

1. Field of the Invention

This invention relates to a semiconductor device, in particular to a semiconductor device having a flip-chip structure wherein a resin is filled in a space between a semiconductor chip and a wiring circuit board for improving the reliability of connection of a bump electrode.

2. Description of the Related Art

In a tendency of further increasing the integration density of semiconductor device in recent years, it is now also demanded to increase the density in mounting of semiconductor devices. Under the circumstances, a flip-chip mounting technique as shown in FIG. 1 (for example, U.S. Pat. No. 3,401,126 or U.S. Pat. No. 3,429,040) is now extensively utilized, in addition to a wire-bonding technique and a TAB technique, in various electronic fields such as a computer apparatus.

Since the coefficient of thermal expansion of a semiconductor chip substantially differs in general from that of a wiring circuit board, a displacement is caused to occur between the semiconductor chip and the wiring circuit board due to a heat generating during the operation of the semiconductor chip as the heat thus generated is transferred via a bump electrode to the wiring circuit board. This displacement brought about by the heat then cause a stress distortion on the bump electrode disposed to connect the semiconductor chip with the wiring circuit board, giving rise to the destruction or fracture of the bump electrode, thus resulting in a shortened reliability life of the semiconductor device (Microelectronic Packaging Handbook, Van Nostrand Reinhold, 1989).

It is known that this reliability life can be improved by reducing the maximum shear strain "$\gamma_{max}$" to be generated at the bump electrode as taught by the formula of cycle life represented by:

$$Nf = Cf^{1/3} \gamma_{max}^{-2} \cdot exp(1428/T_{max})$$

(IBM, J. Res. Develop., 13; 251 (1969)).
wherein C is a constant; f, the frequency; $T_{max}$, the maximum temperature.

This maximum shear strain to be generated at the bump electrode can be represented by the following formula:

$$\gamma_{max} = \{1/(D_{min}/2)^{2/\beta}\}(V/\pi h^{1+\beta})^{1/\beta} \cdot d \cdot \Delta T \cdot \Delta \alpha$$

wherein $D_{min}$ represents the minimum bump diameter; $\beta$, a constant peculiar to a material of bump; V, the volume of solder; h, the height of solder; $\Delta \alpha$, a difference in coefficient of thermal expansion; $\Delta T$, a difference in temperature; and d, DNP (a distance between the neutral point of the LSI chip and the center of the bump).

Under the circumstances, in the conventional flip-chip mounting technique, the following measures have been taken for reducing the stress to be generated at the bump electrode.

Namely, (1) to minimize the distance between the center of the chip and the center of the bump; (2) to minimize the difference between the CTE (coefficient of thermal expansion) of a semiconductor chip and the coefficient of thermal expansion of a wiring circuit board; (3) to improve the heat dissipation property of the semiconductor device so as to minimize a difference in temperature at the connecting portion of the bump; and (4) to modify the structure of the bump electrode so as to sufficiently absorb a stress distortion generated.

There are also proposed a method of filling a resin 78 into a space between a semiconductor chip 72 and a wiring circuit board 71 as shown in FIG. 2, or a method of sealing a semiconductor chip with silicone gel thereby improving the moisture resistance of the semiconductor chip and at the same time to alleviate a stress to the bump electrode thus improving the cycle life of the device.

However, according to the packaging method of filling a space between a semiconductor chip and a wiring circuit board with a resin (for example, Japanese Patent Unexamined Publication Shou/57-208149 and Japanese Utility Model Unexamined Publication Shou/58-18348), the physical properties of the resin are not specified, so that there has been even a possibility of accelerating the destruction of the bump portion. Namely, if the physical property of the encapsulation resin is not optimized in this case, the circuit board may be warped as shown in FIG. 3, resulting in the peel off of the resin from the surface of the circuit board, or the generation of cracking in the resin. On the other hand, in a method of filling a resin through a pore formed in a glass board in order to smoothly carry out the filling of resin (for example, Japanese Utility Model Unexamined Publication Shou/58-18348 and Japanese Patent Unexamined Publication Shou/58-103143), it is clearly impossible to prevent the peripheral portion of the pore in the glass board from being cracked due to a stress from heat cycle, thus giving rise to a problem in the practical use thereof and at the same time to a problem of uncertainty in reliability of the bump bonding.

If these phenomena would actually happen, the resin may be fractured and the surface of the wiring circuit board may also be destroyed together with the encapsulation resin as shown in FIGS. 4A and 4B. Since a sufficient study on the bonding strength between an encapsulation resin and a semiconductor chip, or between an encapsulation resin and a wiring circuit board has been neglected up to date, the fractures of the encapsulation resin as well as the wiring circuit board that can be brought about as a result of heat cycle have become an important problem in a semiconductor device.

There is also proposed under the circumstances a packaging method wherein a region 81 encircled by a semiconductor chip 72, a wiring circuit board 71 and a bump electrode 73 is not filled with a resin as shown in FIG. 5 so as to improve the reliability of the bump bonding (for example, Japanese Patent Unexamined Publications Shou/58-204546; Shou/57-208149 and Shou/58-134449). In this case however, water may be accumulated in the space 81, corroding the bump electrode 73.

There has been also proposed a method of improving the reliability of an assembled structure of semiconductor apparatus, wherein only an outside portion of the array bump bonding is sealed with an insulating material, leaving other portions unsealed with the insulating material (see Japanese Patent Unexamined Publications Shou/61-177738). However, it is difficult to sufficiently alleviate the stress on the bump electrode especially when an organic high molecular substrate exhibiting a large degree of difference in coefficient of thermal expansion is employed as a circuit board.

There has been also proposed to employ a soft resin for filling a space between a semiconductor chip and a wiring circuit board (Japanese Patent Unexamined Publications Shou/58-10841). However, since such a soft resin is very large in coefficient of thermal expansion, the heat cycle life of the bump bonding would not be sufficiently improved.

In order to solve these problems, there is also proposed to select suitable ranges of physical property and composition of a resin thereby to improve the heat cycle life of the bump bonding (for example, Japanese Patent Publication Hei/4-51057, Japanese Patent Unexamined Publication Shou/63-316447 and Japanese Patent Unexamined Publication Hei/4-219944). This method is effective in particular when a semiconductor chip of relatively small scale is to be mounted on a circuit board.

In a method of filling a resin in a space between a semiconductor chip and a wiring circuit board, it has been a common practice to coat the surface of the semiconductor chip or a semiconductor chip-mounting portion of the wiring circuit board with a resin before bonding thereof through a bump is carried out (for example, Japanese Patent Unexamined Publications Hei/4-7447 and Japanese Patent Unexamined Publication Hei/2-234447). There is also proposed to coat in advance a portion of a circuit board excluding the portion where a bump is to be attached with a suitable amount of an encapsulation resin, and then after a semiconductor chip is assembled with the circuit board, the rest of the encapsulation resin is filled in a space between the semiconductor chip and the circuit board (Japanese Patent Unexamined Publication Shou/62-132331).

Further, a method of filling a resin in a space between a semiconductor chip and a wiring circuit board by making the most of capillarity after the semiconductor chip is mounted through a flip-chip packaging on a wiring circuit board has been practiced (Japanese Patent Unexamined Publications Shou/60-147140 and Hei/3-18435). According to this method, it is possible to fill a resin in a narrow space with a thickness ranging from 20 $\mu$m to 50 $\mu$m after lowering the viscosity of the resin by heating it to less than the curing temperature thereof.

However, this method of utilizing a capillarity for filling a resin into a space may not be applicable to a semiconductor chip of larger size, since the filling of a resin may become difficult.

By the way, the inflow velocity of a resin can be represented by a formula: $V=1200h/(\mu L)$ (wherein h is a dimension of gap; $\mu$ is a viscosity (poise); and L is a distance of inflow). Namely, the inflow velocity of a resin is proportional to the distance between a semiconductor chip and a wiring circuit board (a gap size), and is inversely proportional to the viscosity of resin as well as to the size of the semiconductor chip. Therefore, some measures such as the lowering in viscosity of a resin or the enlargement of gap are required to be taken if the method is to be applied to a semiconductor chip which is larger in size.

A filler should preferably be added to a resin in order to minimize a difference between the coefficient of thermal expansion of a semiconductor chip and that of a wiring circuit board. However, the addition of a filler into a resin may cause an increase in viscosity of the resin. The coefficient of thermal expansion and elastic modulus of a resin changes with a change in content of a filler as shown in FIG. 6. Namely, as the content of a filler is increased, the coefficient of thermal expansion of a resin decreases, but the elastic modulus thereof increases on the contrary.

On the other hand, the dimension of the gap is equal to the height of the bump attached between a semiconductor chip and a wiring circuit board. Since the shape of the bump is spherical at the moment when the molten bump is attached onto a wiring circuit board, it is impossible to increase the height of the bump more than the diameter of the spherical shape thereof. Thus, there is a limit in the height of the bump, so that it is difficult to enlarge the gap between a semiconductor chip and the wiring circuit board so as to make easier the filling of a resin.

There is further proposed a method to cover the surface of a resin covering a semiconductor chip with a different kind of resin as shown in FIG. 7 (Japanese Patent Unexamined Publication Hei/4-171970). However, this method is accompanied with a problem that an impurity may be intruded into an interface between these resins, or a stress may be generated at the interface due to a residual stress between these resins, thus causing a peeling of the resins.

By the way, the inflow velocity of a resin is greatly lowered as the inflow distance of resin becomes large as shown in FIG. 8. The curve shown in FIG. 8 represents results measured on five kinds of resins differing in viscosity, i.e. 10 to 100 poise by setting a distance (a gap) between a semiconductor chip and a wiring circuit board to 0.5 mm.

When a resin is injected into a space between a semiconductor chip and a wiring circuit board, the resin 86 flows not only into the space between the semiconductor chip 84 and the circuit board 83, but also around the semiconductor chip 84. The velocity of the resin flow at the center of the semiconductor chip is larger as compared with that at the periphery of the semiconductor chip, so that air bubble 87 may be caused to generate as shown in FIG. 9D.

Japanese Patent Unexamined Publication Shou/63-245942 sets forth a structure wherein a coating layer is formed around a semiconductor chip while exposing bumps, thus forming the active element portion of the semiconductor into a hollow shape. In this structure however, the gap between the semiconductor chip and the wiring circuit board at the bump bonding portion becomes smaller than the height of the bump so that the filling of a resin becomes more difficult.

It is preferable for the alleviation of stress to a bump electrode connecting a semiconductor chip with a wiring circuit board to fill a resin having a small coefficient of thermal expansion in a space between the semiconductor chip and the wiring circuit board. Therefore, a resin containing a large amount of filler so as to minimize the coefficient of thermal expansion and at the same time to enlarge the elastic modulus has been employed for filling a space between the semiconductor chip and the wiring circuit board. A higher content of filler in a resin is also preferable in view of shielding water. Moreover, the larger the particle size of the filler is, the higher the water-shielding effect becomes.

However, in the recent trend of increase in size of a semiconductor chip, there have been raised many new problems which can not be solved by the employment of the conventional resins, thus making it increasingly difficult to assure the reliability of a semiconductor device. Namely, since the viscosity of a resin becomes higher as the content of a filler is increased, making it impossible to fill the resin into a space between the semiconductor chip and the wiring circuit board. When the viscosity of a resin is too low on the contrary, the following problems will be raised. Due to the high fluidity of the resin, the resin may excessively spread over a wide range of area around a semiconductor chip (Japanese Patent Unexamined Publications Hei/4-219944). If the spreading of a resin formed around a semiconductor chip is excessive, neighboring resins may be overlapped to each other, thus forming a resin layer of non-uniform thickness between the neighboring semiconductor chips as shown in FIG. 10A, resulting in the generation of a non-uniformity of stress, whereby lowering the reliability of the product. These problems become more serious in MCM (Multichip Module) where a plurality of semiconductor chips are mounted.

If a space between the neighboring semiconductor chips is increased in advance in the mounting of semiconductor chips by taking account of the spreading of resin formed around the semiconductor chips, it is impossible to realize a flip-chip mounting in high density of semiconductor chips. On the other hand, even if a plurality of semiconductor chips are closely disposed and the sealing en bloc of these semiconductor chips with a resin is tried as shown in FIG. 10B, it would be impossible to perform the sealing through capillarity due not only to a large area to be sealed, but also to a small gap between the semiconductor chips. As a result, it would be impossible to perform the sealing en bloc.

Meanwhile, when a semiconductor chip provided with a plurality of bump electrodes at a narrow pitch is to be mounted through a flip-chip mounting, it is impossible to allow a resin to pass through a space between neighboring bump electrodes at the occasion of injecting the resin into a space between the semiconductor chip and the wiring circuit board, hence the realization of a uniform resin sealing including a region at the periphery of the semiconductor chip would become difficult.

With respect to a resin containing a filler having an excessively large particle size, it is impossible to flow such a resin into the internal region inside the bump electrodes, since it is no more possible to conform with the miniaturized pitch of the bump electrodes. Moreover, even if the filler mixed in a resin is of a size which is capable of being introduced into the internal region through the space between bump electrodes, there is a possibility that the filler may pass through the passivation film of a semiconductor chip to destroy the semiconductor chip.

SUMMARY OF THE INVENTION

Accordingly, an object of the present invention is to provide a semiconductor device which is capable of alleviating a stress distortion to be generated at a bump bonding between a semiconductor chip and a wiring circuit board, thereby making it possible to improve the reliability life of the semiconductor device.

Namely, according to the present invention, there is provided a semiconductor device comprising a wiring circuit board and a semiconductor chip mounted through a bump electrode on the circuit board, a space between the circuit board and the semiconductor chip as well as a periphery of the semiconductor chip being encapsulated with a resin containing a filler; wherein the resin is constituted by a first resin disposed in a region surrounded by bump electrodes positioned on the outermost periphery of the semiconductor chip, and by a second resin disposed in a region not surrounded by bump electrodes positioned on the outermost periphery of the semiconductor chip, the first and second resins being distinct from each other in at least one feature selected from a content, a maximum particle diameter and an average particle diameter of the filler.

According to a first embodiment of the present invention, there is further provided a semiconductor device wherein the content of the filler in the first resin is smaller than that of the filler in the second resin.

According to a second embodiment of the present invention, there is further provided a semiconductor device wherein the content of the filler in the first resin is larger than that of the filler in the second resin.

According to a third embodiment of the present invention, there is further provided a semiconductor device comprising a wiring circuit board and a semiconductor chip mounted through a bump electrode on the circuit board, a space between the circuit board and the semiconductor chip as well as a periphery of the semiconductor chip being encapsulated with a resin, wherein the bump electrodes is formed on an outer periphery of the semiconductor chip, and a surface region of the wiring circuit board which is surrounded by the bump electrodes is shaped into a hollow structure. In this case, the depth of the hollow structure should preferably be 10 $\mu$m or more.

The resin may contain 20 to 70% by weight of filler, and the maximum particle diameter of the filler should preferably be not more than a half of the maximum distance between the semiconductor chip and the wiring circuit board. The resin in a volume equal to or three times more than that of volume of the space between the semiconductor chip and the wiring circuit board should preferably be employed for disposing it in a space between the semiconductor chip and the wiring circuit board, and around the periphery of the semiconductor chip.

According to a fourth embodiment of the present invention, there is further provided a semiconductor device comprising a wiring circuit board and a semiconductor chip mounted through a bump electrode on the circuit board, a space between the circuit board and the semiconductor chip as well as a periphery of the semiconductor chip being encapsulated with a resin, wherein the resin has a viscosity of 50 poise or less at room temperature and contains 20 to 70% by weight of filler whose maximum particle diameter is controlled to not more than a half of the maximum distance between the semiconductor chip and the wiring circuit board, the resin being disposed in a volume equal to or three times more than that of volume of the space between the semiconductor chip and the wiring circuit board.

According to a fifth embodiment of the present invention, there is further provided a semiconductor device comprising a wiring circuit board and a semiconductor chip mounted through a bump electrode on the circuit board, a space between the circuit board and the semiconductor chip being encapsulated with a resin, wherein the resin is spread in an area which corresponds to the area of the semiconductor chip.

In this case, the resin to be filled in a space between the circuit board and the semiconductor chip should preferably be formed of a photo-degradative thermosetting material. This photo-degradative thermosetting organic material should preferably contain at least one kind of inorganic filler selected from silica, quartz and fused silica, a preferable particle diameter of the filler being smaller than the gap between the circuit board and the semiconductor chip.

According to a sixth embodiment of the present invention, there is further provided a semiconductor device comprising a wiring circuit board and a semiconductor chip mounted through a bump electrode on the circuit board, a space between the circuit board and the semiconductor chip as well as a periphery of the semiconductor chip being encapsulated with a resin, wherein a distance "D" between a peripheral edge of the semiconductor chip and a peripheral edge of the resin satisfies a condition represented by a formula (1) shown below.

$$-G/\tan\theta \leq D \leq G/\tan\theta \qquad (1)$$

wherein G is a distance of gap between the circuit board and the semiconductor chip, and $\theta$ is a contact angle to be formed between the encapsulation resin and the semiconductor chip.

In this case, the resin may be constituted by a first resin disposed in a region surrounded by bump electrodes positioned on the outermost periphery of the semiconductor chip, and by a second resin disposed in a region not surrounded by bump electrodes positioned on the outermost periphery of the semiconductor chip, the first and second resins being preferably distinguished from each other in at least one feature selected from a content, a maximum particle diameter and an average particle diameter of the inorganic filler.

According to an alternative sixth embodiment of the present invention, there is further provided a semiconductor device comprising a wiring circuit board and a semiconductor chip mounted through a bump electrode on the circuit board, a space between the circuit board and the semiconductor chip as well as a periphery of the semiconductor chip being encapsulated with a resin, wherein a distance "D" between a peripheral edge of the semiconductor chip and a peripheral edge of the resin satisfies a condition represented by a formula (2) shown below.

$$0 \leq D \leq L_1 L_2 G((L_1+L_2)H) \quad (2)$$

wherein $L_1$ and $L_2$ represent respectively a length of a side of the semiconductor chip, G represents a distance of gap between the circuit board and the semiconductor chip, and H represents a maximum height of the resin filled in the space.

In this six embodiment, the resin may be constituted by a first resin disposed in a region surrounded by bump electrodes positioned on the outermost periphery of the semiconductor chip, and by a second resin disposed in a region not surrounded by bump electrodes positioned on the outermost periphery of the semiconductor chip, the first and second resins being preferably distinguished from each other in at least one feature selected from a content, a maximum particle diameter and an average particle diameter of the inorganic filler.

Each distance "D" between each side edge of the semiconductor chip and each corresponding peripheral edge of the resin may be varied by within ±10% of the average value of all distances "D" around the semiconductor chip. Alternatively, all of the distances "D" between side edges of the semiconductor chip and corresponding peripheral edges of the resin may be controlled to the same to each other.

According to a seventh embodiment of the present invention, there is further provided a semiconductor device comprising a wiring circuit board and a semiconductor chip mounted through a bump electrode on the circuit board, a space between the circuit board and the semiconductor chip as well as a periphery of the semiconductor chip being encapsulated with a resin, wherein a modulus of rigidity "E(Pa)" and a distance "$L_0$(m)" between the center of the semiconductor chip and the center of a bump electrode which is positioned remotest from the center of the semiconductor chip has a relationship represented by a formula (3) shown below.

$$E \geq 0.5 \times 10^{12} \times L_0 \quad (3)$$

In this case, the coefficient of thermal expansion of the resin should preferably be in the range of $4.0 \times 10^{-5}$ (/°C.) to $5.0 \times 10^{-6}$ (/°C.).

In this case, the resin to be encapsulated in the semiconductor device according to the seventh embodiment should preferably be formed of a thermosetting organic material containing at least one kind of inorganic filler selected from silica, quartz and fused silica in a ratio ranging from 45% by weight to 75% by weight.

According to an eighth embodiment of the present invention, there is further provided a semiconductor device comprising a wiring circuit board, a semiconductor chip mounted through a bump electrode on the circuit board, and an encapsulation resin layer filled at least in a space between the circuit board and the semiconductor chip, wherein a high molecular film highly wettable with the encapsulation resin layer is formed on a bonding surface of at least either one of the wiring circuit board and the semiconductor chip.

The semiconductor device according to this eighth embodiment can be manufactured by a process comprising the steps of; forming a high molecular film highly wettable with the encapsulation resin layer on a bonding surface, excluding a bonding portion, of the wiring circuit board, on a bonding surface, excluding end surfaces of the bump electrodes, of the semiconductor chip provided with bump electrodes, or on both of these bonding surfaces; aligning and bonding the bonding surface of the wiring circuit board with the bump electrode formed on the semiconductor chip; filling the encapsulation resin into a space between the wiring circuit board and the semiconductor chip; and curing the encapsulation resin.

According to an alternative eighth embodiment of the present invention, there is further provided a semiconductor device comprising a wiring circuit board, a semiconductor chip mounted through a plurality of bump electrodes on the circuit board, and an encapsulation resin layer filled at least in a space between the circuit board and the semiconductor chip, wherein the encapsulation resin layer is a laminate consisting of at least two layers, each layer containing a filler dispersed therein in a different content from each other.

The semiconductor device according to this embodiment can be manufactured by a process comprising the steps of; forming an encapsulation resin layer containing a filler in a first content on at least either one of the bonding surfaces, excluding a bonding portion or end surfaces of the bump electrodes, of the wiring circuit board and the semiconductor chip provided with a bump; aligning and bonding the bonding surface of the wiring circuit board with the bump electrode formed on the semiconductor chip; filling the encapsulation resin containing a filler in a second content differing in content from the first content into a space between the wiring circuit board and the semiconductor chip; and curing the encapsulation resin.

Alternatively, the semiconductor device according to this embodiment can be manufactured by a process comprising the steps of; forming an encapsulation resin layer containing a filler in a first content on the bonding surface, excluding a bonding portion, of the wiring circuit board and another encapsulation resin layer containing a filler in a second content differing in content from the first content on the bonding surface, excluding end surfaces of the bump electrodes, of the semiconductor chip; aligning and bonding the bonding surface of the wiring circuit board with the bump electrode formed on the semiconductor chip; filling an encapsulation resin containing a filler in a third content differing in content from the first and second content into a space between the encapsulation resin layer containing a filler in the first content and the encapsulation resin layer containing a filler in the second content, and curing these encapsulation resins.

It is preferable in the eighth embodiment to laminate the encapsulation resin layers in such manner that a layer disposed near the wiring circuit board is larger in size than that disposed near the semiconductor chip, thus forming a stairs-like shape.

More preferably, the contacting surface of the encapsulation resin layer with the semiconductor chip may be smaller or larger than that of the semiconductor chip within a limitation of +5%, while the contacting surface of the encapsulation resin layer with the wiring circuit board is larger than that the wiring circuit board by 15% to 25%.

It is possible in the eighth embodiment to dispose a ring-shaped projection at least on a portion of the surface of the wiring circuit board on which the encapsulation resin layer is to be formed, the ring-shaped projection being formed higher than the height of the bump electrode formed on the semiconductor chip.

The heat conductivity of the encapsulation resin should preferably be in the range of $0.5(Wm^{-1\circ} C.^{-1})$ to $2.0(Wm^{-1\circ} C.^{-1})$ in view of enhancing a heat dissipation from a semiconductor chip mounted in a flip-chip structure.

According to a ninth embodiment of the present invention, there is further provided a semiconductor device comprising a wiring circuit board composed of a substrate and an interconnecting circuit formed on the substrate, a semiconductor chip mounted through a bump electrode on the circuit board, and an encapsulation resin filled in a space between the circuit board and the semiconductor chip, wherein an adhesive strength between the encapsulation resin and the semiconductor chip is smaller than an adhesive strength between the encapsulation resin and the wiring circuit board.

This adhesive strength of the encapsulation resin can be classified into an adhesive strength under shear and an adhesive strength under tension. Each of these adhesive strengths should be controlled in such a relationship that the adhesive strength under shear between the encapsulation resin and the semiconductor chip is smaller than that between the encapsulation resin and the wiring circuit board, and the adhesive strength under tension between the encapsulation resin and the semiconductor chip is smaller than that between the encapsulation resin and the wiring circuit board.

Moreover, the adhesive strength under shear of the encapsulation resin should preferably be smaller than any of the adhesive strength under shear and the adhesive strength under tension between the encapsulation resin and the wiring circuit board.

According to a ninth embodiment of the present invention, there is further provided a semiconductor device comprising a wiring circuit board composed of a substrate and an interconnecting circuit portion formed on the substrate, a semiconductor chip mounted through a bump electrode on the circuit board, and an encapsulation resin filled in a space between the circuit board and the semiconductor chip, wherein an adhesive strength between the encapsulation resin and the wiring circuit board is smaller than an adhesive strength between the encapsulation resin and the semiconductor chip, and also smaller than an adhesive strength between the circuit board and the interconnecting circuit portion.

In this case, the adhesive strength under shear between the encapsulation resin and the wiring circuit board is smaller than that between the encapsulation resin and the semiconductor chip, and the adhesive strength under tension between the encapsulation resin and the wiring circuit board is smaller than that between the encapsulation resin and the semiconductor chip.

Moreover, the adhesive strength under shear of the encapsulation resin should preferably be larger than any of the adhesive strength under shear and the adhesive strength under tension between the encapsulation resin and the wiring circuit board, and at the same time should preferably be smaller than any of the adhesive strength under shear and the adhesive strength under tension between the encapsulation resin and the semiconductor chip. The adhesive strength between the wiring circuit board and the interconnecting circuit portion should preferably be larger than the adhesive strength under shear of the encapsulation resin.

In this case, the resin to be filled in the semiconductor device according to this embodiment should preferably be formed of a thermosetting organic material containing at least one kind of inorganic filler selected from silica, quartz and fused silica in a ratio ranging from 45% by weight to 75% by weight. The coefficient of thermal expansion of this resin should preferably be in the range of $4.0\times10^{-5}$ (/°C.) to $5.0\times10^{-6}$ (/°C.).

In the ninth embodiment of this invention, the interconnecting circuit portion formed on the wiring circuit board should preferably be covered on its uppermost layer with a protective film, and at the same time be a multi-layered interconnecting provided with a terminal for connecting with the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross-sectional view showing a conventional semiconductor device;

FIG. 2 is a cross-sectional view showing a conventional semiconductor device;

FIG. 3 is a cross-sectional view showing a conventional semiconductor device;

FIGS. 4A and 4B are cross-sectional views showing a conventional semiconductor device;

FIG. 5 is a cross-sectional view showing a conventional semiconductor device;

FIGS. 15A to 15C are sectional views illustrating a process of manufacturing a semiconductor device according to this invention;

FIGS. 16A to 16C are sectional views illustrating a process of manufacturing a semiconductor device according to this invention;

FIGS. 23A to 23D are sectional views illustrating a process of manufacturing a semiconductor device according to Example III of this invention;

FIG. 24A is a graph showing the relationships between the inflow distance of a resin and the velocity of resin flow;

FIG. 24B is a cross-sectional view showing a semiconductor device according to Example III of this invention for illustrating the flow distance in the graph shown in FIG. 24A;

FIGS. 25A and 25B are sectional views illustrating a process of manufacturing a conventional semiconductor device according to Comparative Example;

FIGS. 27A to 27D are sectional views illustrating a process of manufacturing a semiconductor device according to Example IV of this invention;

FIG. 29 is a cross-sectional view of a semiconductor device according to Example V of this invention;

FIG. 30 is a plan view of a semiconductor device according to Example V of this invention;

FIGS. 31A to 31G are sectional views illustrating a first example of manufacturing process of a semiconductor device according to Example V of this invention;

FIGS. 32A to 32C are sectional views illustrating a second example of manufacturing process of a semiconductor device according to Example V of this invention;

FIGS. 33A to 33C are sectional views illustrating a second example of manufacturing process of a semiconductor device according to Example V of this invention;

FIGS. 34A to 34C are sectional views illustrating a third example of manufacturing process of a semiconductor device according to Example V of this invention;

FIGS. 35A to 35C are sectional views illustrating a third example of manufacturing process of a semiconductor device according to Example V of this invention;

FIG. 36 is a graph showing the relationships between the number of cycle and an accumulative percent defective;

FIG. 37 is a graph showing the relationships between the dimensional error of a semiconductor chip and an accumulative percent defective;

FIG. 44 is a graph showing the relationships between the number of cycle and an accumulative percent defective;

FIG. 45 is a graph showing the relationships between the size of edge portion and an accumulative percent defective;

FIG. 46 is a cross-sectional view of a semiconductor device according to Example VII of this invention;

FIG. 47 is a plan view of a semiconductor device according to Example VII of this invention;

FIGS. 48A and 48B are cross-sectional views illustrating an example of manufacturing process of a semiconductor device according to Example VII of this invention;

FIGS. 53A to 53D are cross-sectional views illustrating an example of manufacturing process of a semiconductor device according to Example VIII-1 of this invention;

FIG. 54 is a cross-sectional view of a semiconductor device according to Example VIII-1 of this invention;

FIG. 55 is a plan view of a semiconductor device according to Example VIII-1 of this invention;

FIG. 57 is a cross-sectional view of a semiconductor device according to Example VIII-2 of this invention;

FIG. 58 is a cross-sectional view of a semiconductor device according to Example VIII-3 of this invention;

FIG. 59 is a graph showing the results of a reliability test performed on the semiconductor device according to Example VIII-2 of this invention;

FIG. 60 is a graph showing relationships between the reliability life and the size of periphery portion of a resin layer which is protruded out of a semiconductor chip in the semiconductor device according to Example VIII-2 of this invention;

FIG. 61 is a graph showing the relationships between the filling distance of a resin and the encapsulating time of the resin;

FIG. 67 is a graph showing the results of a reliability test performed on the semiconductor device according to Example IX-1 of this invention;

FIG. 68 is a cross-sectional view schematically illustrating a shear stress acting on a semiconductor device;

FIG. 69 is a cross-sectional view schematically illustrating a tensile stress acting on a semiconductor device;

FIG. 76 is a bar graph showing the results of an adhesive strength under shear test performed on the semiconductor device according to Example IX-2 of this invention;

FIG. 77 is a bar graph showing the results of an adhesive strength under tension test performed on the semiconductor device according to Example IX-2 of this invention;

FIG. 78 is a graph showing the results of a reliability test performed on the semiconductor device according to Example IX-2 of this invention; and FIG. 79 is a graph showing the relationships between the adhesive strength of an encapsulation resin and the probability of fracture of a semiconductor device;

DETAILED DESCRIPTION OF THE PREFERRED EMBODIMENTS

Figure 6:
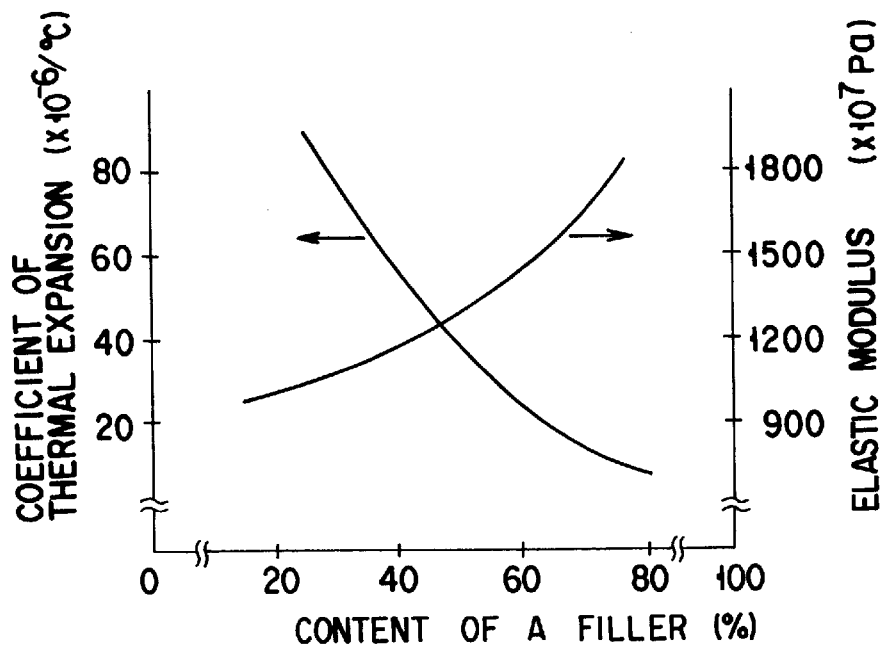
FIG. 6 is a graph showing the relationships between the content of a filler and the coefficient of thermal expansion, and between the content of a filler and the elastic modulus.
Figure 7:
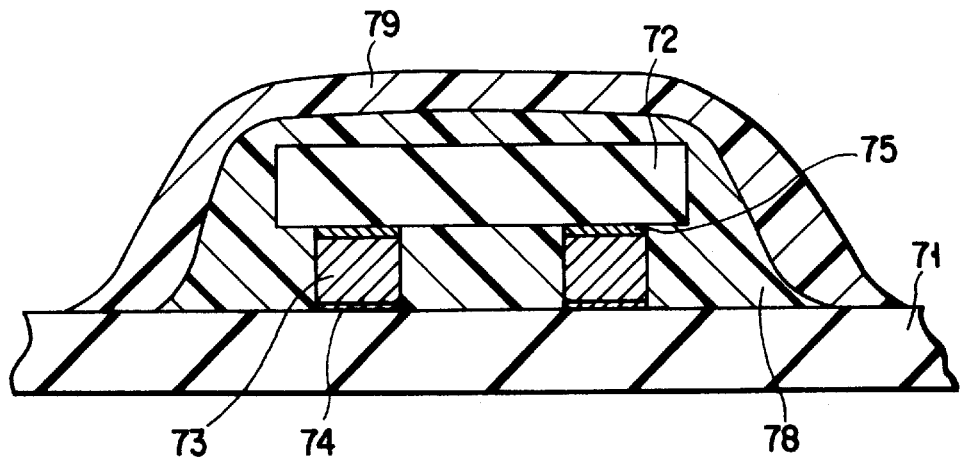
FIG. 7 is a cross-sectional view showing a conventional semiconductor device.
Figure 8:
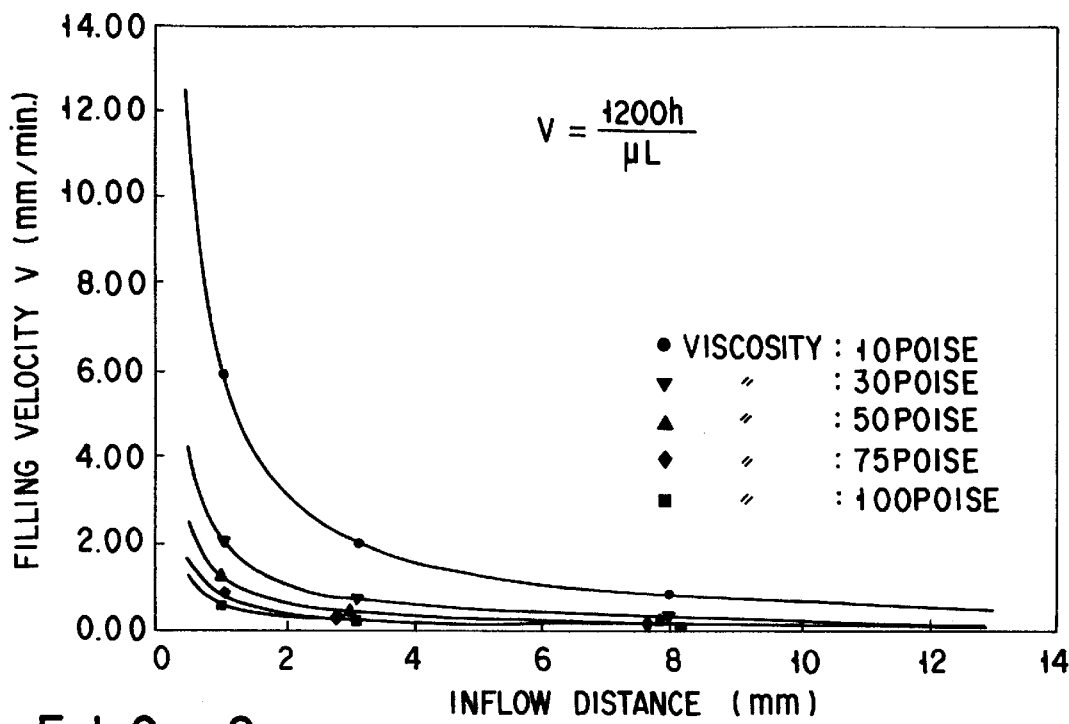
FIG. 8 is a graph showing the relationship between the inflow distance of a resin and the velocity of the resin flow.
Figure 9A:
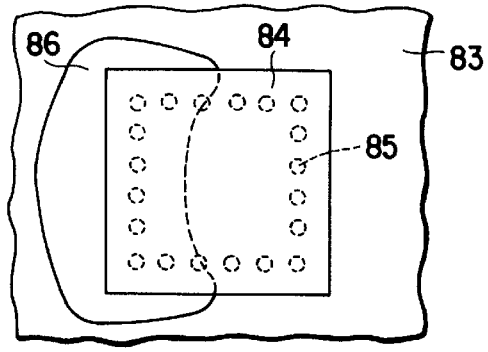
FIGS. 9A to 9D illustrate respectively the filling state of a resin injected into a space between a semiconductor chip and a wiring circuit board.
Figure 9B:
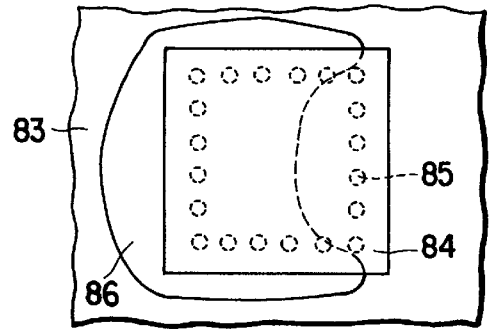
Figure 9C:
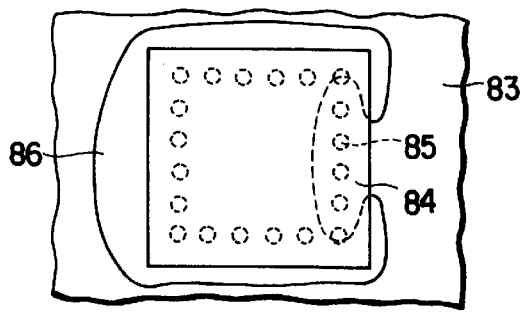
Figure 9D:
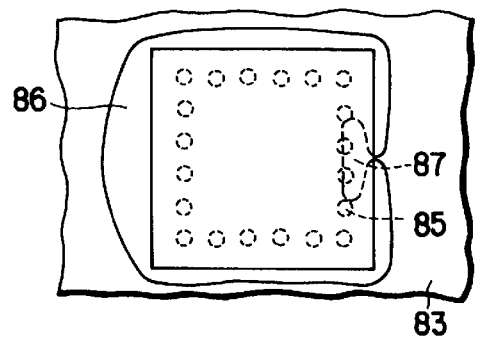
Figure 10A:
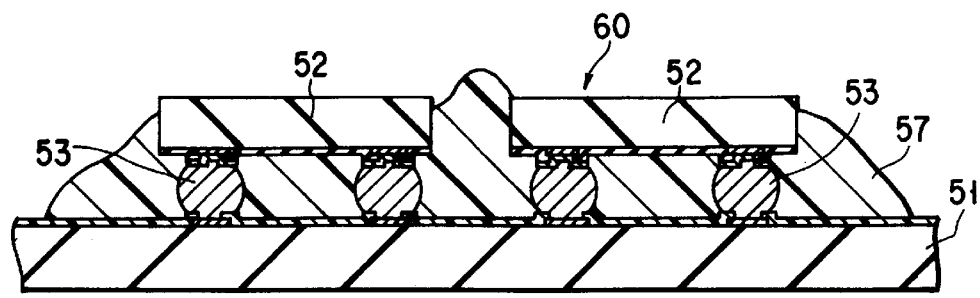
FIGS. 10A and 10B are cross-sectional views showing a conventional semiconductor device.
Figure 10B:
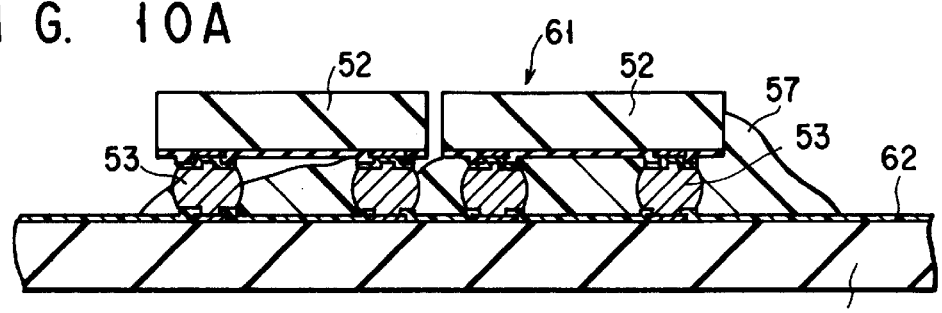

According to this invention, two kinds of resins differing in composition from each other are disposed in a region surrounded by the outermost bump electrodes and in a region not surrounded by the outermost bump electrodes, respectively. Thus, each of the resins can be provided with physical features which are different from each other.

The present inventors have found the fact that a stress to be applied on a resin layer disposed in a space between a semiconductor chip and a wiring circuit board, as well as around the periphery of the semiconductor chip is not uniform throughout the resin layer. Namely, the properties required of the resin disposed within the region encircled by the outermost bump electrodes (an inner region) are not the same as the properties required of the resin disposed in a region outside the outermost bump electrodes (an outer region). The expression of "the region encircled by the outermost bump electrodes" fundamentally means a region encircled by a line connecting each center of the bump electrodes, but should not be understood as being confined by this definition, i.e. the expression may mean a region encircled by a line connecting each inner side of these bump electrodes, or a region encircled by a line connecting each outer side of these bump electrodes.

The properties of the encapsulation resin such as the coefficient of thermal expansion or the elastic modulus are determined in relevant to the content of a filler to be mixed in the resin. For example, a resin containing a smaller amount of filler is higher in coefficient of thermal expansion, but lower in elastic modulus as compared with a resin containing a larger amount of filler.

On the other hand, a resin containing a filler of smaller average particle diameter is higher in coefficient of thermal expansion, but lower in elastic modulus as compared with a resin containing a filler of larger average particle diameter. Further, a resin containing a filler whose maximum particle diameter is relatively smaller is higher in coefficient of thermal expansion, but lower in elastic modulus as compared with a resin containing a filler whose maximum particle diameter is relatively larger. By the expression of "maximum particle diameter" of a filler, it is meant that the mean value of the particle diameters which falls in a range of the upper 20% part of the particle diameter distribution of the filler.

Therefore, if the content of a filler in a resin disposed in the inner region inside the outermost bump electrodes is made less than the content of the filler in the outer region outside the outermost bump electrodes, the coefficient of thermal expansion of the resin disposed inside the inner region of the outermost bump electrodes increases, while the elastic modulus thereof decreases. Namely, a resin disposed in the inner region and contacting with the main surface of a semiconductor chip is formulated to have a smaller Young's modulus, so that a residual stress between the main surface of a semiconductor chip and the resin can be alleviated as much as possible. On the other hand, a resin disposed in the outer region and contacting with the side surface of a semiconductor chip is lower in coefficient of thermal expansion as compared with that of the resin disposed in the inner region so that the concentration of stress distortion due to a thermal stress can be inhibited. With this structure, it is possible to minimize a residual stress between the semiconductor chip and the resin disposed in the inner region, and to avoid not only a problem of peeling of the semiconductor chip due to a residual stress, but also a problem of cracks in the resin layer due to the concentration of stress resulting from the difference in coefficient of thermal expansion. It is also possible to minimize the shearing distortion at the edge of the resin layer due to the heat cycle.

When the content of the filler in the outer region outside the outermost bump electrodes is made higher than that in a resin disposed in the inner region inside the outermost bump electrodes in this manner, it is also possible to cut off the passing of water from outside into the inner region. Therefore, it is possible to prevent the generation of failure due to migration of water, thus enhancing the reliability in moisture resistance.

Furthermore, since the average particle diameter as well as the maximum particle diameter of the filler mixed in a resin to be disposed in the inner region inside the bump electrodes are minimized, it has become possible to prevent the fracture of a semiconductor chip, while assuring a water-shielding effect in the peripheral region of the semiconductor chip outside the bump electrodes. Moreover, the injection of a resin into a region surrounded by the bump electrodes becomes more easier even if the spacing between bump electrodes is small.

A resin containing a relatively small amount of filler is relatively low or small in glass transition point, in dielectric dissipation factor and in dielectric constant as compared with a resin containing a relatively large amount of filler. Therefore, it is possible to improve the electric properties in a region surrounded by the outermost bump electrodes and in a region not surrounded by the outermost bump electrodes.

On the other hand, if the content of a filler in a resin disposed in the inner region inside the outermost bump electrodes is made higher than the content of the filler in the outer region outside the outermost bump electrodes, the coefficient of thermal expansion of the resin disposed inside the inner region of the outermost bump electrodes decreases, while the elastic modulus thereof increases. Therefore, it is possible to alleviate the shearing distortion of the bump to be caused by the deformation stress due to a difference in coefficient of thermal expansion between a semiconductor element and a wiring circuit board.

In this case, the resin disposed outside the outermost bump electrodes exhibits an increased coefficient of thermal expansion and a decreased elastic modulus. Therefore, it is possible to minimize the shear stress of the edge portion of the resin layer originating from a heat cycle. As a result, it is possible to prevent the peeling of the resin layer and the generation of cracks in the resin layer.

When the maximum particle diameter and the average particle diameter of a filler to be mixed in the resin layer to be disposed in the outer region are smaller than the resin layer to be disposed in the inner region, the following effects can be obtained. Namely, the resin layer to be disposed in the outer region is lower in water-shielding effect as compared with the resin layer to be disposed in the inner region. However, the inner region is completely shielded from water. Consequently, it is possible to prevent corrosion of wirings in a semiconductor chip region which is the most easily affected region by corrosion. Therefore, there is no possibility that the bump electrodes may be corroded due to the intrusion of water or chlorine ions into the resin layer from a degraded portion of the resin disposed in the inner region, hence the reliability life of the bump bonding portion will be improved.

Since a difference in properties is caused to generate between the resin disposed in a region surrounded by the outermost bump electrodes of a semiconductor chip and the resin disposed outside the outermost bump electrodes, any stress to be applied to the bump electrodes can be uniformly alleviated throughout the resin layer, and as a result, the stress distortion to the bump electrode portion will be alleviated, thus enhancing the reliability of the resultant semiconductor device.

In the third embodiment of this invention, a hollow portion is formed on a surface portion of the wiring circuit board which corresponds to the central portion of the semiconductor chip. Therefore, the velocity of the resin flow at the central portion of the semiconductor chip is accelerated so that the injection of the resin into the space between the semiconductor chip and the wiring circuit board becomes easier, while the velocity of the resin flow at the peripheral portion of the semiconductor chip is not accelerated. Namely, since the difference in flow velocity of the resin between the peripheral portion and the central portion of the semiconductor is minimized, it is possible to prevent air bubble from entering into the resin layer.

The present inventors have also found the fact that the flow velocity of an encapsulation resin in the region outside the bump electrodes becomes larger as the coating volume of the resin increases, but the flow velocity of an encapsulation resin in the region inside the bump electrodes is irrelevant to the coating volume of the resin. The fourth embodiment of this invention is accomplished on the basis of this finding.

Namely, in the fourth embodiment, the amount of the resin to be disposed in a space between the semiconductor chip and the wiring circuit board is confined to a volume equal to or three times more than the volume of the space, thus preventing the entrapment of air bubble.

According to the fifth embodiment of this invention, an encapsulation resin is disposed only in the space formed between a semiconductor chip and a wiring circuit board, i.e. the encapsulation resin is disposed only over an area which corresponds in size to the semiconductor chip, so that the generation of a stress in one direction as in the case where a major portion of the resin is disposed only one specific side of the semiconductor chip can be prevented. Therefore, there is no possibility that the peeling of a resin from a wiring circuit board or the fracture of the resin around the chip can be generated in a heat cycle test. Moreover, since a shearing distortion to be generated at the peripheral portion of a resin layer due to a heat cycle can be minimized, the reliability of a semiconductor device will be extremely improved.

According to the fifth embodiment, since a resin is not extensively disposed around a semiconductor chip, it is possible to dispose a semiconductor chip in close to another semiconductor chip, so that a flip-chip mounting of high density can be realized.

In the manufacture of a semiconductor device according to the fifth embodiment wherein the area of the resin layer is confined to the same size as that of a semiconductor chip, a resin layer formed around the semiconductor chip after the injection of the resin is dissolved and removed through a sequence of processes comprising light-exposure and development, it is possible to employ a resin of very low viscosity, hence shortening the time required for encapsulating the space between the semiconductor chip and circuit board.

The present inventors have further found the fact that the size of the peripheral portion of resin formed around a semiconductor chip is relevant to the size of the semiconductor chip, to the dimension of space between the semiconductor chip and the circuit board, and to a maximum height of the resin that has been formed. Further, the present inventors have found the fact that there is a specific relationship between a distance from the center of a semiconductor chip to the center of a bump electrode disposed remotest from the semiconductor chip and the modulus of rigidity of an encapsulation resin. The sixth and seventh embodiments are based on these findings.

Namely, according to a sixth embodiment of the present invention, a distance "D" between a peripheral edge of the semiconductor chip and a peripheral edge of the resin is confined by the dimension ($L_1$, $L_2$) of the semiconductor chip, the distance of gap (G) between the circuit board and the semiconductor chip, and a maximum height (H) of the resin filled in the space as represented by the following formula.

$$0 \leq D \leq L_1 L_2 G / ((L_1 + L_2) H)$$

According to a seventh embodiment of the present invention, a modulus of rigidity "E(Pa)" is confined by a distance "$L_0(m)$" between the center of the semiconductor chip and the center of a bump electrode which is positioned remotest from the center of the semiconductor chip as represented by the following formula.

$$E \geq 0.5 \times 10^{12} \times L_0 \qquad (3)$$

According to the sixth and seventh embodiments of the present invention, the size of the peripheral portion of the resin layer and the modulus of rigidity are selected so as to optimize these values in accordance with the size of the semiconductor chip. Therefore, it is possible to improve the reliability of a semiconductor device irrespective of the size of the semiconductor chip.

Thus, it is possible to minimize the shearing distortion of at the peripheral portion of the resin layer originating from a heat cycle, to prevent the fracture of the resin filled in the space between a semiconductor chip and the circuit board, and to prevent the fracture of bump electrodes due to a stress distortion. Further, it is possible to prevent the concentration of stress in one direction of the semiconductor chip, thereby preventing the peeling off of the resin layer and improving the reliability of the flip-chip mounting structure.

It is also possible not only in the sixth embodiment but also in the seventh embodiment limiting the modulus of rigidity to minimize the size of the peripheral portion of the resin layer as compared with conventional packaging, so that semiconductor chips can be disposed in close to each other, thereby making it possible to realize a highly densified flip-chip mounting.

In the conventional method of injecting a resin into a space between a semiconductor chip and a wiring circuit board, it is very difficult to uniformly fill the resin in the space. Whereas, it is possible according to the eighth embodiment to uniformly dispose an encapsulation resin to a semiconductor chip, the stress to be laid on the resin layer can be uniformly dispersed throughout the periphery of the semiconductor chip. As a result, it is possible to avoid the concentration of the resin in one side of a semiconductor chip as in the case of the conventional technique, so that the concentration of stress distortion in one side of a semiconductor chip can also be avoided. Thus, the peel-off of a semiconductor chip from a wiring circuit board or fracture of a semiconductor chip can be prevented.

According to the eighth embodiment, a polymer film excellent in wettability to an encapsulation resin is coated in advance on either one of a semiconductor chip and a wiring circuit board so as to suitably control the coating area of the encapsulation resin in the coating of the encapsulation resin around the semiconductor chip.

When a space between the bump electrodes formed on a semiconductor chip is small, an encapsulation resin of low viscosity should preferably be employed in order to make easier the injection of the encapsulation resin into a space between the semiconductor chip and the wiring circuit board. According to the conventional method, an encapsulation resin is more likely to be coated over an extensive region around the semiconductor chip. Whereas, according to the eighth embodiment of this invention, since a polymer film excellent in wettability to an encapsulation resin is coated in advance on a predetermined surface area, the area to be coated with an encapsulation resin can be controlled, thus making it possible to easily form a uniform encapsulation resin layer.

In the manufacture of a semiconductor device according to the eighth embodiment, a plurality of resin layer, each differing in content of filler, are laminated on a space between a semiconductor chip and a wiring circuit board as well as on a surface around the semiconductor chip. Therefore, it is possible to easily alleviate a large stress distortion and to improve the reliability life of a semiconductor device as compared with the prior art.

In a semiconductor device according to the eighth embodiment, the size of each encapsulation resin layer should preferably be formed in such a manner that the size of an upper encapsulation resin layer disposed closer to the semiconductor chip is always smaller as compared that of lower encapsulation resin layer disposed closer to the wiring circuit board. With this structure, it is possible to alleviate in stepwise the stress on the peripheral portion of the resin layers thereby preventing the fracture of the resin layers due to the concentration of the stress on the peripheral portion of the resin layers.

The encapsulation resin should preferably be disposed on the surface of a wiring circuit board such a way that the area of the resultant resin layer is larger than that of a semiconductor chip by 15% to 25% in order to uniformly disperse the stress on the periphery region of the semiconductor chip. With this structure, it is possible to avoid the concentration of stress distortion resulting from the concentration of the encapsulation resin on one side of the semiconductor chip. As a result, the peel-off of a semiconductor chip from a wiring circuit board or fracture of a semiconductor chip can be prevented.

As an alternative method of controlling the spread of an encapsulation resin, a ring-like projection may be formed as a resin spread-preventing frame on a surface portion of a wiring circuit board, the ring-like projection being formed to surround the circumference of a semiconductor chip to be mounted. If the size of this resin spread-preventing frame is made identical with the size of the semiconductor chip, the frame may be utilized also as an alignment guide for mounting the semiconductor chip. In this case, the self-alignment of a solder is made use of, the employment of a high accuracy mounter as employed in the prior art may be dispensed with, and a semiconductor chip may be mounted on a wiring circuit board through the flip-chip mounting.

According to the eighth embodiment, since a polymer film excellent in wettability to an encapsulation resin is coated in advance on either one of a semiconductor chip and a wiring circuit board, it is possible to employ a resin of high viscosity without requiring a longer period of time for accomplishing the encapsulating, i.e. realizing a high speed encapsulating. The employment of a resin having an increased viscosity through the use of a large amount of filler may be useful in enhancing the reliability of the resultant semiconductor device.

In the manufacture of a semiconductor device according to the eighth embodiment, the uppermost resin layer or the lowermost resin layer, or both of them may be respectively deposited in advance on a semiconductor chip or a wiring circuit board. It is possible in this manner to shorten the time required for the encapsulation with a resin. Additionally, it is possible to form a uniform encapsulation resin layer without causing the spreading of the encapsulation resin, thus extremely improving the reliability life of the semiconductor device.

When a resin having a heat conductivity in the range of 0.5($Wm^{-1}°C.^{-1}$) to 2.0($Wm^{-1}°C.^{-1}$) is employed in this eighth embodiment, the heat conductivity of the resultant semiconductor device will be improved so that the mounting of a heat dissipation means such as heat dissipation fins on the semiconductor device may be omitted. Hence, it is possible to make a semiconductor device thinner and smaller.

According to a ninth embodiment of the present invention, an adhesive strength of the resin layer disposed between the encapsulation resin and the semiconductor chip and around the semiconductor chip is controlled such that the lower layer contacting with a wiring circuit board is made different in adhesive strength from the upper layer contacting with a semiconductor chip. Specifically, the adhesive strength between the encapsulation resin and the semiconductor chip is made smaller than that between the encapsulation resin and the wiring circuit board, and the adhesive strength under shear between the encapsulation resin and the semiconductor chip is also made smaller than that between the encapsulation resin and the wiring circuit board. It is possible with this structure of the resin layer to avoid the generation of fracture of the encapsulation resin due to a thermal distortion at the interface between the semiconductor chip and the encapsulation resin. This kind of fracture would not be generated inside the encapsulation resin or at the interface between the wiring circuit board and the encapsulation resin. Therefore, there is no possibility of that an encapsulation resin layer would be fractured together with the interconnecting or insulating layer formed on a wiring circuit board as experienced in the prior art, hence the repair of a semiconductor chip has become possible.

Since the adhesive strength under shear and the adhesive strength under tension of an encapsulation resin are controlled in this ninth embodiment such that these strengths at the lower layer of the encapsulation resin contacting with a wiring circuit board are made different from those at the upper layer of the encapsulation resin contacting with a semiconductor chip, the following effects can be attained.

Specifically, since the adhesive strength under shear and the adhesive strength under tension of an encapsulation resin layer on the semiconductor chip side are made smaller than those of the encapsulation resin layer on the wiring circuit board side, the fractures of the encapsulation resin adhered on the semiconductor chip and of the interconnecting portion of the wiring circuit board can be prevented even if the semiconductor chip is required to be removed for the repair thereof after the semiconductor chip mounted on the circuit board through the flip-chip mounting is encapsulated with the encapsulation resin. Moreover, the encapsulation resin on the wiring circuit board can be completely removed in the removal of the semiconductor chip, thereby making it possible to easily reassemble the semiconductor chip on the circuit board after the removal of the semiconductor chip.

If the adhesive strength under shear of an encapsulation resin is made smaller than that between the encapsulation resin layer and the wiring circuit board in this ninth embodiment, the encapsulation resin layer with its adhesive strength being made minimum can be easily removed through shearing from the wiring circuit board. Therefore, it is possible to prevent the fracture of the encapsulation resin and the fracture of the wiring circuit board due to the adhesive strength of the encapsulation resin, and at the same time to solve the problem of residual resin on the wiring circuit board.

According to an alternative ninth embodiment of the present invention, an adhesive strength of the resin layer disposed between the encapsulation resin and the semiconductor chip and around the semiconductor chip is controlled such that the lower layer contacting with a wiring circuit board is made different in adhesive strength from the upper layer contacting with a semiconductor chip. Specifically, the adhesive strength between the encapsulation resin and the wiring circuit board is made smaller than that between the encapsulation resin and the semiconductor chip. Especially, the adhesive strength under shear between the encapsulation resin and the wiring circuit board is also made smaller than that between the encapsulation resin and the semiconductor chip, and at the same time, the adhesive strength under shear between the wiring circuit board and the interconnecting portion formed on the wiring circuit board is made larger than that between the encapsulation resin and the wiring circuit board. It is possible with this structure of the resin layer to avoid the generation of fracture of the encapsulation resin due to a thermal distortion at the interface between the wiring circuit board and the encapsulation resin. This kind of fracture would not be generated inside the encapsulation resin or inside the wiring circuit board. Therefore, there is no possibility of that an encapsulation resin layer would be fractured together with the interconnecting or insulating layer formed on a wiring circuit board as experienced in the prior art, hence the repair of a semiconductor chip has become possible.

Since the adhesive strength under shear and the adhesive strength under tension of an encapsulation resin are controlled in this alternative ninth embodiment such that these strengths at the lower layer of the encapsulation resin contacting with a wiring circuit board are made different from those at the upper layer of the encapsulation resin contacting with a semiconductor chip, the following effects can be attained.

Specifically, since the adhesive strength under shear and the adhesive strength under tension of an encapsulation resin layer on the wiring circuit board side are made smaller than those of the encapsulation resin layer on the semiconductor chip side, and at the same time, since the adhesive strength under shear and the adhesive strength under tension between the encapsulation resin and the wiring circuit board are made smaller those that between the wiring circuit board and the interconnecting portion formed on the wiring circuit board, the fractures of the encapsulation resin adhered on the semiconductor chip and of the interconnecting portion of the wiring circuit board can be prevented even if the semiconductor chip is required to be removed for the repair thereof after the semiconductor chip mounted on the circuit board through the flip-chip mounting is encapsulated with the encapsulation resin. Moreover, the encapsulation resin on the wiring circuit board can be completely removed in the removal of the semiconductor chip, thereby making it possible to easily reassemble the semiconductor chip on the circuit board after the removal of the semiconductor chip.

If the adhesive strength under shear of an encapsulation resin is made larger than the adhesive strength under shear as well as than the adhesive strength under tension between the encapsulation resin layer and the wiring circuit board in this alternative ninth embodiment, the encapsulation resin layer with its adhesive strength being made minimum can be easily removed through shearing from the wiring circuit board. Therefore, it is possible to prevent the fracture of the encapsulation resin per se as well as the fracture of the wiring circuit board due to the adhesive strength of the encapsulation resin, and at the same time to solve the problem of residual resin on the wiring circuit board.

According to the ninth embodiment of this invention, it is possible to prevent the fracture of a wiring circuit board and at the same time to prevent the encapsulation resin from being left on the wiring circuit board after the removal of a semiconductor chip. This complete removal of the encapsulation resin from the circuit board can be realized not only when a semiconductor chip once assembled is removed immediately after the assembling, but also when a semiconductor chip once assembled is removed after the failure of the semiconductor chip is found during the operation and the semiconductor chip is required to be removed.

The ninth embodiment of this invention is based on the relationships with regard to adhesive strength among various junctions in a semiconductor device. Namely, by adjusting the relationships among the bonding strength between an encapsulation resin and a wiring circuit board, the bonding strength between an encapsulation resin and a semiconductor chip, and the bonding strength between the interconnecting portion of a wiring circuit board and the wiring circuit board, the semiconductor chip can be selectively removed from the wiring circuit board.

In this case, the coefficient of thermal expansion of the resin to be used for the encapsulating is adjusted to the range of $4.0 \times 10^{-5}$ (/°C.) to $5.0 \times 10^{-6}$ (/°C.) by the addition of an inorganic filler selected from silica, quartz and fused silica in a ratio ranging from 45% by weight to 75% by weight. Therefore, the physical properties of the encapsulation resin are almost identical with the resins conventionally employed. Therefore, it is possible to realize a semiconductor device of high reliability, which is free from the lowering of reliability due to a thermal distortion.

This invention will be further explained with reference to drawings.

EXAMPLE I

In the preparation of a semiconductor device according to this Example, a first resin to be disposed in a region surrounded by outermost bump electrodes was mixed with a filler in a different manner from that in a second resin to be disposed in a region outside the outermost bump electrodes, i.e. at least one feature selected from the content, maximum particle diameter and average particle diameter of the filler mixed in the first resin is made smaller as compared with the filler mixed in the second resin. These first and second resins were disposed in a space between a semiconductor chip and a wiring circuit board to prepare the semiconductor device.

Figure 11:
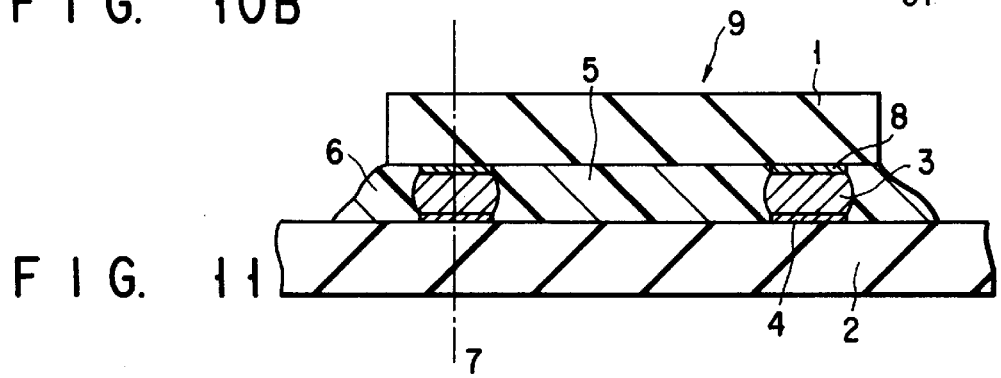
FIG. 11 is a cross-sectional view showing a semiconductor device according to this invention.
Figure 12:
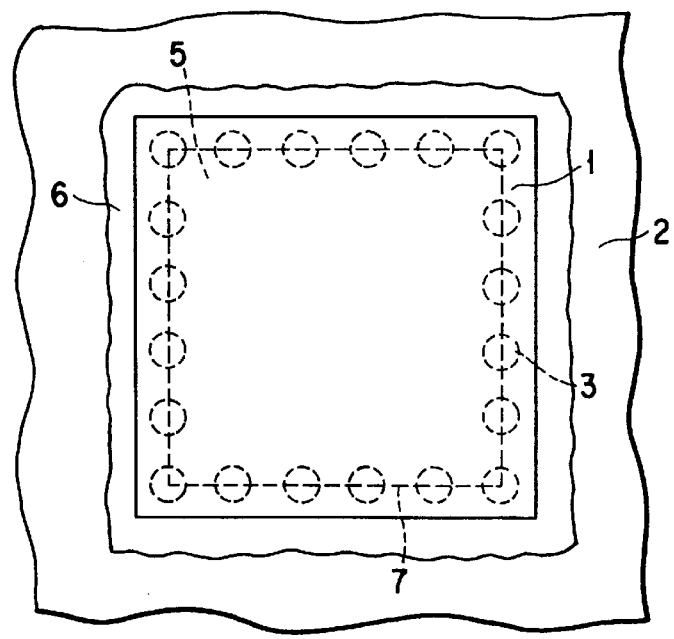
FIG. 12 is a plan view showing a semiconductor device according to this invention.

FIG. 11 shows a cross-sectional view of one example of such a semiconductor device as described above according to this invention. FIG. 12 illustrates the plan view of this semiconductor device.

As shown in FIG. 11, in the semiconductor device 9 of this invention, a semiconductor chip 1 is mounted through bump electrodes 3 and an Al bonding pad 8 on a wiring circuit board 2 provided with a connecting terminal 4. Additionally, as shown in FIG. 12, a first resin 5 is disposed in a space between the semiconductor chip 1 and the wiring circuit board 2, or a region surrounded by outermost bump electrodes. On the other hand, a second resin 6 is disposed on an outer region not surrounded by the outermost bump electrodes. In this Example, by the expression of "the region surrounded by the outermost bump electrodes", it is meant a region encircled by a line 7 connecting each center of the outermost bump electrodes.

Examples of resin useful in this invention are thermosetting resins of non-solvent type in which an inorganic filler is mixed. For example, a mixture comprising phenol-based epoxy resin such as bisphenol type epoxy resin, an acid anhydride curing agent and imidazole curing catalyst, a mixture comprising a silicone rubber such as dimethyl polysiloxane and organic peroxide, polyimide resin, maleimide resin, polyurethane resin, acrylate resin and phenol type epoxy resin. Examples of inorganic filler useful in this case are silica, quartz and fused silica.

The content and particle diameter of the filler to be mixed in the first resin and the second resin may be determined in relative to each other. Namely, a filler being smaller both in the maximum particle diameter and in average particle diameter than those of the filler to be mixed in the second resin will be mixed in the first resin at a smaller content than that to be mixed in the second resin. For example, the content of the filler in the first resin should preferably be in the range of 5% by weight to 45% by weight, more preferably 20% by weight to 40% by weight. The maximum particle diameter of the filler should preferably be 7 $\mu$m to 45 $\mu$m, more preferably 15 $\mu$m to 40 $\mu$m. The average particle diameter of the filler should preferably be 5 $\mu$m to 25 $\mu$m, more preferably 7 $\mu$m to 20 $\mu$m.

On the other hand, the content of the filler in the second resin should preferably be in the range of 20% by weight to 60% by weight, more preferably 30% by weight to 45% by weight. The maximum particle diameter of the filler should preferably be 15 $\mu$m to 60 $\mu$m, more preferably 30 $\mu$m to 50 $\mu$m. The average particle diameter of the filler should preferably be 10 $\mu$m to 45 $\mu$m, more preferably 15 $\mu$m to 40 $\mu$m.

When the content of at least either one of sodium ion and chlorine ion in the first resin is controlled to be lower than that in the second resin, the production of a defective product due to corrosion can be prevented.

In this case, the contents of sodium ion and chlorine ion in the first resin should preferably be controlled respectively to 1 ppm or less and 5 ppm or less. On the other hand, the contents of sodium ion and chlorine ion in the second resin should preferably be controlled respectively to 10 ppm or less and 10 ppm or less.

The semiconductor device of this invention can be manufactured by the following steps.

FIGS. 13A to 13D and 14A to 14D illustrate one example of manufacturing steps.

Figure 13A:
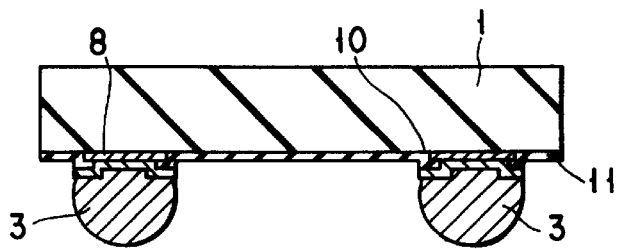
FIGS. 13A to 13D are sectional views illustrating a process of manufacturing a semiconductor device according to this invention.

First, a semiconductor chip 1 as shown in FIG. 13A and a wiring circuit board 2 as shown in FIG. 3B are prepared.

Bump electrodes 3 formed on the main surface of the semiconductor chip 1 can be formed by way of a vapor deposition or an electroplating. The material for the bump electrode may be a solder in general, but may be other kind of metal having a higher rigidity as compared with the solder such for example as Au and Cu.

The size of the semiconductor chip, the number of the bump electrode and the pitch of bump electrodes may be arbitrarily selected. The layout of the bump electrodes may be realized.

In this invention, a semiconductor chip 10 mm×10 mm in size was employed, and after a Cu/Ti barrier metal 10 was formed thereon, the bump 3 having a diameter of 100 $\mu$m and a height of 75 $\mu$m±5 $\mu$m was formed thereon. A total number of 256 of bumps were arrayed along the periphery of the semiconductor chip.

Namely, on the surface of the semiconductor chip 1, there are formed an Al bonding pad 8 and a passivation film 11. Additionally, the bump electrodes 3 are formed via the barrier metal 10 on the Al bonding pad 8.

There is no restriction as to the material and structure of the wiring circuit board 2. For example, a laminated glass/ epoxy substrate may be employed. In the following explanation, a printed SLC (Surface Laminar Circuit) board comprising a glass/epoxy substrate on which an insulating layer and a conductive layer are build-up was exemplified as the substrate.

Figure 13B:
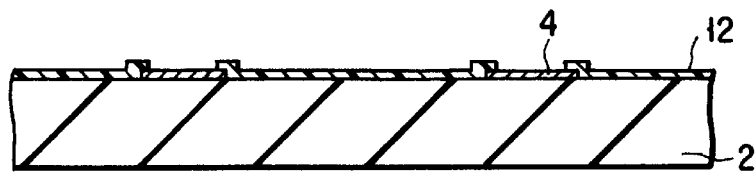

Namely, as shown in FIG. 13B, an opening 110 $\mu$m in diameter was formed in a connecting terminal area 4 of the wiring circuit board 2 in conformity with the location of the bump electrode of the semiconductor chip, thereby exposing Cu as a terminal material. All of the area other than the connecting terminal area 4 was covered with a solder resist 12.

Figure 13C:
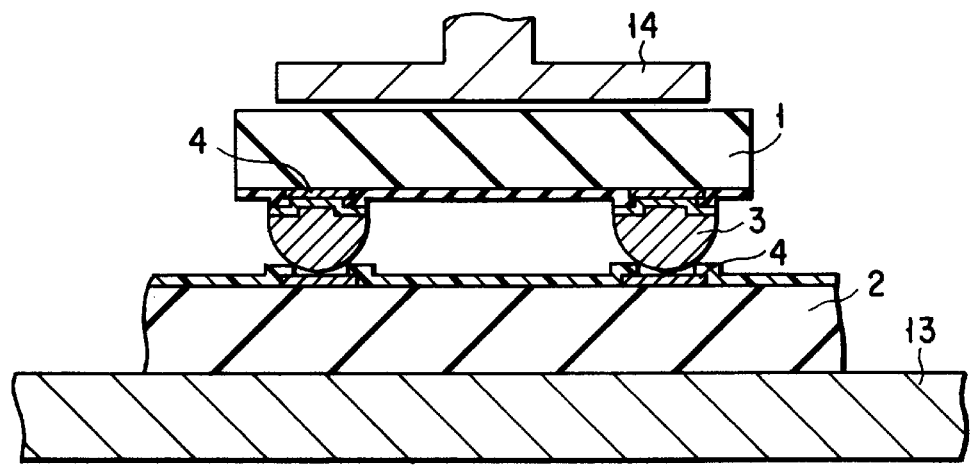

Then, as shown in FIG. 13C, the semiconductor chip 1 was aligned by making use of a flip-chip bonder on the wiring circuit board 2 prepared as described above, thereby electrically and mechanically contacting the bump electrodes 3 with the connecting terminal 4 of the wiring circuit board 2. At this moment, the wiring circuit board 2 was held on a stage 13 provided with a heating means and preliminarily heated in an atmosphere of nitrogen at a temperature of 200° C. which is higher than the melting point of Pb/Sn (40/60).

While keeping the semiconductor chip 1 contacted with the wiring circuit board 2, a collet 14 sustaining the semiconductor chip was heated in a nitrogen atmosphere at the same temperature of 200° C. as in the case of the stage 13. As a result of this heating, the solder was molten to achieve an electrical and mechanical temporary connection between the semiconductor chip 1 and the wiring circuit board 2. Finally, the wiring circuit board 2 mounting the semiconductor chip 1 thereon was passed through a reflow furnace which is heated to 250° C. and in which nitrogen is filled so as to electrically and mechanically connect the semiconductor chip 1 with the wiring circuit board 2.

During this heating step, a self-alignment effect was developed by the surface tension of the solder so that the dislocation more or less of the semiconductor chip 1 brought about during the mounting step was corrected, thus realizing an accurately aligned bonding of semiconductor chip 1.

Figure 13D:
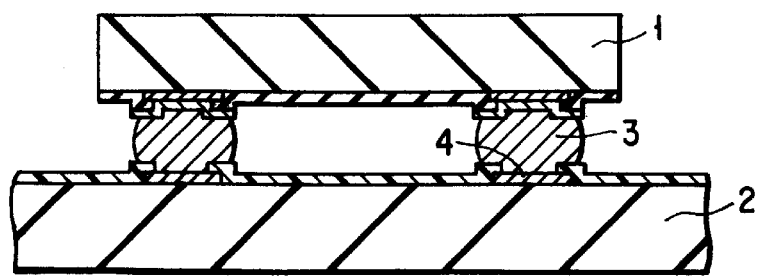

Through these steps, the semiconductor chip 1 can be mounted with bumps on the wiring circuit board as shown in FIG. 13D.

Figure 14A:
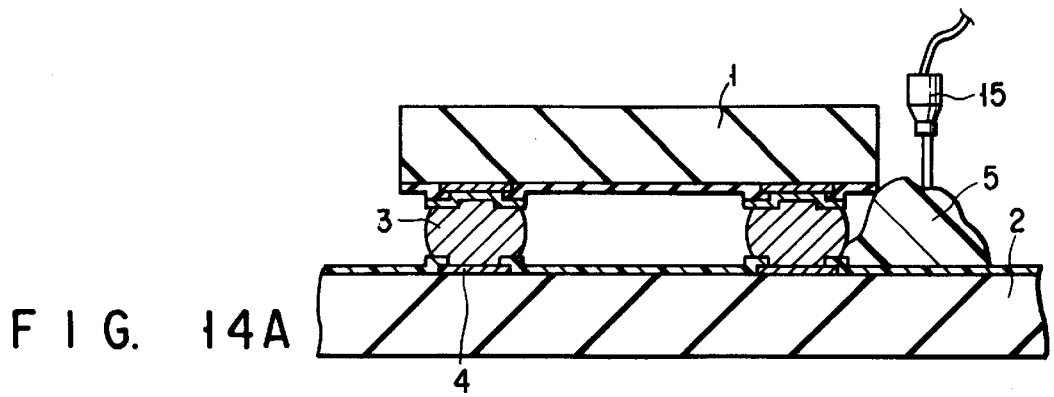
FIGS. 14A to 14D are sectional views illustrating a process of manufacturing a semiconductor device according to this invention.
Figure 14B:
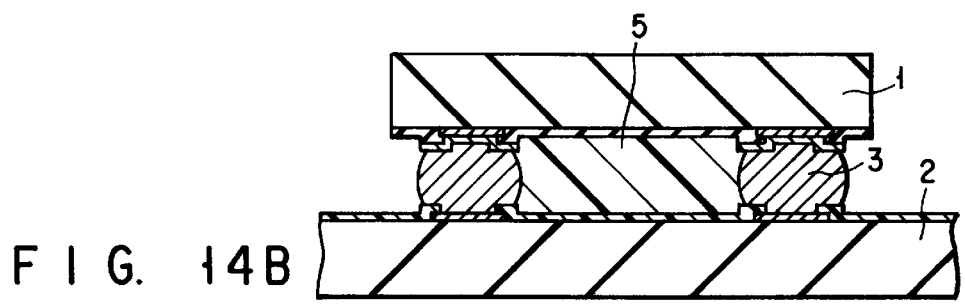

Then as shown in FIG. 14A, a potting of a first resin into a space formed between the semiconductor chip 1 and the wiring circuit board 2 was performed by using a dispenser 15. The resin 5 was introduced into a region encircled by the bump electrodes 3 by way of capillarity, and disposed as shown in FIG. 14B.

The resin employed in this case was a mixture comprising bisphenol type epoxy resin, an imidazole curing catalyst, an acid anhydride curing agent and a spherical quartz filler (the maximum particle diameter: 20 $\mu$m, and average particle diameter: 5 $\mu$m). The content of the filler was 30% by weight, and the amount of the resin disposed was about 4 ml.

The first resin employed had a different composition from that of the second resin to be disposed later, so that the curing of the resin within the region encircled by the bump electrodes 3 could be accomplished within a shorter period of time. Therefore, since the semiconductor chip 1 could be temporarily fixed in place by the injection of the first resin, the semiconductor chip 1 could be reliably mounted on the wiring circuit board 2 through the flip-chip mounting.

Then, the potting of a second resin 6 was performed over the peripheral region of the semiconductor chip 1 by making use of capillarity thereby encapsulating the region not surrounded by the bump electrodes.

The second resin employed was substantially the same in composition except that a spherical quartz filler having a maximum particle diameter of 35 $\mu$m and an average particle diameter of 10 $\mu$m was employed at the content of 45% by weight, the amount of the second resin disposed was about 2 ml.

The amount of the resin, including the first resin and the second resin, to be disposed can be suitably selected depending on the size of the semiconductor chip and on the height of the bump electrode.

Figure 14C:
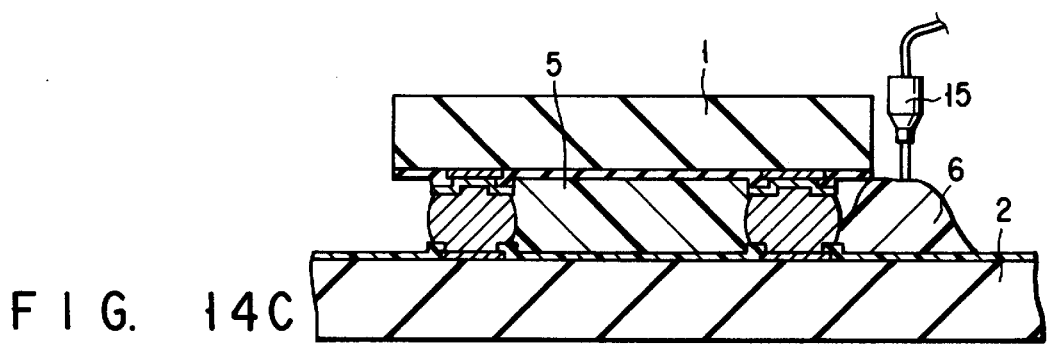
Figure 14D:
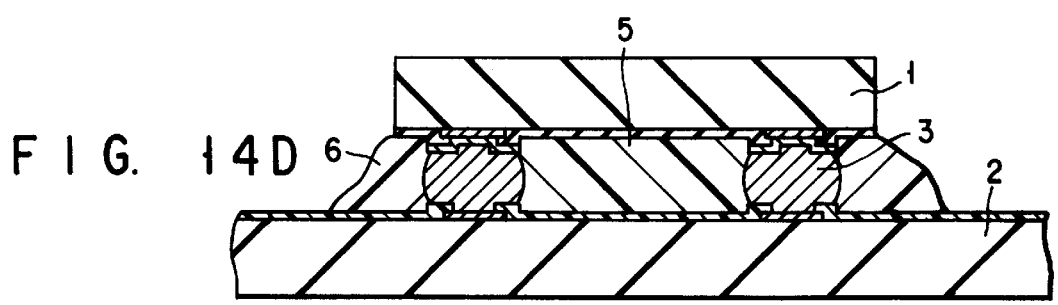

Subsequently, the resultant device was kept in a clean oven at a temperature of 80° C. for 4 hours to cure the resin thus disposed, thus obtaining a semiconductor device of this invention as shown in FIG. 14D.

The manner of depositing the first and second resins is not restricted to that described above, but may also be disposed as shown below.

FIGS. 15A to 15C and 16A to 16C illustrate a second example of manufacturing a semiconductor device of this invention. The semiconductor chip and the wiring circuit board employed herein were the same in structure with those shown in FIGS. 13A and 13B. A resin having the same composition as used in the above-mentioned first example was disposed in the same volume as disposed in the first example.

First, the potting of the first resin 5 was performed in advance by placing the first resin 5 on a surface region of the wiring circuit board 2 to be encircled by the bump electrodes 3 as shown in FIG. 15A.

Then, as shown in FIG. 15B, the semiconductor chip 1 was aligned over the wiring circuit board 2 by using a flip-chip bonder, and the bump electrodes 3 and the connecting terminals 4 were electrically and mechanically connected to each other. At this moment, the wiring circuit board 2 was sustained on the stage 13 provided with a heating means to be heated at a temperature of 200° C. in a nitrogen atmosphere.

The first resin 5 being potted was completely extended throughout the space between the semiconductor chip 1 and the wiring circuit board 2 as shown in FIG. 15C, and semi-cured by the heat of 200° C.

Then, the potting of the second resin 6 to the periphery of the semiconductor chip was performed in the same manner as shown in FIG. 14C. Finally, the resultant composite was charged into a clean oven kept at a temperature of 80° C. for 4 hours to completely cure the resins.

Alternatively, the first resin 5 may be preliminarily potted in a region encircled by the bump electrodes 3 formed on the semiconductor chip 1 as shown in FIG. 16A.

Then, as shown in FIG. 16B, the semiconductor chip 1 provided with the first resin in this manner was aligned over the wiring circuit board 2 by using a flip-chip bonder, and the bump electrodes 3 and the connecting terminals 4 were electrically and mechanically connected to each other. At this moment, the wiring circuit board 2 was sustained on the stage 13 provided with a heating means to be heated at a temperature of 200° C. in a nitrogen atmosphere.

The first resin 5 being potted was completely extended throughout the space between the semiconductor chip 1 and the wiring circuit board 2 as shown in FIG. 16C, and semi-cured by the heat of 200° C.

Then, the potting of the second resin 6 to the periphery of the semiconductor chip was performed in the same manner as shown in FIG. 14C. Finally, the resultant composite was charged into a clean oven kept at a temperature of 80° C. for 4 hours to completely cure the resins.

Figure 17A:
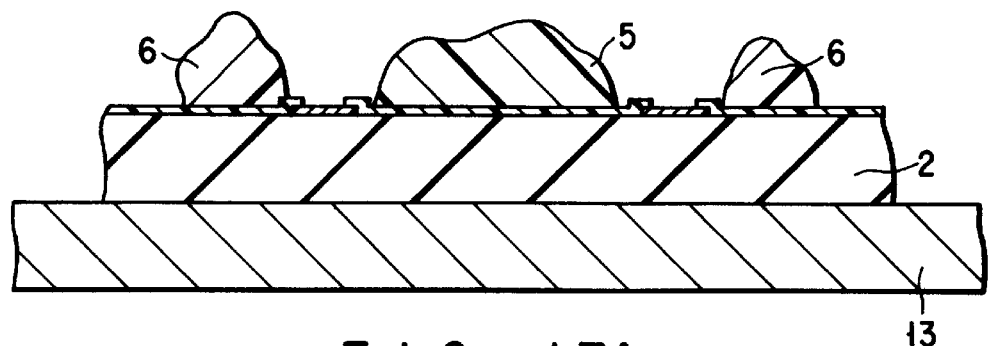
FIGS. 17A to 17C are sectional views illustrating a process of manufacturing a semiconductor device according to this invention.
Figure 17B:
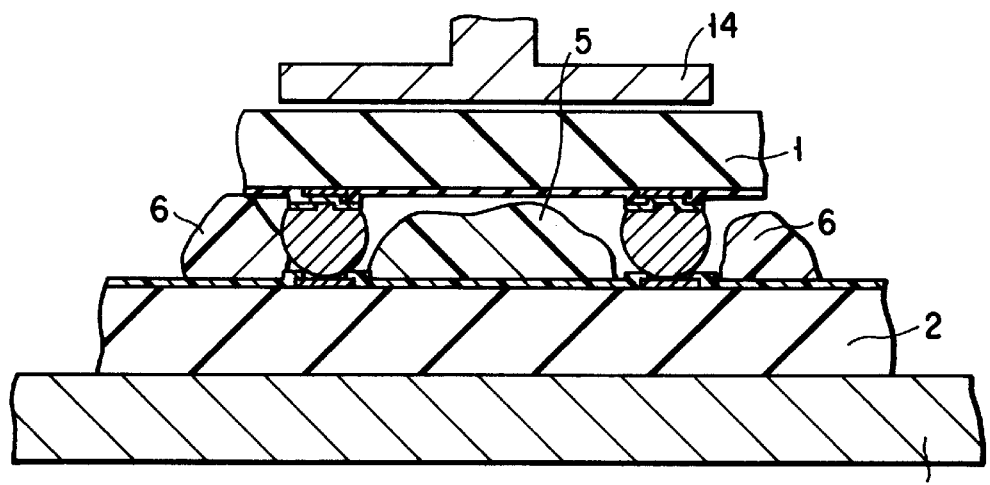
Figure 17C:
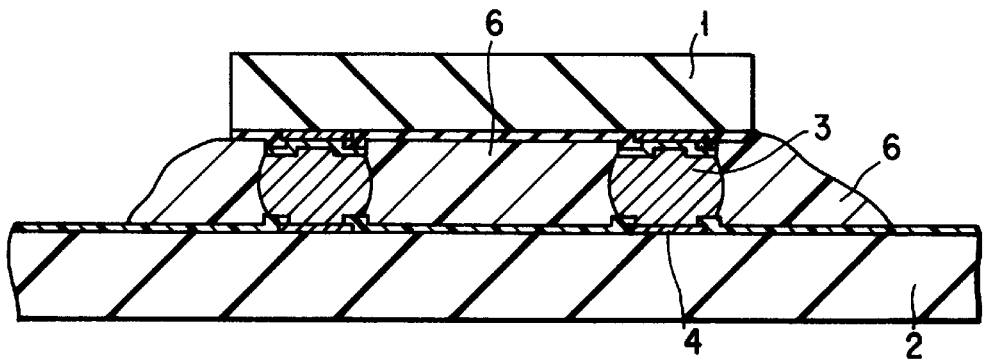

FIGS. 17A to 17C show a third example of manufacturing process of a semiconductor device of this invention. The semiconductor chip and the wiring circuit board employed herein were the same in structure as shown in FIGS. 13A and 13B. A resin of the same composition and the same volume as employed in the first example was disposed in this example.

First, as shown in FIG. 17A, the first resin 5 and the second resin 6 were potted in advance by placing these resins on a surface region of the wiring circuit board 2 to be encircled by the bump electrodes 3 as well as on a region outside the bump electrodes 3.

Then, as shown in FIG. 17B, the semiconductor chip 1 was aligned over the wiring circuit board 2 by using a flip-chip bonder, and the bump electrodes 3 and the connecting terminals 4 were electrically and mechanically connected to each other.

The first resin 5 and the second resin 6 being potted in advance were disposed in the space between the semiconductor chip 1 and the wiring circuit board 2 as well as on the region around the periphery of the semiconductor chip as shown in FIG. 17C, and were semicured by the heat.

Finally, the resultant composite was charged into a clean oven kept at a temperature of 80° C. for 4 hours to completely cure the resins.

Figure 18A:
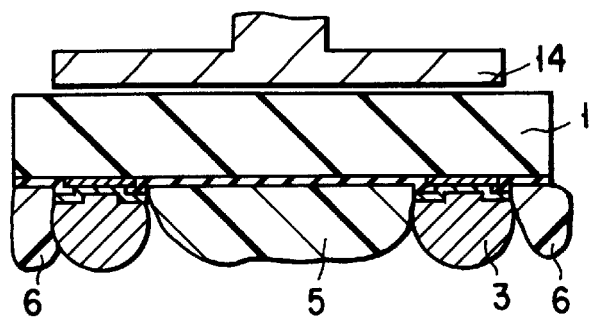
FIGS. 18A to 18C are sectional views illustrating a process of manufacturing a semiconductor device according to this invention.

Alternatively, the first resin 5 and the second resin 6 may be preliminarily potted in a region encircled by the bump electrodes 3 formed on the semiconductor chip 1 as well as on a region outside the bump electrodes 3 as shown in FIG. 18A.

Figure 18B:
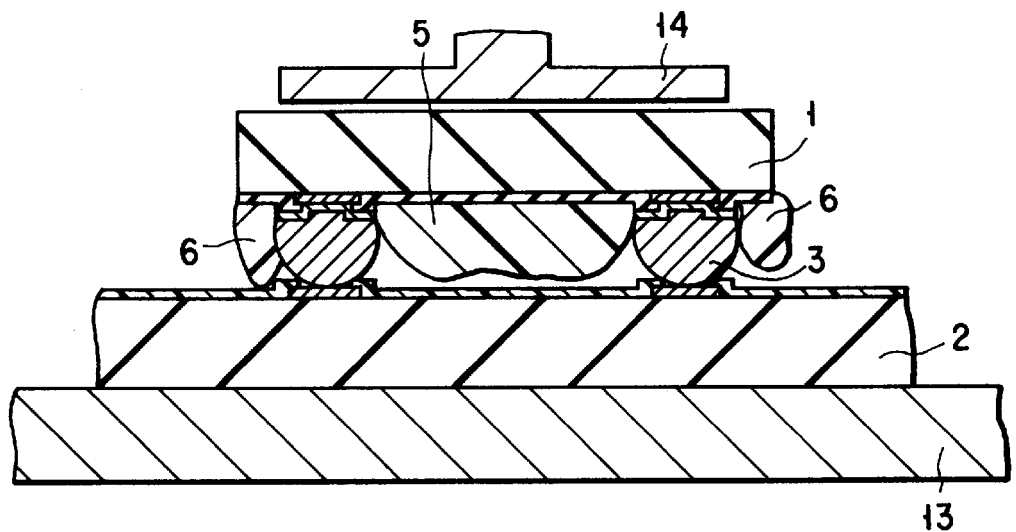
Figure 18C:
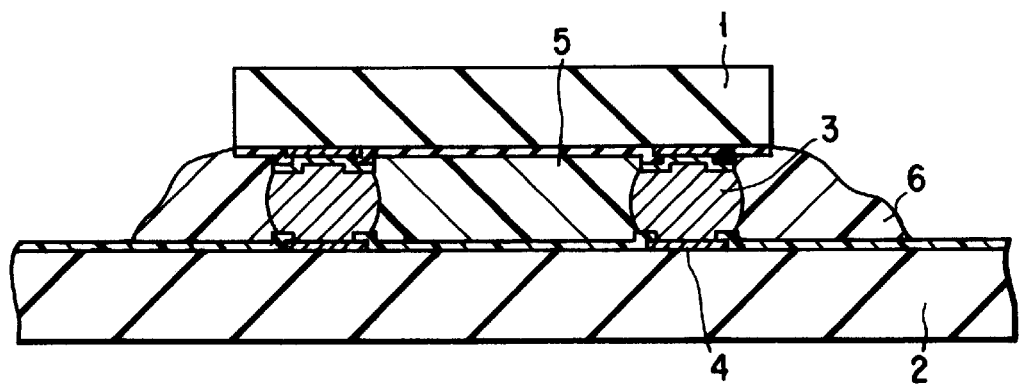

Then, as shown in FIG. 18B, the semiconductor chip 1 provided with the first resin 5 and the second resin 6 in this manner was aligned over the wiring circuit board 2 by using a flip-chip bonder, and the bump electrodes 3 and the connecting terminals 4 were electrically and mechanically connected to each other. At this moment, the wiring circuit board 2 was sustained on the stage 13 provided with a heating means to be heated at a temperature of 200° C. in a nitrogen atmosphere, thus obtaining the semiconductor device of this invention as shown in FIG. 18C.

As illustrated above, the semiconductor device of this invention can be manufactured by various methods.

This Example will be further explained with reference to the following specific example.

In accordance with the first example as described above, 256 pins of bumps, each formed of Pb/Sn (40/60) and having a diameter of 100 $\mu$m and a height of 80 $\mu$m, were formed on a semiconductor chip 10 mm×10 mm in size, which was then mounted through a flip-chip mounting on an SLC substrate, thereby obtaining the semiconductor device of Example (I-1).

In this Example (I-1), the elastic modulus $E_1$ of the resin (the first resin) to be disposed in a region surrounded by the bumps was selected to be 900×10$^7$ Pa, and the elastic modulus $E_2$ of the resin (the second resin) to be disposed in a region not surrounded by the bumps was selected to be 1200×10$^7$ Pa. Further, the coefficient of thermal expansion a for both of the first and second resins was selected to be 39×10$^{-6}$/°C. These physical properties were adjusted by mainly changing the content of a filler to be mixed therein and also by optionally changing the maximum particle diameter and average particle diameter of the filler, or by changing, if required, the molecular weight of the resin. Namely, the content of the filler mixed in the first resin was 25% by weight, the maximum particle diameter thereof was 30 $\mu$m and the average particle diameter thereof was 7 $\mu$m, while the content of the filler mixed in the second resin was 40% by weight, the maximum particle diameter thereof was 40 $\mu$m and the average particle diameter thereof was 15 $\mu$m.

Figure 19:
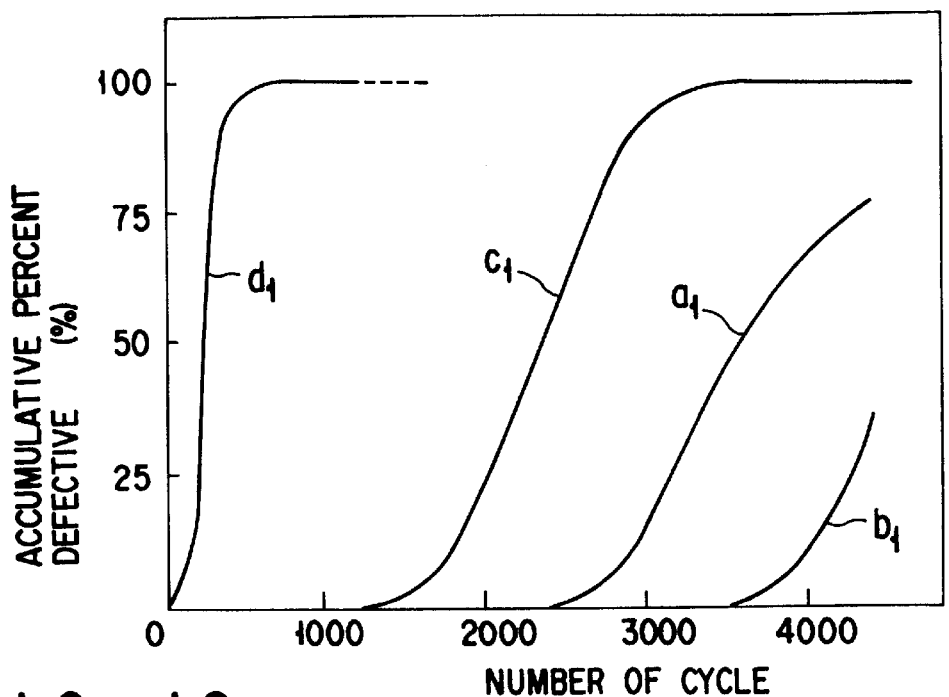
FIG. 19 is a graph showing the relationships between the number of cycle and an accumulative percent defective.

The semiconductor device thus obtained was subjected to a heat cycle test, in which a sample exhibiting even one failure of connection of the bump electrode out of 256 pins of the bump electrodes was assumed to be defective, and the relationship between the heat cycle and the accumulative percent defective was investigated. The results obtained are indicated by a curve $a_1$ in FIG. 19. The number of the sample employed was 1,000, and the heat cycle was conducted under a condition of −55° C. (30 minutes) to 25° C. (5 minutes) to 125° C. (30 minutes) to 25° C. (5 minutes).

As shown in the curve $a_1$, when the elastic modulus $E_2$ of the resin (the second resin) to be disposed in a region not surrounded by the bumps was made higher than the elastic modulus $E_1$ of the resin (the first resin) to be disposed in a region surrounded by the bumps, the generation of a defective product was not recognized up to 2,500 cycles.

Another kind of semiconductor device, Example (I-2) was manufactured in the same manner as described above except that two kinds of resins, each differing in coefficient of thermal expansion from each other, were employed. In this Example (I-2), the coefficient of thermal expansion $\alpha_1$ of the resin (the first resin) to be disposed in a region surrounded by the bumps was selected to be 39×10$^{-6}$/°C., and the coefficient of thermal expansion $\alpha^2$ of the resin (the second resin) to be disposed in a region not surrounded by the bumps was selected to be 20×10$^{-6}$/°C. Further, the elastic modulus for both of the first and second resins was selected to be 900×10$^7$ Pa. These physical properties were adjusted by changing the content of a filler to be mixed therein and also by changing, if required, the molecular weight of the resin. Namely, the content of the filler mixed in the first resin was 30% by weight, the maximum particle diameter thereof was 20 $\mu$m and the average particle diameter thereof was 5 $\mu$m, while the content of the filler mixed in the second resin was 45% by weight, the maximum particle diameter thereof was 35 $\mu$m and the average particle diameter thereof was 10 $\mu$m.

The semiconductor device thus obtained was subjected to a heat cycle test in the same manner as described above, and the relationship between the heat cycle and the accumulative percent defective was investigated. The results obtained are indicated by a curve $b_1$ in FIG. 19.

As shown in the curve $b_1$, when the coefficient of thermal expansion $\alpha_2$ of the resin (the second resin) to be disposed in a region not surrounded by the bumps was made smaller than the coefficient of thermal expansion $\alpha_1$ of the resin (the first resin) to be disposed in a region surrounded by the bumps, the generation of a defective product was not recognized up to 3,500 cycles.

A different kind of semiconductor device, Comparative Example (I-1) was manufactured in the same manner as described above except that a resin having an elastic modulus of 900×10$^7$ Pa and a coefficient of thermal expansion of 39×10$^{-6}$/°C. was employed for disposing it as an encapsulation resin on the inside and outside of the bump electrode. Further, another different kind of semiconductor device, Comparative Example (I-2) was manufactured in the same manner as described above except that the resin was not disposed at all. These semiconductor devices thus obtained, i.e. Comparative Example (I-1) and Comparative Example (I-2) were subjected to a heat cycle test in the same manner as described above. The results obtained are indicated by a curve $c_1$ and a curve $d_1$ in FIG. 19.

As shown in the curve $c_1$, when a single kind of resin was used for sealing both of the regions inside and outside the bump electrodes, the generation of a defective product was not recognized up to 2,000 cycles, but when the heat cycle was increased to 2,500 cycles, 100% of the samples were recognized as being defective. On the other hand, in the case of a sample which was not sealed with a resin (curve $d_1$), the generation of a defective product was recognized after only 2 cycles, and when the heat cycle was increased to 10 cycles, 100% of the samples were recognized as being defective.

As seen from these results, when a resin to be disposed in a region surrounded by bump electrodes is made different in physical properties from a resin to be disposed in a region outside the bump electrodes, the reliability of the semiconductor device can be extremely improved.

A semiconductor device of Example (I-3) was prepared according to the first manufacturing method explained above by using two different kinds of resins wherein the content, average particle diameter and maximum particle diameter of the filler were varied.

The content, average particle diameter and maximum particle diameter of the filler employed for the resin (the first resin) to be disposed in a region surrounded by the bumps and the resin (the second resin) to be disposed in a region not surrounded by the bumps are shown in Table 1.

TABLE 1

|  | First resin | Second resin |
| --- | --- | --- |
| Content of filler (wt %) | 30 | 45 |
| Average particle diameter ($\mu$m) | 5 | 10 |
| Maximum particle diameter ($\mu$m) | 20 | 35 |

Figure 20:
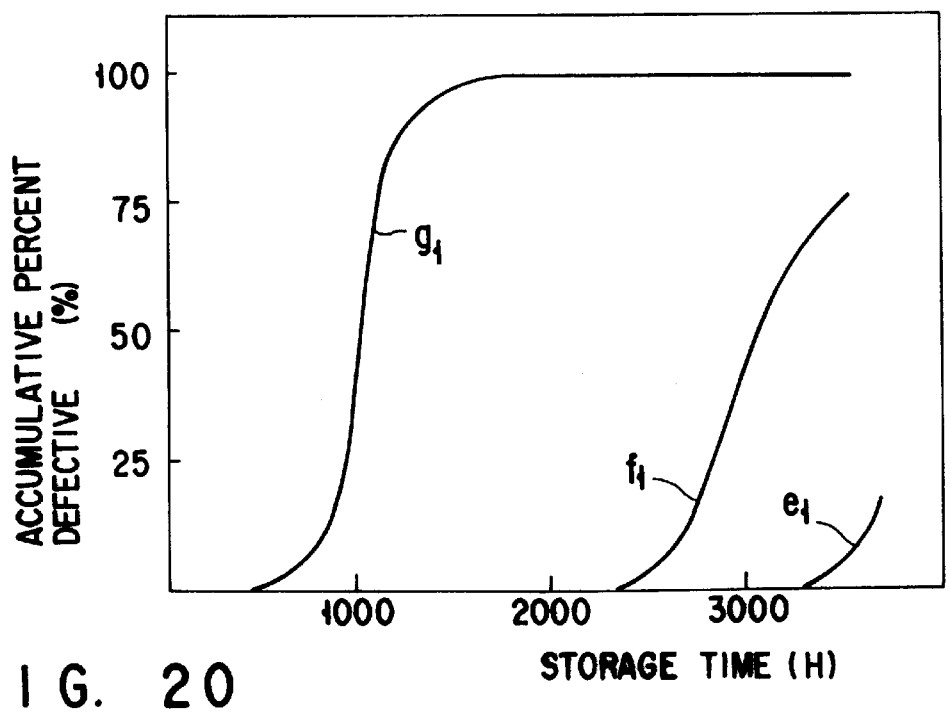
FIG. 20 is a graph showing the relationships between the storage time and an accumulative percent defective.

One hundred pieces of the semiconductor device thus obtained were subjected to a high temperature/high humidity bias storage test under a condition of 85° C., 85% and VDD=5V, in which a sample exhibiting even one failure or short circuit of connection of the bump electrode out of 256 pins of the bump electrodes was assumed to be defective, and the relationship between the storage time and the accumulative percent defective was investigated. The results obtained are indicated by a curve $e_1$ in FIG. 20.

As shown in the curve $e_1$, when a resin to be disposed in a region surrounded by bump electrodes is made different in content, average particle diameter and maximum particle diameter from those of a resin to be disposed in a region outside the bump electrodes, it was possible to inhibit the generation of a defective product up to 3,000 hours. This result can be ascribed to a sufficient water-shielding effect by the resin disposed around the semiconductor chip and containing a filler in large content which is also large in maximum particle diameter and in average particle diameter.

A semiconductor device of Comparative Example (I-3) was manufactured using a resin containing 40% by weight of a filler having an average particle diameter of 7 $\mu$m and a maximum particle diameter of 20 $\mu$m, which was disposed as an encapsulation resin on the inside and outside of the bump electrode. Further, another kind of semiconductor device, Comparative Example (I-4) was manufactured without disposing therein an encapsulation resin at all. These semiconductor devices thus obtained, i.e. Comparative Example (I-3) and Comparative Example (I-4) were subjected to the same test as that performed for Example (I-3) described above. The results obtained are indicated by a curve $f_1$ and a curve $g_1$ in FIG. 20.

As shown in the curve $f_1$, when a single kind of resin was used for encapsulating both of the regions inside and outside the bump electrodes, the generation of a defective product was not recognized up to 2,000 hours, but when the heat cycle was increased to 2,300 hours, 100% of the samples were recognized as being defective. On the other hand, in the case of a sample which was not sealed with a resin (curve $g_1$), the generation of a defective product was recognized after only 500 hours, and when the heat cycle was increased to more than 1,000 hours, 100% of the samples were recognized as being defective.

As seen from these results, it is possible to retain a reliability of the semiconductor device according to this invention even if the semiconductor device is kept in a high temperature/high humidity condition.

In the above example, a different kind of resin was employed for encapsulating a region inside the outermost bump electrodes from that employed for encapsulating a region outside the outermost bump electrodes. However, this invention is not limited to such a structure, but the same kind of resin may be employed for both of these regions, provided that a maximum particle diameter and an average diameter of the filler to be mixed into a resin and the pitch of the bump electrodes to be formed on the semiconductor chip are suitably selected. For example, when a semiconductor chip having a size of 10 mm×10 mm is to be employed, bump electrodes having a diameter within a range of 10 $\mu$m to 50 $\mu$m are preferably formed at a pitch of 20 $\mu$m to 100 $\mu$m. On the other hand, when an encapsulation resin comprising bisphenol type epoxy, imidazole curing catalyst, an acid anhydride curing agent and a spherical quartz filler is to be employed, a filler having a maximum particle diameter of 70 $\mu$m to 60 $\mu$m, an average particle diameter of 5 $\mu$m to 45 $\mu$m should preferably be employed at a ratio of 5% by weight to 50% by weight.

After the semiconductor chip provided with bump electrodes at a predetermined pitch was mounted on the circuit board, an encapsulation resin containing a filler controlled it's maximum particle diameter and average particle diameter within above ranges was disposed and on a region around the periphery of the semiconductor chip. Namely, the physical property of the resin to be disposed is adjusted appropriately to the diameter of bump electrodes and to the pitch of between bump electrodes. As a result, only a filler that is small in maximum particle diameter and average particle diameter can be introduced into the space between the semiconductor chip and the circuit board, with the outer region outside the outermost bump electrodes being occupied by a filler that is large in maximum particle diameter and average particle diameter. At the same time, it is possible to control the filler content within the inner region at lower level than that of the outer region. Therefore, it is possible to make the resin disposed in a region inside the array of the outermost bump electrodes different in physical properties from the resin disposed outside the array of the outermost bump electrodes in a resultant structure disposed with the resins.

EXAMPLE II

In the preparation of a semiconductor device according to this Example, a first resin to be disposed in a region surrounded by outermost bump electrodes was mixed with a filler in a different manner from that in a second resin to be disposed in a region outside the outermost bump electrodes, i.e. at least one feature selected from the content, maximum particle diameter and average particle diameter of the filler mixed in the first resin is made larger as compared with the filler mixed in the second resin.

As for the semiconductor chip and the circuit board, the same structure and same materials as employed in the Example I may be employed.

As for the resin, fundamentally the same materials may be employed, but the relationship between the features, i.e. the content, maximum particle diameter and average particle diameter of a filler used in the first resin to be disposed in the inner region inside the outermost bump electrodes and the features of a filler used in the second resin to be disposed in the outer region outside the outermost bump electrodes is reversed from the Example I.

The content and particle diameter of the filler to be mixed in the first resin and the second resin may be determined in relative to each other as in the case of Example I. For example, the content of the filler in the first resin to be disposed in the inner region inside the outermost bump electrodes should preferably be in the range of 20% by weight to 60% by weight, more preferably 30% by weight to 45% by weight. On the other hand, the content of the filler in the second resin to be disposed in the outer region outside the outermost bump electrodes should preferably be in the range of 5% by weight to 45% by weight, more preferably 20% by weight to 40% by weight. The maximum particle diameter of the filler to be mixed in the first resin should preferably be 15 $\mu$m to 60 $\mu$m. The average particle diameter of the filler to be mixed in the first resin should preferably be 10 $\mu$m to 40 $\mu$m.

The maximum particle diameter of the filler to be mixed in the second resin should preferably be 7 $\mu$m to 45 $\mu$m. The average particle diameter of the filler to be mixed in the second resin should preferably be 5 $\mu$m to 25 $\mu$m.

These resins may be disposed in a space between the semiconductor chip and the circuit board, and on a region around the periphery of the semiconductor chip by way of the first, second or third method as explained in the above Example I.

This Example will be further explained with reference to the following specific example.

In accordance with the processes as described FIGS. 13A to 13D and FIGS. 14A to 14D, 256 pins of bumps, each formed of Pb/Sn (40/60) and having a diameter of 100 $\mu$m and a height of 80 $\mu$m, were formed on a semiconductor chip 10 mm×10 mm in size, which was then mounted through a flip-chip mounting on an SLC substrate, thereby obtaining the semiconductor device of Example (II-1).

In this Example (II-1), the elastic modulus $E_1$ of the resin (the first resin) to be disposed in a region surrounded by the bumps was selected to be 1200×10$^7$ Pa, and the elastic modulus $E_2$ of the resin (the second resin) to be disposed in a region not surrounded by the bumps was selected to be 900×10$^7$ Pa. Further, the coefficient of thermal expansion α for both of the first and second resins was selected to be 39×10$^{-6}$/°C. These physical properties were adjusted by mainly changing the content of a filler to be mixed therein and also by optionally changing the maximum particle diameter and average particle diameter of the filler, or by changing, if required, the molecular weight of the resin. Namely, the content of the filler mixed in the first resin was 45% by weight, the maximum particle diameter thereof was 35 $\mu$m and the average particle diameter thereof was 10 $\mu$m, while the content of the filler mixed in the second resin was 20% by weight, the maximum particle diameter thereof was 30 $\mu$m and the average particle diameter thereof was 5 $\mu$m.

Figure 21:
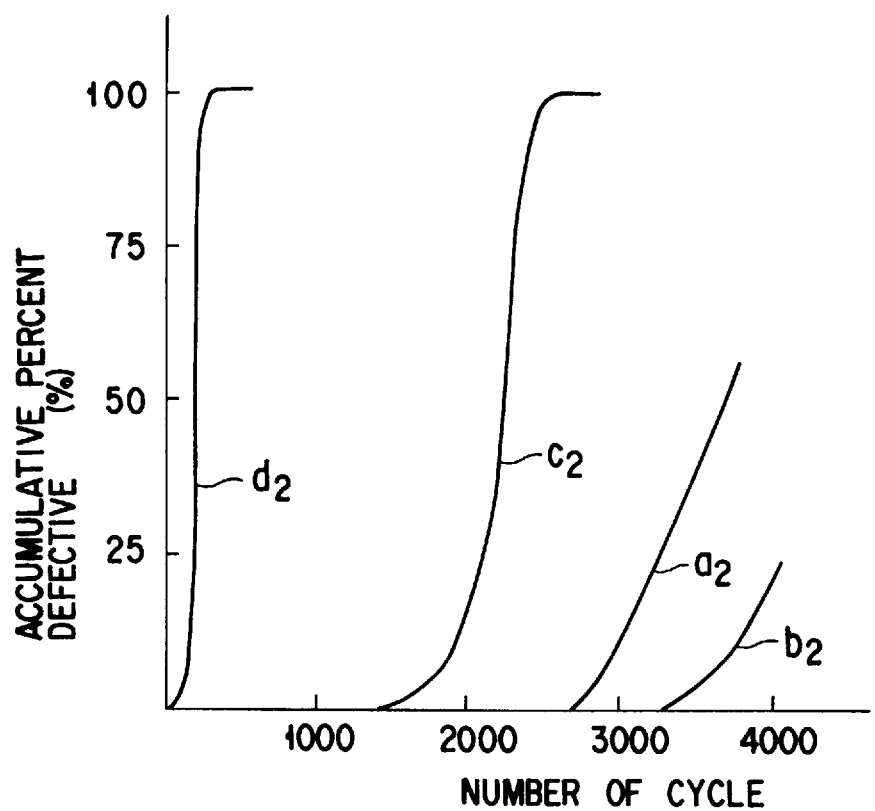
FIG. 21 is a graph showing the relationships between the number of cycle and an accumulative percent defective.

The semiconductor device thus obtained was subjected to a heat cycle test, in which a sample exhibiting even one failure of connection of the bump electrode out of 256 pins of the bump electrodes was assumed to be defective, and the relationship between the heat cycle and the accumulative percent defective was investigated. The results obtained are indicated by a curve $a_2$ in FIG. 21. The number of the sample employed was 1,000, and the heat cycle was conducted under a condition of −55° C. (30 minutes) to 25° C. (5 minutes) to 125° C. (30 minutes) to 25° C. (5 minutes).

As shown in the curve $a_2$, when the elastic modulus $E_2$ of the resin (the second resin) to be disposed in a region not surrounded by the bumps was made lower than the elastic modulus $E_1$ of the resin (the first resin) to be disposed in a region surrounded by the bumps, the generation of a defective product was not recognized up to 2,700 cycles.

Another kind of semiconductor device, Example (II-2) was manufactured in the same manner as described above except that two kinds of resins, each differing in coefficient of thermal expansion from each other, were employed. In this Example (II-2), the coefficient of thermal expansion $\alpha_1$ of the resin (the first resin) to be disposed in a region surrounded by the bumps was selected to be 20×10$^{-6}$/°C., and the coefficient of thermal expansion $\alpha_2$ of the resin (the second resin) to be disposed in a region not surrounded by the bumps was selected to be 39×10$^{-6}$/°C. Further, the elastic modulus for both of the first and second resins was selected to be 900×10$^7$ Pa. These physical properties were adjusted by changing the content of a filler to be mixed therein and also by changing, if required, the molecular weight of the resin. Namely, the content of the filler mixed in the first resin was 40% by weight, the maximum particle diameter thereof was 40 $\mu$m and the average particle diameter thereof was 15 $\mu$m, while the content of the filler mixed in the second resin was 25% by weight, the maximum particle diameter thereof was 20 $\mu$m and the average particle diameter thereof was 7 $\mu$m.

The semiconductor device thus obtained was subjected to a heat cycle test in the same manner as described above, and the relationship between the heat cycle and the accumulative percent defective was investigated. The results obtained are indicated by a curve $b_2$ in FIG. 21.

As shown in the curve $b_2$, when the coefficient of thermal expansion $\alpha_2$ of the resin (the second resin) to be disposed in a region not surrounded by the bumps was made higher than the coefficient of thermal expansion $\alpha_1$ of the resin (the first resin) to be disposed in a region surrounded by the bumps, the generation of a defective product was not recognized up to 3,300 cycles.

A different kind of semiconductor device, Comparative Example (II-1) was manufactured in the same manner as described above except that a resin having an elastic modulus of 900×10$^7$ Pa and a coefficient of thermal expansion of 39×10$^{-6}$/°C. was employed for disposing it as an encapsulation resin on the inside and outside of the bump electrode. Further, another different kind of semiconductor device, Comparative Example (II-2) was manufactured in the same manner as described above except that the resin was not disposed at all. These semiconductor devices thus obtained, i.e. Comparative Example (II-1) and Comparative Example (II-2) were subjected to a heat cycle test in the same manner as described above. The results obtained are indicated by a curve $c_2$ and a curve $d_2$ in FIG. 21.

As shown in the curve $c_2$, when a single kind of resin was used for encapsulating both of the regions inside and outside the bump electrodes, the generation of a defective product was not recognized up to 1,500 cycles, but when the heat cycle was increased to 2,500 cycles, 100% of the samples were recognized as being defective. On the other hand, in the case of a sample which was not encapsulated with a resin (curve $d_2$), the generation of a defective product was recognized after only 2 cycles, and when the heat cycle was increased to 10 cycles, 100% of the samples were recognized as being defective.

As seen from these results, when a resin to be disposed in a region surrounded by bump electrodes is made different in physical properties from a resin to be disposed in a region outside the bump electrodes, in particular when at least one feature selected from the content, maximum particle diameter and average particle diameter of the filler to be disposed in a region encircled by the outermost bump electrodes is made larger as compared with those of the filler to be disposed in a region not encircled by the outermost bump electrodes, the reliability life of the semiconductor device can be extremely improved.

EXAMPLE III

Figure 22:
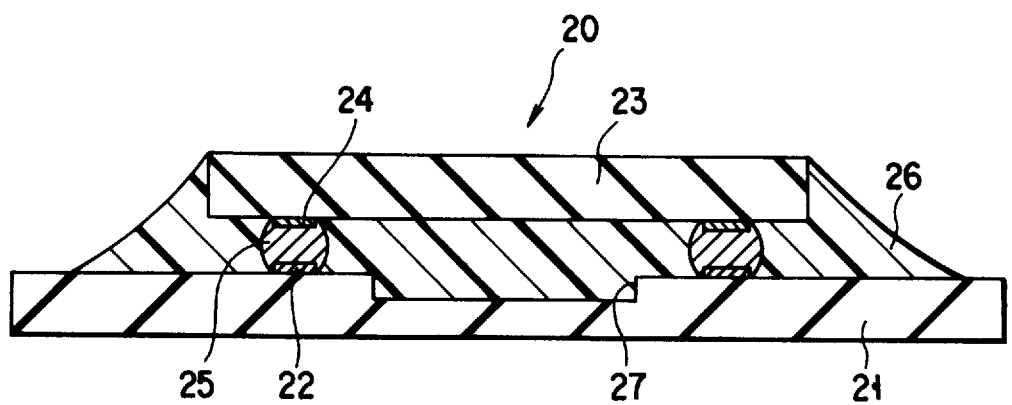
FIG. 22 is a cross-sectional view showing another example of a semiconductor device according to this invention.

FIG. 22 shows a cross-sectional view of a semiconductor device according to Example III.

As shown in FIG. 22, the semiconductor device according to Example III comprises a circuit board 21 provided with connecting electrodes 22, to which connecting electrodes 24 formed along the outer periphery of a silicon semiconductor chip 23 are connected through solder bumps 25. A resin 26 is disposed in a space between the semiconductor chip 23 and the circuit board 21, as well as on a region around the periphery of the semiconductor chip 23.

There is no limitation as to the material for the circuit board 21 to be employed in this Example. For example, an insulating board made of glass/epoxy resin, aramide/epoxy resin, BT resin, PPE or $Al_2O_3$ may be employed. A hollow portion 27 is formed on a portion of the surface of the circuit board 21, which corresponds to the central portion of the semiconductor chip 23. The expression of the central portion of the semiconductor chip 23 means a region encircled by connecting electrodes 24 formed along the periphery of the semiconductor chip 23, which is preferably located inward from the connecting electrodes 24 by a distance of 0.3 mm to 2.0 mm.

The depth (or the height of a step) of the hollow portion 27 formed on the surface of the circuit board 21 may be suitably selected depending on the size of the semiconductor chip 23 or on the height of the solder bump 25. However, in general, the depth of the hollow portion 27 should preferably be in the range of 10 $\mu$m to 100 $\mu$m.

The hollow portion 27 on the surface of the circuit board 21 may be formed for example by grinding the surface of the circuit board 21. When a glass/epoxy resin board is to be formed by laminating a plurality of glass/epoxy resin sheets, a predetermined portion of the uppermost layer of the board may be stamped with a press before the glass/epoxy resin sheets are laminated. Alternatively, a solder resist may be coated in a prescribed thickness on the surface of the circuit board 21 excluding a portion on which a semiconductor chip is superimposed, thus forming a hollow portion on the central surface portion of the circuit board 21.

The connecting electrodes 24 may be formed by alternatively laminating a titanium layer and a copper layer, or by alternatively laminating a titanium layer, a copper layer and a gold layer or a palladium. The connecting electrodes 22 may be formed with copper, or by alternatively laminating a copper layer, a nickel layer and a gold layer. As for the solder bump 25, an alloy comprising Sn and Pb at ratio of 6 to 4, and formed into a shape having a height of 40 to 80 $\mu$m may be employed.

With respect to the resin 26 to be disposed in the space, a thermosetting resin containing a filler mixed therein and having a viscosity of 50 poise or less at room temperature may be preferably employed. As for the filler, spherical quartz, silica, pulverized silica or fused silica may be employed. The maximum particle diameter of the filler should preferably be one which corresponds to not more than a half of the distance between the semiconductor chip 23 and the circuit board 21 as measured at the hollow portion 27. The content of the filler in a resin should preferably be in the range of 20% by weight to 70% by weight.

The volume of resin to be disposed should preferably be equal to or twice the volume of a space defined by the main inner surfaces of the semiconductor chip 23 and the circuit board 21 and the inner side surfaces of the bump electrodes.

The semiconductor device of this Example may be manufactured by the following steps. FIGS. 23A to 23D show cross-sectional view illustrating the manufacturing steps.

First, as shown in FIG. 23A, the semiconductor chip 23 is connected with the solder bump 25 to the circuit board 21.

Then, as shown in FIG. 23B, the encapsulation resin 26 is coated on one of the four side surfaces of the semiconductor chip 23 with a liquid delivery apparatus 30 having a function of controlling the amount of delivery.

Subsequently, the circuit board was heated to 40° C. to 60° C. to lower the viscosity of the resin so as to allow the resin 26 to flow into a space between the semiconductor chip 23 and the circuit board 21 by way of capillarity as shown in FIG. 23C.

Finally, the resultant semiconductor device is heated in an oven to cure the resin as shown in FIG. 23D. The heating in this case may be performed at a temperature of 100° C. for one hour, and then at a temperature of 120° C. for 3 hours in the air atmosphere, a nitrogen atmosphere containing 2% or less of oxygen, or a reduced atmosphere of 1 Pa or less.

As a result of these steps, the semiconductor device of Example III as shown in FIG. 23D can be obtained.

This Example will be further explained with reference to the following specific example.

A semiconductor chip (10.2 mm×10.4 mm) was connected with solder bumps to the connecting electrodes of a glass/epoxy resin circuit board (50 mm×35 mm) provided on its surface with a hollow portion (8 mm×8 mm) having a depth of 50 $\mu$m±10 $\mu$m. The height of the bumps after this connection was 70 $\mu$m.

A resin was disposed within the space between the semiconductor chip and the circuit board by employing the method as explained above. The resin employed was formed of a composition comprising bisphenol type epoxy resin, imidazole curing catalyst, an acid anhydride curing agent and about 40% by weight of a spherical quartz filler (an average particle diameter: 7 $\mu$m, and a maximum particle diameter: 20 $\mu$m). The viscosity of the resin was 40 poise at room temperature, and the volume of the resin was three times as much as that of the space.

At this occasion, the relationship between the inflow distance of the resin and the flow velocity of the resin was measured, the results being indicated by a curve $a_3$ in FIG. 24A. By the way, the inflow distance of the resin was measured as shown in FIG. 24B.

As a comparative example, the resin as mentioned above was introduced into a semiconductor device having a conventional structure as shown in FIGS. 25A and 25B, and the relationship between the inflow distance of the resin and the flow velocity of the resin was measured. In the structure shown in FIG. 25A, the surface of the circuit board 31 was flat, and in the structure shown in FIG. 25B, the surface of the circuit board 31 was flat and at the same time the periphery of the bump 25 was covered by an epoxy coating 38.

The results of the relationships obtained in the injection of the resin into the semiconductor device shown in FIGS. 25A and 25B are indicated respectively by curves $b_3$ and $c_3$ in FIG. 24A.

As shown in FIG. 24A, with an advance of inflow of the resin, the flow velocity of the resin becomes lower. However, in the case of this invention (a curve $a_3$), the reduction degree of the flow velocity is very small so that a sufficient flow velocity can be maintained, i.e. the filling of the resin can be easily carried out.

By contrast, when the filling of resin is to be carried out in the structure as shown in FIG. 25A, the flow velocity of the resin at the space becomes too small as shown in the curve $b_3$ to carry out the filling of the resin. If a resin of low viscosity is employed in order to facilitate the filling of the resin in this structure, air bubble may be possibly introduced into the resin because of a high flow velocity of the resin at the periphery of the semiconductor chip.

On the other hand, when the filling of resin is to be carried out in the structure as shown in FIG. 25B, the flow velocity of the resin at the periphery of the semiconductor chip will be extremely decreased because of the narrow space at the periphery of the semiconductor chip where bumps are formed. Therefore, it will be seen that the filling of the resin becomes impossible.

Then, the filling of the resin was tried by changing the size of the semiconductor chip, and the possibility of filling the resin and entrapment of air bubble in the resin during the filling step were investigated.

In order to facilitate the observation of the filling of the resin, a glass chip was employed. In this case, three kinds of glass chips, each differing in size, i.e. 5.14 mm×4.8 mm; 10.2 mm×10.4 mm and 12.52 mm×11.96 mm were employed. The size of the hollow portion on the surface of the circuit board was varied in conformity with the difference in size of the glass chips, i.e. 3.2 mm×3.0 mm; 8.0 mm×8.0 mm and 11.6 mm×11.0 mm. The depth of the hollow portion was set to 50 $\mu$m±10 $\mu$m in any of the circuit boards.

As a comparative example, the same resin as employed above was used to fill the space in the structure shown in FIG. 25A, and the possibility of filling the resin and entrapment of air bubble in the resin during the filling step were investigated.

The results obtained are shown in Table 2 and Table 3.

TABLE 2

| | The number of chip indicating defective filling | | |
|---|---|---|---|
| | Structure of this invention | Conventional structure | |
| Temperature of board | 40° C. | 40° C. | 80° C. |
| Size of chip | | | |
| 5.14 × 4.8 mm | 0/10 | 0/10 | 0/10 |
| 10.2 × 10.4 mm | 0/10 | 8/10 | 0/10 |
| 12.52 × 11.96 mm | 0/10 | 10/10 | 0/10 |

TABLE 3

| | Ratio of entrapment of air | | |
|---|---|---|---|
| | Structure of this invention | Conventional structure | |
| Temperature of board | 40° C. | 40° C. | 80°C. |
| Size of chip | | | |
| 5.14 × 4.8 mm | 0 | 0 | 7 |
| 10.2 × 10.4 mm | 0 | 0 | 5 |
| 12.52 × 11.96 mm | 0 | 0 | 10 |

* The number of sample: 10 pieces

As shown in Table 2 and Table 3, when the temperature of the circuit board was set to 40° C. in the semiconductor device of this invention, it was possible to perform the filling of the resin even if the size of the semiconductor chip becomes large, and to avoid the entrapment of air bubble.

On the other hand, in the comparative examples representing the conventional structure, the filling of the resin was impossible even if the circuit board was heated to 40° C. Therefore, the filling of the resin at a temperature of 80° C thus lowering the viscosity of the resin was also tried. As a result, it was found that when the temperature of the circuit board was set to 40° C., the filling of the resin into a semiconductor chip having a size of 10.2 mm×10.4 mm might become impossible in some cases, and the filling of the resin into a semiconductor chip having a size of 12.52 mm×11.96 mm was completely impossible. On the other hand, when the temperature of the circuit board was set to 80° C., the entrapment of air bubble was recognized even in a small chip of 5.14 mm×4.8 mm.

As explained above, a hollow portion is formed on a portion of the surface of the wiring circuit board, which corresponds to the central portion of the semiconductor chip according to Example III. Therefore, it is possible to increase the flow velocity of resin at the central portion of the semiconductor chip, thus making it possible to facilitate the filling of the resin into the space between the chip and the circuit board. While, at the peripheral portion of the semiconductor chip, the flow velocity of the resin does not increase. Namely, the flow velocity of the resin is made different between the peripheral portion of the semiconductor chip and the central portion of the semiconductor chip, so that the entrapment of air bubble into the resin can be effectively prevented. Since the improvement of flowability of resin during the filling of the resin is achieved by the provision of a hollow portion on the surface of the circuit board according to Example III, the structure of this Example III is especially suited for the resin-sealing of a semiconductor chip of large size.

EXAMPLE IV

Figure 26:
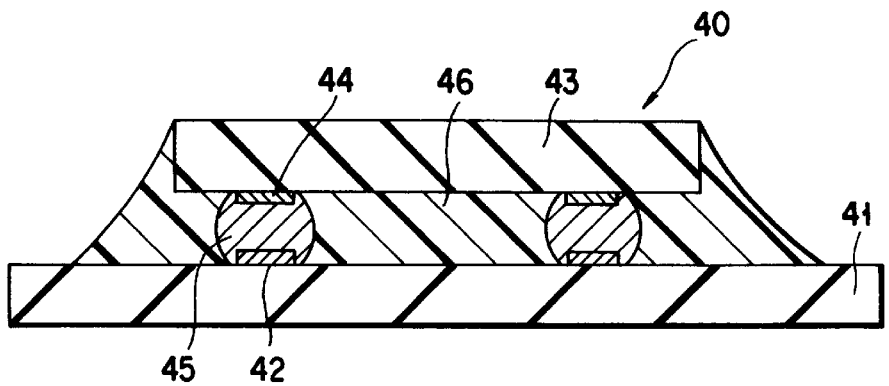
FIG. 26 is a cross-sectional view of a semiconductor device according to Example IV of this invention.

FIG. 26 shows a cross-sectional view of a semiconductor device according to Example IV.

As shown in FIG. 26, the semiconductor device 40 according to Example IV comprises a circuit board 41 provided with connecting electrodes 42, to which connecting electrodes 44 formed on a silicon semiconductor chip 43 are connected through solder bumps 45. A resin 46 is disposed in a space between the semiconductor chip 43 and the circuit board 41, as well as on a region around the periphery of the semiconductor chip 43.

There is no limitation as to the material for the circuit board 41 to be employed in this Example. For example, an insulating board made of glass/epoxy resin, aramide/epoxy resin, BT resin, PPE, $Al_2O_3$, aluminum nitride or glass may be employed.

The connecting electrodes 42 may be formed by alternatively laminating a copper layer, a nickel layer and a gold layer. The connecting electrodes 44 may be formed by alternatively laminating a titanium layer and a nickel layer, or by alternatively laminating a titanium layer, a nickel layer and a gold layer or a palladium layer. As for the solder bump 25, an alloy comprising Sn and Pb at ratio of 6 to 4, and formed into a shape having a height of 50 to 80 μm may be employed.

With respect to the resin 46 to be disposed in the space in this example, a thermosetting resin of the same composition as used in Example III and having a viscosity of 50 poise or less at room temperature may be preferably employed. As for the filler, the same material as employed in Example III such as spherical quartz may be employed. However, the maximum particle diameter of the filler in this example should preferably be one which corresponds to not more than a half of the distance between the semiconductor chip 43 and the circuit board 41. The content of the filler in a resin should preferably be in the range of 20% by weight to 70% by weight.

The volume of resin to be disposed should preferably be equal to or thrice the volume of a space defined by the main inner surfaces of the semiconductor chip 43 and the circuit board 41 and the inner side surfaces of the bump electrodes.

The semiconductor device of this Example may be manufactured by the following steps. FIGS. 27A to 27D show cross-sectional view illustrating the manufacturing steps.

First, as shown in FIG. 27A, the semiconductor chip 43 is connected via the solder bump 45 to the circuit board 41.

Then, as shown in FIG. 27B, the encapsulation resin 46 is coated on one of the four side surfaces of the semiconductor chip 43 with a liquid delivery apparatus 50 having a function of controlling the amount of delivery.

Subsequently, the circuit board was heated to 40° C. to 60° C. to lower the viscosity of the resin so as to allow the resin 46 to flow into a space between the semiconductor chip 43 and the circuit board 41 by way of capillarity as shown in FIG. 27C.

Finally, the resultant semiconductor device is heated in an oven to cure the resin as shown in FIG. 27D. The heating in this case may be performed at a temperature of 100° C. for one hour, and then at a temperature of 120° C. for 3 hours in the air atmosphere, a nitrogen atmosphere containing 2% or less of oxygen, or a reduced atmosphere of 1 Pa or less.

As a result of these steps, the semiconductor device of Example IV can be obtained.

This Example will be further explained with reference to the following specific example.

A semiconductor chip (10.2 mm×10.4 mm) was connected with solder bumps to the connecting electrodes of a glass/epoxy resin circuit board (50 mm×35 mm). The height of the bumps after this connection was 70 μm. The volume of the space defined by the circuit board, the semiconductor chip and the bump electrodes was 7.4 mm³.

A resin was disposed within the space between the semiconductor chip and the circuit board by employing the method as explained above. The resin employed in this example was formed of a composition comprising bisphenol type epoxy resin, imidazole curing catalyst, an acid anhydride curing agent and about 40% by weight of a spherical quartz filler (an average particle diameter: 5 μm, and a maximum particle diameter: 12 μm). The viscosity of the resin was 30 poise at room temperature, and the volume of the resin was one and a half times as much as that of the space.

Figure 28:
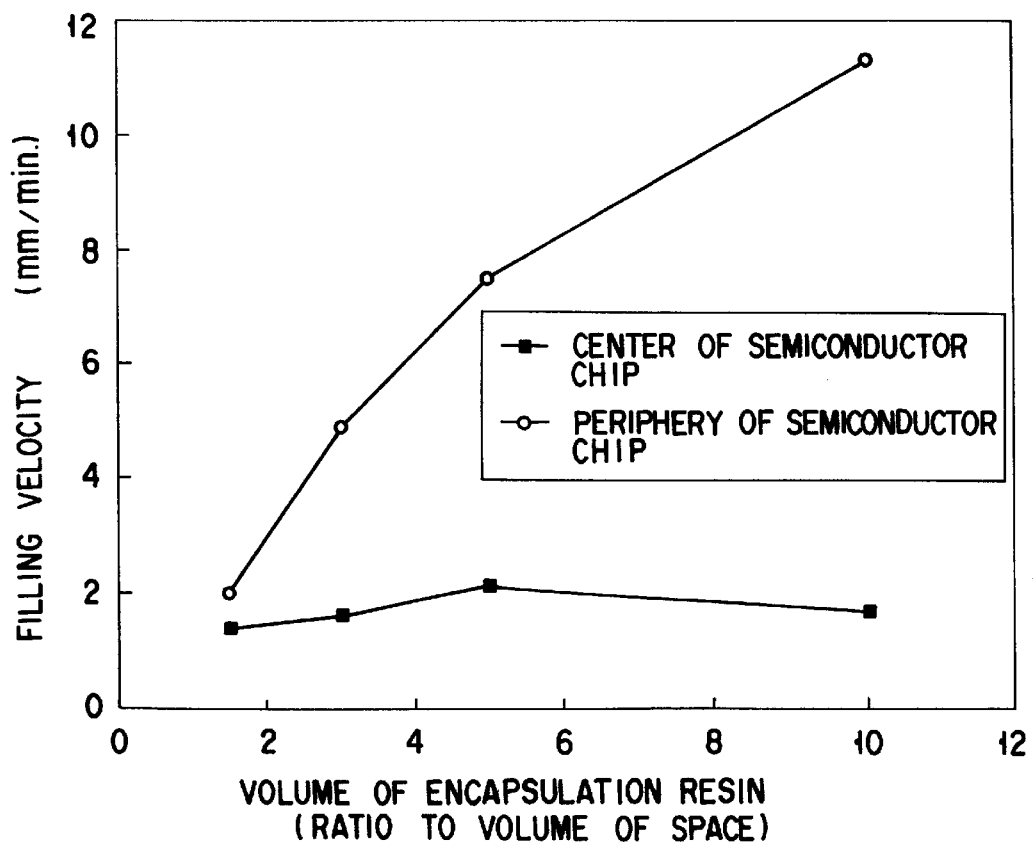
FIG. 28 is a graph showing the relationships between the volume of a coated resin and the velocity of a resin flow.

At this occasion, the relationship between the inflow distance of the resin and the flow velocity of the resin was measured while changing the volume of the resin to be disposed, the results being shown in FIG. 28. By the way, the flow velocity of the resin measured was an average of the values as measured at a distance of 5 mm starting from the side of the semiconductor chip coated with an encapsulation resin.

As shown in FIG. 28, the flow velocity of the resin at the periphery of the semiconductor chip was greatly increased as the coating volume of the resin was increased. On the other hand, the flow velocity of the resin at the center of the semiconductor chip was almost constant irrespective of the increase in coating volume of the resin. Therefore, the smaller the coating volume of the resin is, the smaller the difference in flow velocity between the periphery of the semiconductor chip and the center of the chip.

Then, several samples were prepared by a process as illustrated in FIGS. 27A to 27D while changing the coating volume of the resin, and the number of void entrapped in the resin was investigated. The circuit board, semiconductor chip and resin employed in this case were the same as described above. The results obtained are shown in Table 4.

TABLE 4

| Ratio in volume of sealing resin to the space | Ratio of air-entrapment |
| --- | --- |
| 1.5 | 0/20 |
| 3.0 | 0/20 |
| 5.0 | 6/20 |
| 10.0 | 11/20 |

As shown in Table 4, when the volume of the encapsulation resin becomes not less than five times as much as the volume of the space between the semiconductor chip and the circuit board, the entrapment of air was recognized. Therefore, if the volume of the encapsulation resin is limited to not more than three times as much as the volume of the space, the generation of void can be prevented.

EXAMPLE V

FIG. 29 shows a cross-sectional view of a semiconductor device according to Example V, and FIG. 30 shows a plan view thereof.

As shown in FIG. 29, the semiconductor device 110 according to Example V comprises a circuit board 102 provided with connecting terminal 104, on which a silicon semiconductor chip 101 is mounted through bump electrodes 103 and Al bonding pads 106. A resin 105 is disposed in a space between the semiconductor chip 101 and the circuit board 102. The end surface of the resin is in the same plane with the end surface of the semiconductor chip. Namely, the surface of the resin is disposed at the same level as the surface of the semiconductor chip.

The semiconductor device according to Example V may be manufactured by the following steps.

FIGS. 31A to 31G illustrate a first example of the manufacturing method of this semiconductor device.

Figure 31A:
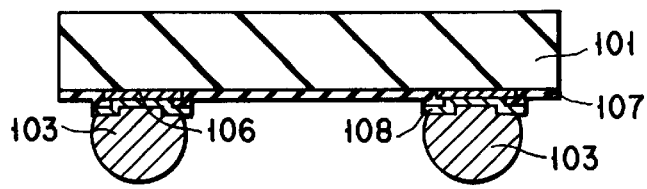
Figure 31B:
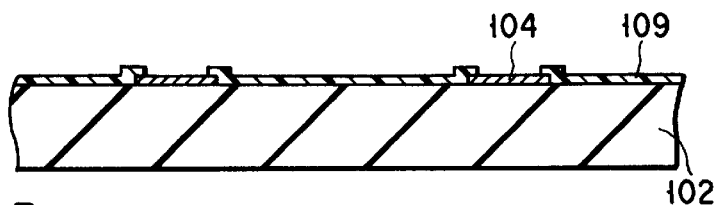

First, a semiconductor chip as shown in FIG. 31A and a wiring circuit board 102 as shown in FIG. 31B are prepared.

As shown in FIG. 31A, an Al bonding pad 106 and a passivation film 107 are formed on the surface of the semiconductor chip 101, and bump electrodes 103 are formed via a barrier metal 108 on the surface of the Al bonding pad 106.

Bump electrodes 103 formed on the surface of the semiconductor chip 101 can be formed by way of a vapor deposition or an electroplating. The material useful for the bump electrode may be a solder in general, but may be other kind of metal having a higher rigidity as compared with the solder such for example as Au and Cu.

The size of the semiconductor chip, the number of the bump electrode and the pitch of bump electrodes may be arbitrarily selected. The layout of the bump electrodes may be realized.

In this invention, a semiconductor chip 10 mm×10 mm in size and provided with a Cu/Ti barrier metal 108 may be used. The bump 103 having for example a diameter of 100 $\mu$m and a height of 75 $\mu$m±5 $\mu$m and formed of a Pb/Sn (40/60) alloy may be employed. Thus, for example, 256 pins of such a bump are arrayed along the periphery of the semiconductor chip.

There is no restriction as to the material and structure of the wiring circuit board 102. For example, a laminated glass/epoxy substrate may be employed. In the following explanation, a printed SLC (Surface Laminar Circuit) board comprising a glass/epoxy substrate on which an insulating layer and a conductive layer are build-up is exemplified as the substrate.

Namely, as shown in FIG. 31B, an opening 110 $\mu$m in diameter is formed in a connecting terminal area 104 of the wiring circuit board 102 to conform with the location of the bump electrode of the semiconductor chip, thereby exposing Cu as a terminal material. All of the area other than the connecting terminal area 104 was covered with a solder resist 109.

Figure 31C:
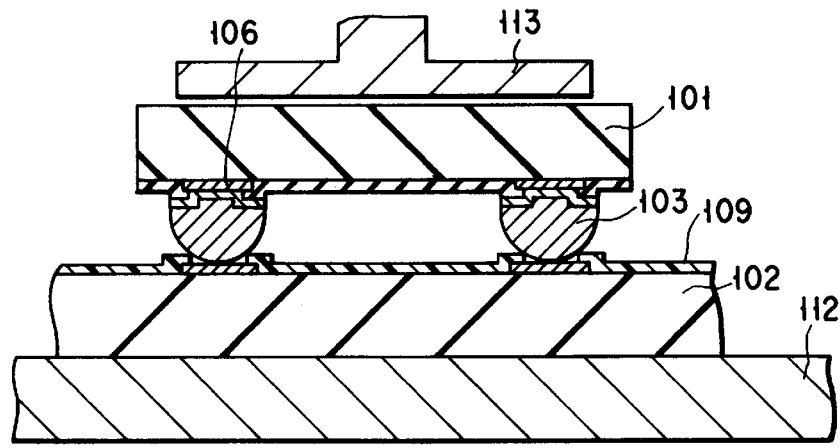

Then, as shown in FIG. 31C, the semiconductor chip 101 is aligned by making use of a flip-chip bonder on the wiring circuit board 102 prepared as described above, thereby electrically and mechanically contacting the bump electrodes 103 with the connecting terminal 104 of the wiring circuit board 102. At this moment, the wiring circuit board 102 is held on a stage 112 provided with a heating means and preliminarily heated in an atmosphere of nitrogen at a temperature of 200° C. which is higher than the melting point of Pb/Sn (40/60).

While keeping the semiconductor chip 101 contacted is with the wiring circuit board 102, a collet 113 sustaining the semiconductor chip is heated in a nitrogen atmosphere at the same temperature of 200° C. as in the case of the stage 112. As a result of this heating, the solder is molten to achieve an electrical and mechanical temporary connection between the semiconductor chip 101 and the wiring circuit board 102. Finally, the wiring circuit board 102 mounting the semiconductor chip 101 thereon is passed through a reflow furnace which is heated to 250° C. and in which nitrogen is filled so as to electrically and mechanically connect the semiconductor chip 101 with the wiring circuit board 102.

During this heating step, a self-alignment effect was developed by the surface tension of the solder so that the dislocation more or less of the semiconductor chip 101 brought about during the mounting step can be corrected, thus realizing an accurately aligned bonding of semiconductor chip 101.

Figure 31D:
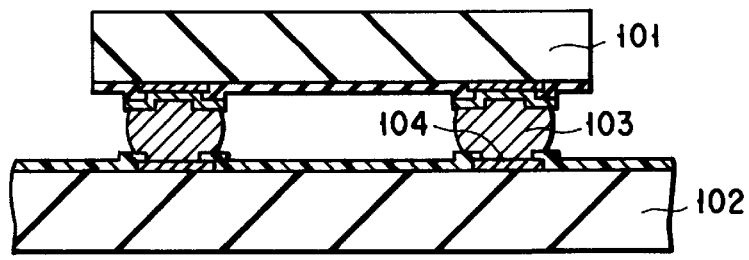
Figure 38A:
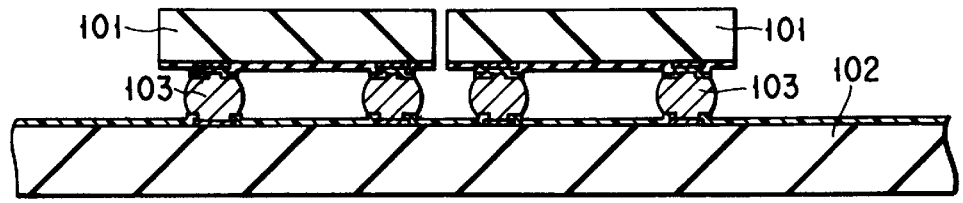
FIGS. 38A to 38D are cross-sectional views illustrating another example of manufacturing process of a semiconductor device according to Example V of this invention.
Figure 38B:
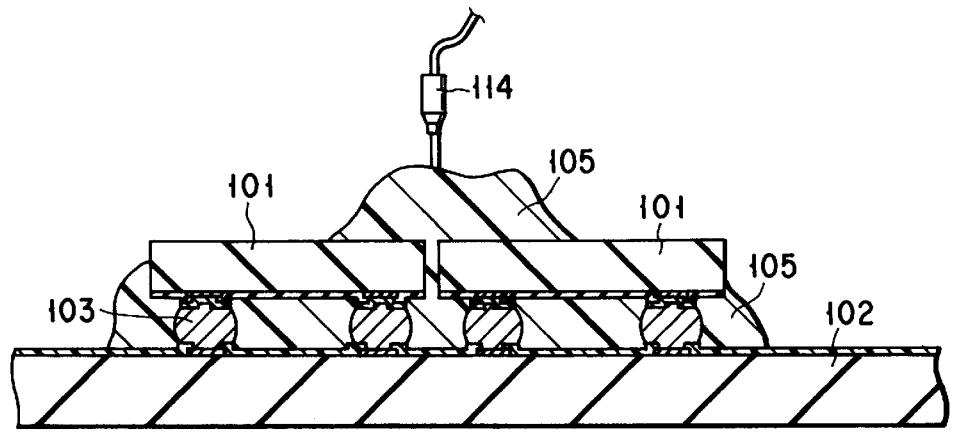
Figure 38C:
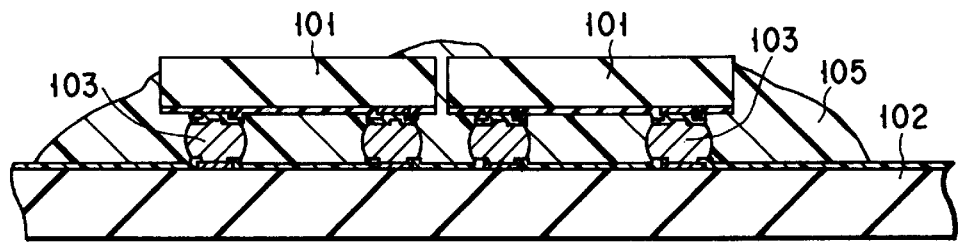
Figure 38D:
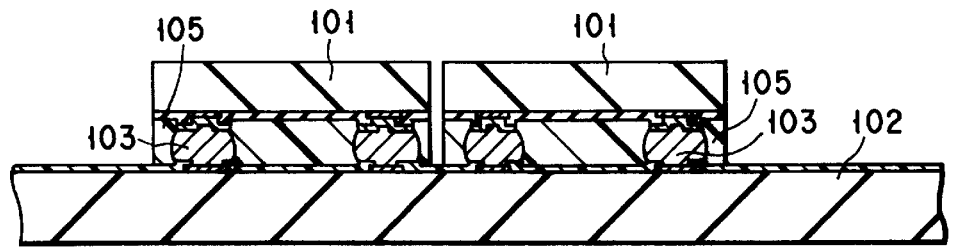

Through these steps, the semiconductor chip 101 can be mounted with bumps 103 on the wiring circuit board 102 as shown in FIG. 31D.

Then as shown in FIG. 31E, a potting of for example 10 ml of an encapsulation resin into a space formed between the semiconductor chip 101 and the wiring circuit board 102 is performed by using a dispenser 114.

The resin to be disposed in the space formed between the semiconductor chip and the wiring circuit board may be a photodegradable thermosetting resin. This thermosetting resin is formed of a compound having a side chain which exhibits, upon being irradiated, a different solubility to a solvent. For example, bisphenol type epoxy resin may be used as such a resin. Novolak resin such as AZ4903 (Hoechst Japan) and a positive type resin may also be employed. When bisphenol type epoxy resin is to be employed, an imidazole curing catalyst, an acid anhydride curing agent and an inorganic filler should preferably be mixed therein.

The physical properties of the thermosetting resin should preferably be such that the viscosity thereof before curing is in the range of 10 cp to 30,000 cp, the glass transition point thereof after curing is not less than 120° C., the modulus of flexural elasticity thereof is 200 kg/cm$^2$, and coefficient of thermal expansion is not higher than 500 ppm. When novolak resin or polyimide resin is to be used, the molecular weight thereof should preferably be about 10,000 in order to obtain a satisfactory mechanical property.

The encapsulation resin useful in this invention should preferably be thermosetting resins of non-solvent type. However, it is also possible to employ a thermosetting resin containing a solvent, provided that the content of the solvent remaining in the resin after the semi-curing or complete curing of the resin is lower than that before the curing so that the flowability of the resin would be lost after the curing.

Examples of inorganic filler to be mixed into the resin are silica, quartz and fused silica. The particle diameter of the inorganic filler should preferably be not more than the minimum distance "G" between the semiconductor chip and the wiring circuit board. For example, a filler having a maximum particle diameter ranging from 20 $\mu$m to 60 $\mu$m, and an average particle diameter ranging from 7 $\mu$m to 50 $\mu$m may be mixed in the resin at the ratio of 30% by weight to 75% by weight.

Then, the semiconductor device thus fabricated is housed in a clean oven at a temperature of 80° C. for one hour to cure the resin disposed therein, thus obtaining a structure as shown in FIG. 31F.

Further, the semiconductor device mounted through the flip-chip mounting as explained above is irradiated with ultra-violet rays having a maximum intensity at wavelength ranging for example from 365 to 405 nm. In this irradiation, the mounted semiconductor chip per se functions as a mask, so that the use of the conventional glass mask provided with a chromium pattern is not required. Moreover, this method makes it possible to accurately align the encapsulation resin with the semiconductor chip. Namely, an inner region surrounded by the exposure boundary line 115 would not be irradiated by the ultraviolet rays.

After the irradiation, the wiring circuit board is immersed in a developing solution capable of selectively dissolving the irradiated portion thereby to remove a portion of the resin that is disposed around the semiconductor chip. Examples of the developing solution useful in this case are a mixed organic solvent such as xylene/butyl acetate/ethyl cellosolve acetate. On the other hand, if novolak resin or polyimide resin is to be used, the employment of an aqueous solution of potassium borate or a mixed solvent such as N-methyl pyrolidone/methanol is preferable.

After the development, the semiconductor device is kept in a clean oven at a temperature of 120° C. for four hours to cure the encapsulation resin disposed therein, thus obtaining a desired physical property.

Through these processes, the semiconductor device of Example V can be obtained.

The method of disposing the photo-degradable thermosetting resin is not limited to that described above, but may be performed by a method explained below.

FIGS. 32A to 32C illustrate a second example of the manufacturing method of this semiconductor device according to Example V.

The semiconductor chip and the wiring circuit board employed herein are the same in construction as shown in FIGS. 31A and 31B, and a resin of the same composition as used in the first example mentioned above is also employed in the same amount.

As shown in FIG. 32A, a photo-degradable thermosetting resin 105 is potted in advance in a region of the wiring circuit board 102, which will be encircled by the bump electrodes 103.

Then, as shown in FIG. 32B, the semiconductor chip 101 is aligned by making use of a flip-chip bonder on the wiring circuit board 102 prepared as described above, thereby electrically and mechanically contacting the bump electrodes 103 with the connecting terminal 104 of the wiring circuit board 102. At this moment, the wiring circuit board 102 is held on a stage 112 provided with a heating means and heated in the same manner as mentioned above.

The photo-degradable thermosetting resin 105 potted in advance is heated by the collet disposed for heating the semiconductor chip or the wiring circuit board, thereby causing the resin 105 to become low in viscosity. With this treatment, the molten resin is allowed to flow through the space between the bump electrodes into a region around the periphery of the semiconductor chip, thus disposing the resin in the region not surrounded by the bump electrodes 103 as shown in FIG. 32C.

The resin thus disposed is then semi-cured in a clean oven or by being held on the collet for a long period of time.

Finally, the semiconductor device thus fabricated is irradiated by ultra-violet rays in the same manner as shown in FIG. 31G, and the resin remaining on the periphery of the semiconductor chip is dissolved and removed thereby obtaining a semiconductor device of the Example V.

Meanwhile, the photo-degradable thermosetting resin 105 may be potted in advance in the region of the semiconductor chip 101 which is surrounded by the bump electrodes 103 as shown in FIG. 33A.

Then, as shown in FIG. 33B, the semiconductor chip 101 carrying thereon the photo-degradable thermosetting resin 105 is aligned by making use of a flip-chip bonder on the wiring circuit board 102 prepared as described above, thereby electrically and mechanically contacting the bump electrodes 103 with the connecting terminal 104 of the wiring circuit board 102. At this moment, the wiring circuit board 102 is held on a stage 112 provided with a heating means and heated in the same manner as mentioned above.

The photo-degradable thermosetting resin 105 potted in advance is heated by the collet disposed for heating the semiconductor chip or the wiring circuit board, thereby causing the resin 105 to become low in viscosity. With this treatment, the molten resin is allowed to flow through the space between the bump electrodes into a region around the periphery of the semiconductor chip, thus disposing the resin in the region not surrounded by the bump electrodes 103 as shown in FIG. 33C.

The resin thus disposed is then semi-cured in a clean oven or by being held on the collet for a long period of time.

Finally, the semiconductor device thus fabricated is irradiated by ultra-violet rays in the same manner as shown in FIG. 31G, and the resin remaining on the periphery of the semiconductor chip is dissolved and removed thereby obtaining a semiconductor device of the Example V.

FIGS. 34A to 34C illustrate a third example of the manufacturing method of this semiconductor device according to Example V.

The semiconductor chip and the wiring circuit board employed herein are the same in construction as shown in FIGS. 31A and 31B, and a resin of the same composition as used in the first example mentioned above is also employed in the same amount.

As shown in FIG. 34A, a photo-degradable thermosetting resin 105 is potted in advance in a region of the wiring circuit board 102, which is encircled by the bump electrodes 103.

Then, as shown in FIG. 34B, the semiconductor chip 101 is aligned by making use of a flip-chip bonder on the wiring circuit board 102 prepared as described above, thereby electrically and mechanically contacting the bump electrodes 103 with the connecting terminal 104 of the wiring circuit board 102.

The photo-degradable thermosetting resin 105 potted in advance is disposed in the space between the semiconductor chip 101 and the wiring circuit board 102, and on a region around the periphery of the semiconductor chip 101 as shown in FIG. 34C. The resin thus disposed is then semi-cured in a clean oven or by being held on the collet for a long period of time.

Finally, the semiconductor device thus fabricated is irradiated by ultra-violet rays in the same manner as shown in FIG. 31G, and the resin remaining on the periphery of the semiconductor chip is dissolved and removed thereby obtaining a semiconductor device of the Example V.

Meanwhile, the photo-degradable thermosetting resin 105 may be potted in advance in a region of the semiconductor chip 101, which is surrounded by the bump electrodes 103, or in a region of the semiconductor chip 101, which is not surrounded by the bump electrodes 103 as shown in FIG. 35A.

In this case, as shown in FIG. 35B, the semiconductor chip 101 carrying thereon the photo-degradable thermosetting resin 105 is aligned by making use of a flip-chip bonder on the wiring circuit board 102, thereby electrically and mechanically contacting the bump electrodes 103 with the connecting terminal 104 of the wiring circuit board 102.

Then, the same processes are performed to obtain a semiconductor device of the Example V.

This Example will be further explained with reference to the following specific example.

In accordance with the first example as described above, 256 pins of bumps, each formed of Pb/Sn (40/60) and having a diameter of 100 $\mu$m and a height of 75 $\mu$m, were formed on a semiconductor chip 10 mm×10 mm in size, which was then mounted through a flip-chip mounting on an SLC substrate, thereby obtaining the semiconductor device of Example (V-1).

In this Example (V-1), a resin formed of a composition comprising 55% by weight of bisphenol type epoxy resin, 3% by weight of imidazole curing catalyst, 2% by weight of an acid anhydride curing agent and 40% by weight of a spherical quartz filler (an average particle diameter: 10 $\mu$m, and a maximum particle diameter: 35 μm) was employed. The viscosity of the resin was 1,000 poise at room temperature.

The distance "G" between the semiconductor chip and the wiring circuit board after the mounting was 50 μm, which was 25 μm lower than the height of the bump electrode before the mounting.

The semiconductor device thus obtained was subjected to a heat cycle test, in which a sample exhibiting even one failure of connection of the bump electrode out of 256 pins of the bump electrodes was assumed to be defective, and the relationship between the heat cycle and the accumulative percent defective was investigated. The results obtained are indicated by a curve $a_5$ in FIG. 36. The number of the sample employed was 1,000, and the heat cycle was conducted under a condition of −55° C. (30 minutes) to 25° C. (5 minutes) to 125° C. (30 minutes) to 25° C. (5 minutes).

As shown in the curve $a_5$, when the resin having the filler mixed therein was disposed in such a manner that the distance between the edge of the semiconductor chip and the edge of the resin was made zero, the generation of a defective product was not recognized up to 3,500 cycles.

A semiconductor device of Example (V-2) was manufactured in the same manner as described above except that a resin containing no filler was employed. This Example (V-2) was also subjected to a heat cycle test in the same manner as explained above to investigate the relationship between the heat cycle and the accumulative percent defective. The results obtained are indicated by a curve $b_5$ in FIG. 36.

As shown in the curve $b_5$, when the resin containing no filler therein was disposed in such a manner that the distance between the edge of the semiconductor chip and the edge of the resin was made zero, the generation of a defective product was not recognized up to 2,500 cycles, though the reliability of the semiconductor device was somewhat lowered.

A semiconductor device of Comparative Example (V-1) was manufactured by using bisphenol type epoxy resin in accordance with the conventional method. Further, a semiconductor device of Comparative Example (V-2) was manufactured in the same manner as described above except that the resin was not disposed at all. These semiconductor devices thus obtained, i.e. Comparative Example (V-1) and Comparative Example (V-2) were subjected to a heat cycle test in the same manner as described above. The results obtained are indicated by a curve $c_5$ and a curve $d_5$ in FIG. 36.

In the semiconductor device of Comparative Example (V-1), the distance between the edge of the semiconductor chip and the edge of the resin was 5 mm.

As shown in the curve $c_5$, when the size of the resin was larger than the size of the semiconductor chip, the generation of a defective product was not recognized up to 1,000 cycles, but when the heat cycle was increased to 3,000 cycles, 100% of the samples were recognized as being defective. On the other hand, in the case of a sample which was not encapsulated with a resin (curve $d_5$), the generation of a defective product was recognized after only 2 cycles, and when the heat cycle was increased to 10 cycles, 100% of the samples were recognized as being defective.

As in the case of Examples I and II, two kinds of resins, each differing in the content of a filler, were separately disposed in a region surrounded by bump electrodes and a region outside the bump electrodes to manufacture a semiconductor device. The semiconductor devices thus obtained were subjected to heat cycle test to examine the properties thereof. These two kinds of resins were a resin "A" containing 25% by weight of a filler whose maximum particle diameter is 30 μm and the average particle diameter is 7 μm, and a resin "B" containing 40% by weight of a filler whose maximum particle diameter is 40 μm and the average particle diameter is 15 μm. When the resin "A" was disposed in a region encircled by the outermost bump electrodes, and the resin "B" was disposed in a region not encircled by the outermost bump electrodes to prepare a semiconductor device in accordance with the process mentioned above, the generation of a defective product was not recognized up to 3000 cycles in the heat cycle test. On the other hand, when the resin "B" was disposed in a region encircled by the outermost bump electrodes, and the resin "A" was disposed in a region not encircled by the outermost bump electrodes to prepare a semiconductor device in accordance with the process mentioned above, the generation of a defective product was not recognized up to 3800 cycles in the heat cycle test.

It will be seen from these results that the reliability of the semiconductor device can be extremely improved if the size of the resin to be disposed in a space between a semiconductor chip and a wiring circuit board is made substantially equal to the size of the semiconductor chip.

FIG. 37 shows a graph wherein the accumulative percent defective $Nf_{50}$ at the 3,000 cycle is plotted in relative to the error between the size of the resin and the size of the semiconductor chip mounted on the circuit board, the results being indicated by a curve $e_5$. As seen from the results shown in FIG. 37, as the absolute value of error in size of the encapsulation resin contacting with the wiring circuit board was increased, the accumulative percent defective was also increased. However, if the error was within the range of ±2 μm, the accumulative percent defective was not increased, thus indicating a constant value.

The same kind of test was also conducted by changing the dimension of the gap "G" formed between the semiconductor chip and the wiring circuit board, the results being indicated by curves $f_5$ and $g_5$. These curves $f_5$ and $g_5$ indicate results when the dimension of gap "G" was set to 20 μm and 100 μm, respectively. It will be seen that the larger the gap "G" was, the smaller the possibility of generating the accumulative percent defective was, thus enhancing the reliability of the device. Further, when the range of the error was confined to a specific value as in the case where the gap "G" was set to 50 μm, the percent defective could be controlled to a constant, but when the error exceeded over this range, the percent defective was increased.

When the range to keep the percent defective constant was generalized by using the contact angle θ of the encapsulation resin, the inflection point of each curve was found to be (±G/tanθ). As a result, it was found that if the distance "D" between the edge of the semiconductor chip and the edge of the resin is confined to the range of (−G/tanθ) to (+G/tanθ), the reliability of the device could be improved by about four times. Moreover, when the size of the edge portion on four sides of the semiconductor chip was made zero and a heat cycle test was performed under such a condition, the reliability of the device was found to improve by six times.

From these results on the reliability, the followings can be considered. Namely, in view of the fact that the contact angle of the encapsulation resin on the wiring circuit board increases with the increase in error of size of the resin on the wiring circuit board in relative to the size of the semiconductor chip, it may be assumed that any stress tends to concentrate on the edge portion of the encapsulation resin.

In the prior art, with a view of effectively utilizing a capillarity for shortening the encapsulating period of time, a relatively large amount of resin in relative to the volume of the space was potted. Therefore, in the case of the prior art, the encapsulation resin was extensively disposed around the periphery of a semiconductor chip as disclosed in the publication; "Flip-chip Encapsulation on Ceramic Substrate", Proceeding of 1994 Electronic Components and Technology Conference, p.175–181.

In the manufacture of a semiconductor device according to this Example, the viscosity of the encapsulation resin to be filled in a space between a semiconductor chip and a wiring circuit board is lowered so as to make it possible to carry out the encapsulating through capillarity and to accelerate the filling velocity.

Specifically, when the conventional resin having a viscosity of 2,000 cp was potted on a wiring circuit board, the filling velocity thereof was 10.0 (mm/sec). However, when a resin having a viscosity of 700 cp was potted on a wiring circuit board, the filling velocity thereof was 2.0 (mm/sec), indicating an increase of about five times. When the conventional resin was employed, the size of the edge portion of the resin extending around the semiconductor chip was about 1 mm, whereas the size of the edge portion of the resin was increased to 4 mm in the case of this Example. However, since the edge portion of the resin according to the semiconductor device of this Example is removed through dissolution thereof, the actual size of the edge portion of the resin can be reduced to lower than that in the prior art.

Since the encapsulation resin to be disposed in a space between a semiconductor chip and a wiring circuit board is in a semi-cured condition after the removal of the resin disposed around the semiconductor chip according to this Example, the following advantages will be attained. Namely, if a defective product is found as a result of inspection of a semiconductor chip after mounting, the defective semiconductor chip can be easily removed with a weak force. Namely, in the case of the conventional semiconductor device where the encapsulation resin filled therein is heat-cured, if a semiconductor chip is found defective, the removal of the chip and the encapsulation resin is required to be performed using a mechanical means. In the case of a semiconductor device according to this Example however, a defective semiconductor chip may be easily removed and repaired.

Moreover, since any residual resin can be solubilized through the irradiation of light, the resin remaining on a wiring circuit board can be easily removed. In this case, an optical fiber may be employed to irradiate a resin disposed between the semiconductor chip and the wiring circuit board so as to dissolve and remove the resin before the encapsulation resin is completely cured.

The resin to be filled in a space between the semiconductor chip and the wiring circuit board should preferably be the same composition as that of the uppermost layer of the wiring circuit board. For example, when a wiring circuit board comprising a glass/epoxy resin substrate and epoxy solder resist covering the substrate is employed, epoxy resin may be employed as an encapsulation resin. Likewise, when a multi-layered circuit board comprising an alumina ceramic substrate and a polyimide resin layer formed over the substrate as an uppermost layer is employed, a photo-degradative polyimide resin may be employed as an encapsulation resin. When the encapsulation resin employed is of the same composition as that of the uppermost layer of the wiring circuit board, the reliability of the resultant device will be enhanced by three times.

Moreover, even if a semiconductor chip is mounted very closely, the problem experienced in the prior art can be solved by undergoing the process shown in FIGS. 38A to 38D. Specifically, according to the conventional technique, 16 pieces of semiconductor chips can be mounted on a wiring circuit board having a size of 10 mm×10 mm. Whereas, according to this Example, 25 pieces of semiconductor chips can be mounted on such a circuit board. Namely, the densification of mounting can be improved by 1.5 times according to this Example.

EXAMPLE VI

Figure 39:
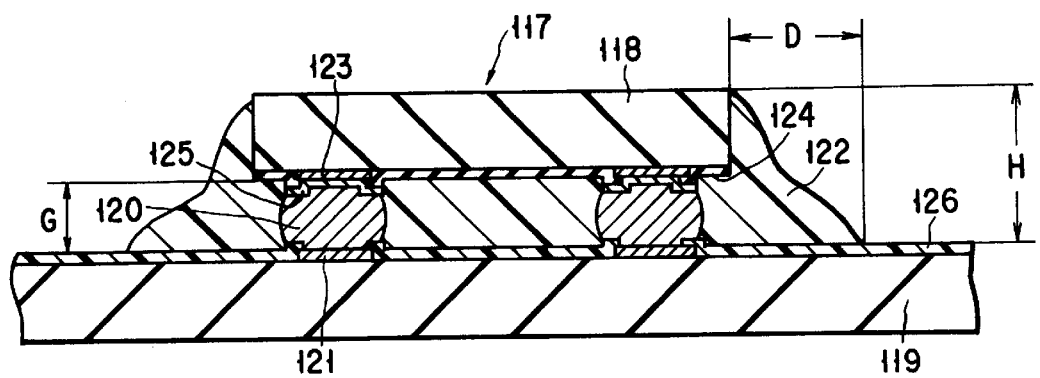
FIG. 39 is a cross-sectional view of a semiconductor device according to Example VI of this invention.
Figure 40:
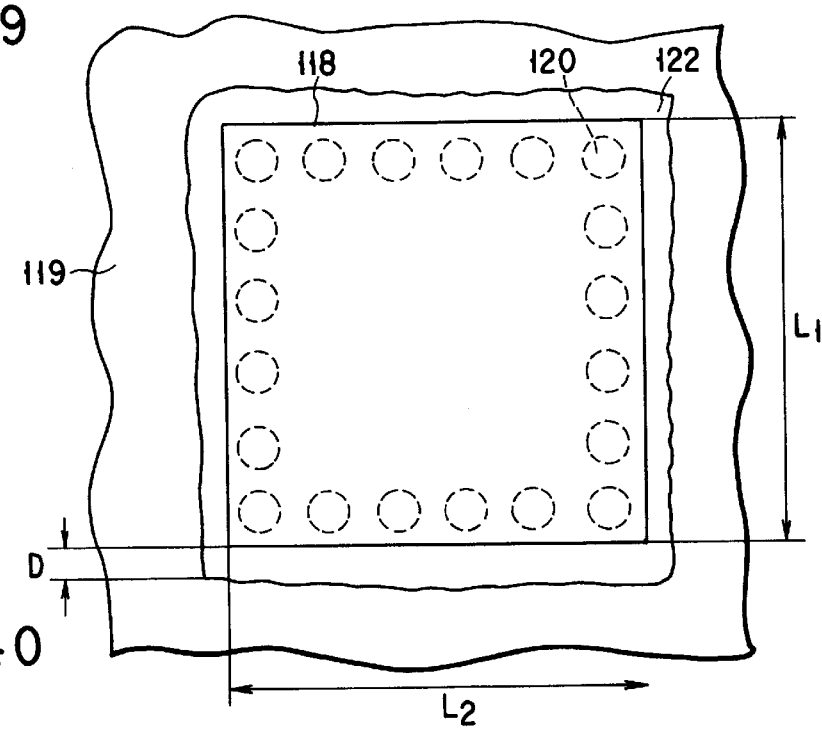
FIG. 40 is a plan view of a semiconductor device according to Example VI of this invention.

FIG. 39 shows a cross-sectional view of a semiconductor device according to Example VI, and FIG. 40 shows a plan view thereof.

As shown in FIG. 39, the semiconductor device 117 according to Example VI comprises a circuit board 119 provided with connecting terminal 121, on which a silicon semiconductor chip 118 is mounted through bump electrodes 120 and Al bonding pads 123. A resin 122 is disposed in a space between the semiconductor chip 118 and the circuit board 119, and in a region around the semiconductor chip 118. The distance between the edge portion of the chip 118 and the resin 122 is indicated by "D". In this FIG. 39, "H" represents a distance between the chip-mounting surface of the circuit board 119 and the back surface of the semiconductor chip 118, while "G" represents the dimension of gap between the circuit board 119 and the semiconductor chip 118.

The sizes of two sides neighboring to each other of the semiconductor chip 118 are represented by $L_1$ and $L_2$ in FIG. 40, respectively. The distance "D" between the edge portion of the semiconductor chip 118 and the edge portion of the resin 122 indicates an average value of any given side.

The semiconductor device according to Example VI may be manufactured by the following steps.

FIGS. 41A to 41F illustrate a first example of the manufacturing method of the semiconductor device according to Example VI.

Figure 41A:
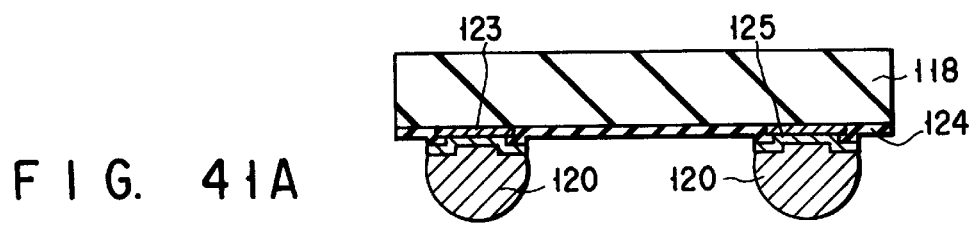
FIGS. 41A to 41F are cross-sectional views illustrating an example of manufacturing process of a semiconductor device according to Example VI of this invention.
Figure 41B:
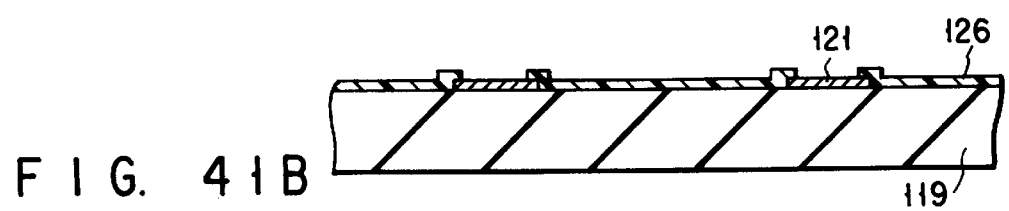

First, a semiconductor chip 118 as shown in FIG. 41A and a wiring circuit board 119 as shown in FIG. 41B are prepared.

As shown in FIG. 41A, an Al bonding pad 123 and a passivation film 124 are formed on the surface of the semiconductor chip 118, and bump electrodes 120 are formed via a barrier metal 125 on the surface of the Al bonding pad 123.

Bump electrodes 120 formed on the surface of the semiconductor chip 118 can be formed by way of a vapor deposition or an electroplating. The material useful for the bump electrode may be a solder in general, but may be other kind of metal having a higher rigidity as compared with the solder such for example as Au and Cu.

The size of the semiconductor chip, the number of the bump electrode and the pitch of bump electrodes may be arbitrarily selected. The layout of the bump electrodes may be realized.

In this invention, a semiconductor chip 10 mm×10 mm in size and provided with a Cu/Ti barrier metal 125 may be used. The bump 120 having for example a diameter of 100 $\mu$m and a height of 75 $\mu$m±5 $\mu$m and formed of a Pb/Sn (40/60) alloy may be employed. Thus, for example, 256 pins of such a bump are arrayed along the periphery of the semiconductor chip.

There is no restriction as to the material and structure of the wiring circuit board 119. For example, a laminated glass/epoxy substrate may be employed. In the following explanation, a printed SLC (Surface Laminar Circuit) board comprising a glass/epoxy substrate on which an insulating layer and a conductive layer are build-up is exemplified as the substrate.

Namely, as shown in FIG. 41B, an opening 110 μm in diameter is formed in a connecting terminal area 121 of the wiring circuit board 119 to conform with the location of the bump electrode of the semiconductor chip, thereby exposing Cu as a terminal material. All of the area other than the connecting terminal area 121 is covered with a solder resist 126.

Figure 41C:
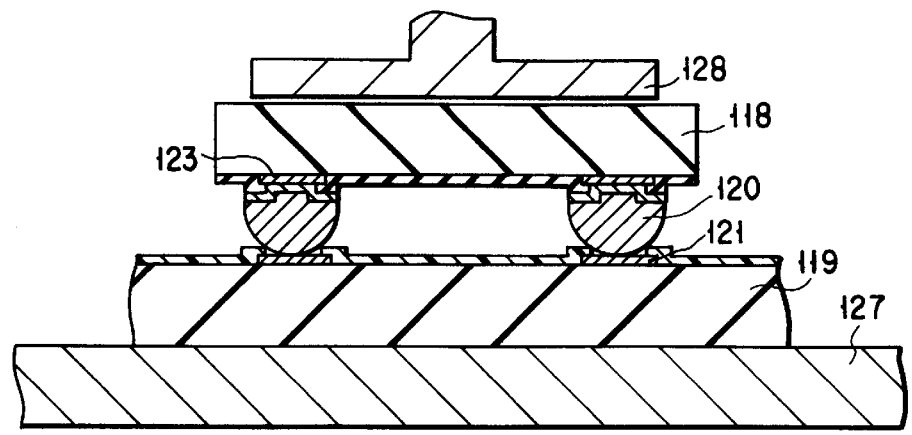

Then, as shown in FIG. 41C, the semiconductor chip 118 is aligned by making use of a flip-chip bonder on the wiring circuit board 119 prepared as described above, thereby electrically and mechanically contacting the bump electrodes 120 with the connecting terminal 121 of the wiring circuit board 119. At this moment, the wiring circuit board 119 is held on a stage 127 provided with a heating means and preliminarily heated in an atmosphere of nitrogen at a temperature of 200° C. which is higher than the melting point of Pb/Sn (40/60).

While keeping the semiconductor chip 118 contacted with the wiring circuit board 119, a collet 128 sustaining the semiconductor chip is heated in a nitrogen atmosphere at the same temperature of 200° C. as in the case of the stage 127. As a result of this heating, the solder is molten to achieve an electrical and mechanical temporary connection between the semiconductor chip 118 and the wiring circuit board 119. Finally, the wiring circuit board 119 mounting the semiconductor chip 118 thereon is passed through a reflow furnace which is heated to 250° C. and in which nitrogen is filled so as to electrically and mechanically connect the semiconductor chip 118 with the wiring circuit board 119.

During this heating step, a self-alignment effect was developed by the surface tension of the solder so that the dislocation more or less of the semiconductor chip 118 brought about during the mounting step can be corrected, thus realizing an accurately aligned bonding of semiconductor chip 118.

Figure 41D:
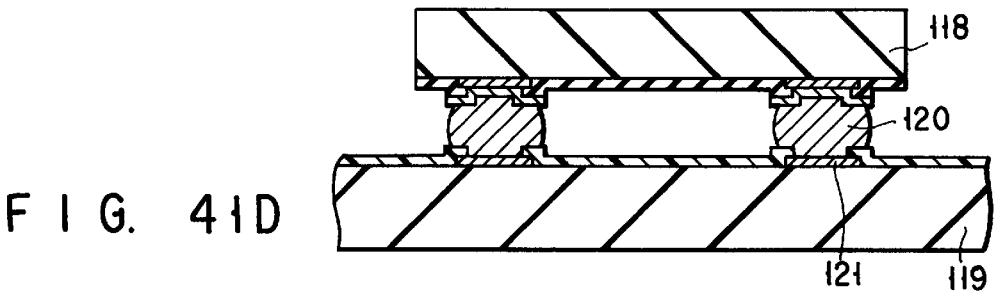

Through these steps, the semiconductor chip 118 can be mounted with bumps 120 on the wiring circuit board 119 as shown in FIG. 41D.

Figure 41E:
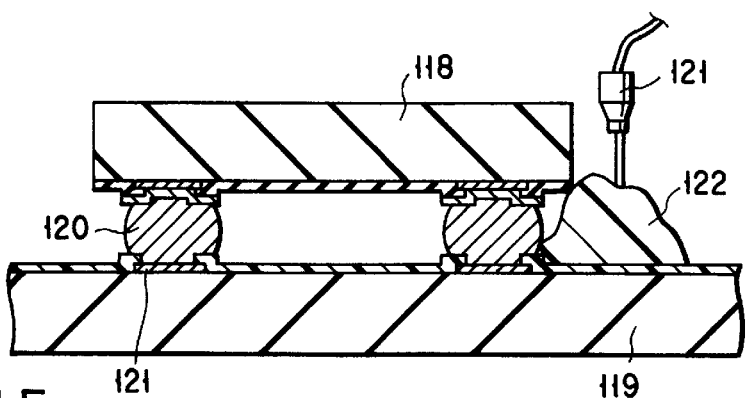

Then as shown in FIG. 41E, a potting of for example 10 ml of thermosetting resin as an encapsulation resin into a space formed between the semiconductor chip 118 and the wiring circuit board 119 is performed by using a dispenser 121.

The resin to be disposed in the space formed between the semiconductor chip and the wiring circuit board may be a thermosetting resin such as bisphenol type epoxy resin may be used. This thermosetting resin may be used as a mixture with an imidazole curing catalyst, an acid anhydride curing agent and an inorganic filler.

Examples of inorganic filler to be mixed into the resin are silica, quartz and fused silica, which may be used singly or as a combination thereof. The particle diameter of the inorganic filler should preferably be not more than the distance between the semiconductor chip and the wiring circuit board. For example, a filler having a maximum particle diameter ranging from 20 μm to 60 μm, and an average particle diameter ranging from 7 μm to 50 μm may be mixed in the resin at the ratio of 30% by weight to 75% by weight.

Figure 41F:
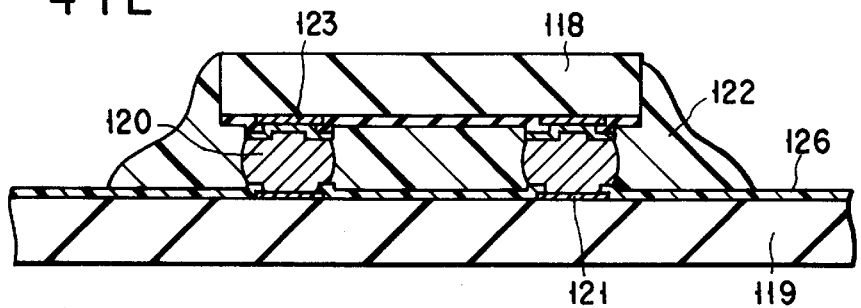

Then, the semiconductor device thus fabricated is held in a clean oven at a temperature of 80° C. for four hour to cure the resin disposed therein, thus obtaining the semiconductor device of Example VI as shown in FIG. 41F.

The method of disposing the thermosetting resin is not limited to that described above, but may be performed by a method explained below.

Figure 42A:
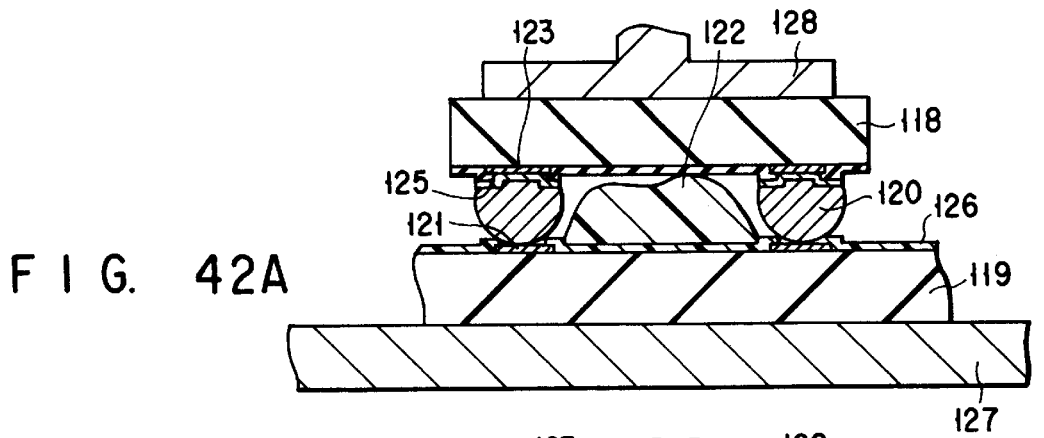
FIGS. 42A and 42B are cross-sectional views illustrating an example of manufacturing process of a semiconductor device according to Example VI of this invention.
Figure 42B:
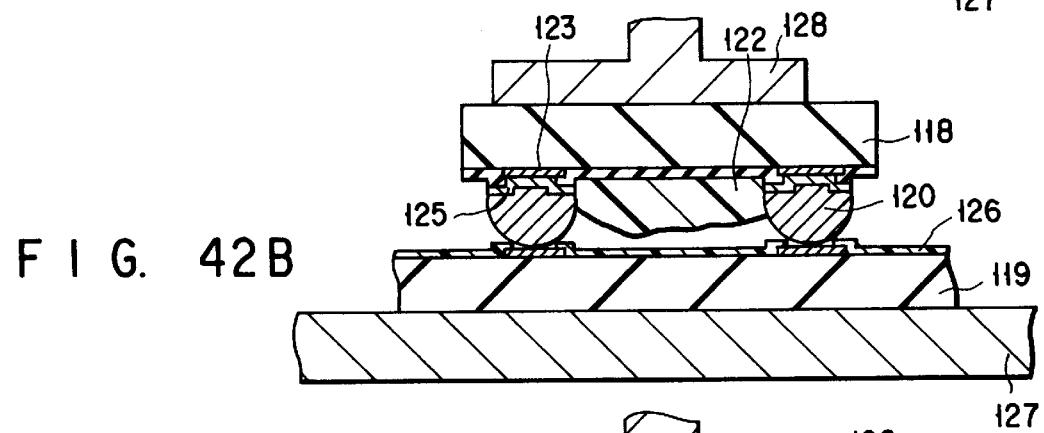

As shown in FIGS. 42A and 42B, the thermosetting resin 122 is potted in advance in a region of the wiring circuit board 119 or in a region of the semiconductor chip 118, which will be encircled by the bump electrodes 120.

Then, as shown in FIG. 42B, the semiconductor chip 118 and the wiring circuit board 119 are electrically and mechanically connected, thereby obtaining the semiconductor device of this example.

Figure 43A:
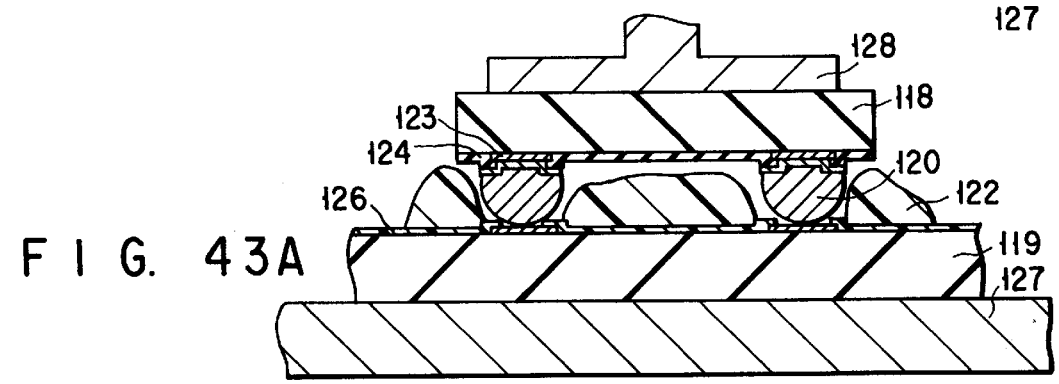
FIGS. 43A and 43B are cross-sectional views illustrating an example of manufacturing process of a semiconductor device according to Example VI of this invention.
Figure 43B:
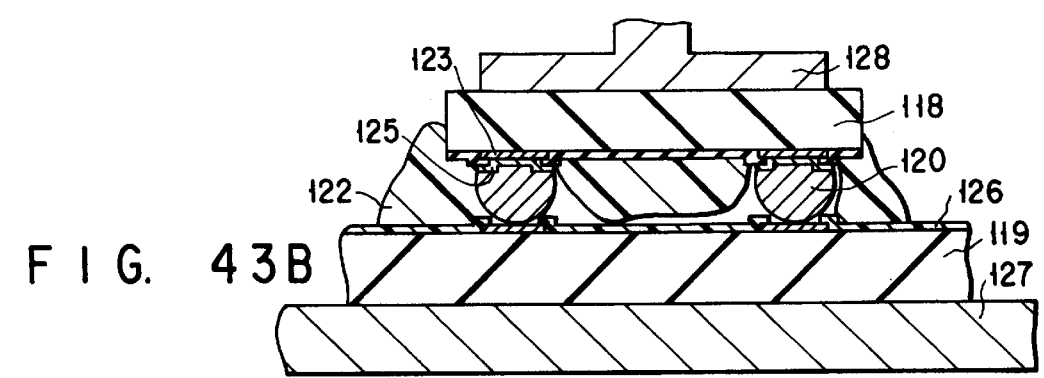

Alternatively, the thermosetting resin 122 may be potted in advance in the region surrounded by the bump electrodes 120 as well as in the region, not surrounded by the bump electrode 120, of either one of the semiconductor chip 118 and the wiring circuit board 119 as shown in FIGS. 43A and 43B.

Then, as shown explained above, the semiconductor chip 118 and the wiring circuit board 119 are electrically and mechanically connected, thereby obtaining the semiconductor device of this example.

This Example VI will be further explained with reference to the following specific example.

In accordance with the first example as described above, 256 pins of bumps, each formed of Pb/Sn (40/60) and having a diameter of 100 μm and a height of 75 μm, were formed on a semiconductor chip 10 mm×10 mm in size, which was then mounted through a flip-chip mounting on an SLC substrate, thereby obtaining the semiconductor device of Example (VI-1).

In this Example (VI-1), a resin formed of a composition comprising 55% by weight of bisphenol type epoxy resin, 3% by weight of imidazole curing catalyst, 2% by weight of an acid anhydride curing agent and 40% by weight of a spherical quartz filler (an average particle diameter: 10 μm, and a maximum particle diameter: 35 μm) was employed.

The distance "G" between the semiconductor chip and the wiring circuit board after the mounting was 50 μm, and the distance "H" between the chip-mounting surface of the wiring circuit board and the back surface of the semiconductor chip was 675 μm. This distance "H" between the chip-mounting surface of the wiring circuit board and the back surface of the semiconductor chip corresponds to the maximum height of the encapsulation resin. The distance "D" between the edge portion of the semiconductor chip and the edge portion of the resin in the semiconductor device thus obtained was 2.5 mm.

The semiconductor device thus obtained was subjected to a heat cycle test, in which a sample exhibiting even one failure of connection of the bump electrode out of 256 pins of the bump electrodes was assumed to be defective, and the relationship between the heat cycle and the accumulative percent defective was investigated. The results obtained are indicated by a curve $a_6$ in FIG. 44. The number of the sample employed was 1,000, and the heat cycle was conducted under a condition of −55° C. (30 minutes) to 25° C. (5 minutes) to 125° C. (30 minutes) to 25° C. (5 minutes).

Various kinds of semiconductor devices, i.e. Examples (VI-2) to (VI-4) were manufactured in the same manner as described above except that the content of filler in the resin was changed. These Examples were also subjected to a heat cycle test in the same manner as explained above to investigate the relationship between the heat cycle and the accumulative percent defective. The results obtained are indicated by curves $b_6$ to $d_6$ in FIG. 44.

The content of filler in the resins and the distance "D" between the edge portion of the semiconductor chip and the edge portion of the resin in Examples (VI-2) to (VI-4) were as shown in Table 5 below.

TABLE 5

|  | Content of filler (wt %) | D (mm) |
| --- | --- | --- |
| Example (VI-2) Curve $b_6$ | 45 | 0.7 |
| Example (VI-3) Curve $c_6$ | 50 | 0.4 |
| Example (VI-4) Curve $d_6$ | 55 | 0.2 |

A semiconductor device of Comparative Example (VI-1) was manufactured by using a resin containing 25% by weight of a filler. Further, a semiconductor device of Comparative Example (VI-2) was manufactured in the same manner as described above except that the resin was not disposed at all. These semiconductor devices thus obtained, i.e. Comparative Example (VI-1) and Comparative Example (VI-2) were subjected to a heat cycle test in the same manner as described above. The results obtained are indicated by a curve $e_6$ and a curve $f_6$ in FIG. 44.

In the semiconductor device of Comparative Example (VI-1), the distance between the edge of the semiconductor chip and the edge of the resin was 5 mm.

As shown in FIG. 44, when the distance between the edge of the semiconductor chip and the edge of the resin became smaller, the reliability of the device was found to have been further improved. In particular, when the size of the edge portion was 0.4 mm, the generation of a defective product was not recognized up to 2,500 cycles, and when the size of the edge portion was 0.2 mm, the generation of a defective product was not recognized up to 3,500 cycles.

By contrast, when the size of the edge portion was 5 mm (curve $e_6$), the generation of a defective product was not recognized up to 2,000 cycles, but when the heat cycle was increased to 3,000 cycles, 100% of the samples were recognized as being defective. On the other hand, in the case of a sample which was not encapsulated with a resin at all (curve $f_6$), the generation of a defective product was recognized after only 2 cycles, and when the heat cycle was increased to 10 cycles, 100% of the samples were recognized as being defective.

As in the case of Examples I and II, two kinds of resins, each differing in the content of a filler, were separately disposed in a region surrounded by bump electrodes and a region outside the bump electrodes to manufacture a semiconductor device. The semiconductor devices thus obtained were subjected to heat cycle test to examine the properties thereof. These two kinds of resins were a resin "A" containing 25% by weight of a filler whose maximum particle diameter is 30 $\mu$m and the average particle diameter is 7 $\mu$m, and a resin "B" containing 40% by weight of a filler whose maximum particle diameter is 40 $\mu$m and the average particle diameter is 15 $\mu$m. When the resin "A" was disposed in a region encircled by the outermost bump electrodes, and the resin "B" was disposed in a region not encircled by the outermost bump electrodes to prepare a semiconductor device in accordance with the process mentioned above, the generation of a defective product was not recognized up to 3500 cycles in the heat cycle test. On the other hand, when the resin "B" was disposed in a region encircled by the outermost bump electrodes, and the resin "A" was disposed in a region not encircled by the outermost bump electrodes to prepare a semiconductor device in accordance with the process mentioned above, the generation of a defective product was not recognized up to 3800 cycles in the heat cycle test.

FIG. 45 shows a graph wherein the accumulative percent defective $Nf_{50}$ at the 3,000 cycle is plotted in relative to the size "D" of the edge portion around the semiconductor chip. As seen from the results shown in FIG. 45, as the size "D" was increased, the accumulative percent defective $Nf_{50}$ was also increased. Thus, when the size "D" was more than 5 mm, the accumulative percent defective $Nf_{50}$ was found to be 100%.

On the other hand, if the dimension "D" was less than about 0.4 mm, the accumulative percent defective $Nf_{50}$ was found to be 0% indicating an excellent reliability life.

The heat cycle test was also conducted on the package of semiconductor chip mounted on a wiring circuit board by changing the dimension of the length and width of the semiconductor chip ($L_1$ and $L_2$), the dimension of the gap (G) and the height of the encapsulation resin (H) to evaluate the reliability of the device. As a result, it has been found that the accumulative percent defective $Nf_{50}$ is dependent on the size of the edge portion of the encapsulation resin, and that the value of the size of the edge portion of the encapsulation resin which cause the accumulative percent defective $Nf_{50}$ to exceed over 0% can be represented by the following formula as expressed using the above parameters.

$$D > L_1 L_2 G/((L_1+L_2)H)$$

Namely, if the size of the edge portion of the encapsulation resin "D" formed on the periphery of the chip is confined as follows, the reliability of the device can be extremely enhanced.

$$0 \leq D \leq L_1 L_2 G/((L_1+L_2)H)$$

As a result of the Example, the level of minimum volume of the resin which makes it possible to increase the filling velocity of the resin was determined. Namely, when the potting of the resin on a wiring circuit board was performed, using the volume of the resin was set to about 1.5 times as much as the volume of the space between the semiconductor chip and the wiring circuit board, the filling velocity thereof was 10.0 (mm/sec). However, when the volume of the resin was increased to twice as much as that of the space, the filling velocity thereof was 2.0 (mm/sec). Further, when the volume of the resin was increased to twice as much as that of the space, the filling velocity thereof was also 2.0 (mm/sec). From these results, it was found that if the volume of the resin was set to about twice as much as that of the space, the volume of the resin could be minimized while achieving a high filling velocity of the resin. Additionally, when the volume of the resin was controlled in this range, it was possible to uniformly dispose the resin throughout the periphery of the semiconductor chip due to the surface tension of the resin formed on the periphery of the semiconductor chip.

When the size of the edge portion of the resin around the semiconductor chip was confined within ±10% of the average value in this Example, a uniform dispersion stress on this portion could be achieved, thus enhancing the reliability by about four times. Further, when the size of the edge portion of the resin around the semiconductor chip was identical throughout the periphery of the semiconductor chip, a more uniform dispersion stress on this portion could be achieved, thus enhancing the reliability by about six times.

When the edge portion of the resin on the wiring circuit board is formed into a concave shape, the resultant shape would be stabilized, so that the size of the edge portion "D" would become more uniform. When a semiconductor device encapsulated with a resin whose edge portion around the semiconductor chip was formed into a concave shape was subjected to a heat cycle test to evaluate the reliability thereof together with a semiconductor device sealed with a resin whose edge portion around the semiconductor chip was formed into a convex shape, the reliability of the former semiconductor device was found to be about twice as better as that of the latter semiconductor device.

Moreover, since the size "D" of the edge portion of the resin is limited to lower than a prescribed set value, the density of the mounting can be increased. Specifically, according to the conventional technique, 16 pieces of semiconductor chips could be mounted on a wiring circuit board having a size of 10 mm×10 mm. Whereas, according to this Example, 25 pieces of semiconductor chips can be mounted on such a circuit board. Namely, the densification of mounting can be improved by 1.5 times according to this Example.

EXAMPLE VII

FIG. 46 shows a cross-sectional view of a semiconductor device according to Example VII, and FIG. 40 shows a plan view thereof.

As shown in FIG. 46, the semiconductor device 131 according to Example VII comprises a circuit board 133 provided with connecting terminal 135, on which a silicon semiconductor chip 132 is mounted through bump electrodes 134 and Al bonding pads 137. A resin 136 is disposed in a space between the semiconductor chip 132 and the circuit board 133, and in a region around the semiconductor chip 132. The distance between the edge portion of the chip 132 and the resin 136 is indicated by "D". In this FIG. 47, "G" represents the dimension of gap between the circuit board 133 and the semiconductor chip 132.

The sizes of two sides neighboring to each other of the semiconductor chip 132 are represented by $L_1$ and $L_2$ in FIG. 47, respectively. The maximum distance between the center of the semiconductor chip 132 and the center of the outermost bump electrode is represented by $L_0$. Namely, $L_0$ corresponds to the maximum distance between the center of the semiconductor chip 132 and the center of the bump electrode which is disposed at the corner of the semiconductor chip.

The encapsulation resin can be disposed by using the same kinds of resin in the same manner as explained in Example VII.

The resin useful in this case is a thermosetting resin such as bisphenol type epoxy resin. This thermosetting resin may be used as a mixture with an imidazole curing catalyst, an acid anhydride curing agent and an inorganic filler. In particular, the employment of a resin having a coefficient of thermal expansion ranging from $4.0 \times 10^{-5}$ to $5.0 \times 10^{-6} (/^\circ C.)$ is preferable.

Examples of inorganic filler to be mixed into the resin are silica, quartz and fused silica, which may be used singly or as a combination thereof. The particle diameter of the inorganic filler should preferably be not more than the shortest distance "G" between the semiconductor chip and the wiring circuit board. For example, a filler having a maximum particle diameter ranging from 20 μm to 60 μm, and an average particle diameter ranging from 7 μm to 50 μm may be mixed in the resin at the ratio of 45% by weight to 75% by weight.

The semiconductor device of this Example VII can be manufactured in the same manner as explained in Example VI, i.e. according to the steps shown in FIGS. 41A to 41F. In the potting of a resin, the resin may be disposed only along the one side of the semiconductor chip 132 as indicated by the reference numeral of 136 in FIG. 48A, or may be disposed in the shape of "L" along the neighboring two sides thereof as shown in FIG. 48B.

This Example VII will be further explained with reference to the following specific example.

In accordance with the method of disposing the resin as shown in FIG. 48A, 256 pins of bumps 134, each formed of Pb/Sn (40/60) and having a diameter of 100 μm and a height of 75 μm, were formed on a semiconductor chip 10 mm×10 mm in size, which was then mounted through a flip-chip mounting on an SLC substrate, thereby obtaining the semiconductor device of Example (VII-1).

In this Example (VII-1), a resin formed of a composition comprising 55% by weight of bisphenol type epoxy resin, 3% by weight of imidazole curing catalyst, 2% by weight of an acid anhydride curing agent and 45% by weight of a spherical quartz filler (an average particle diameter: 10 μm, and a maximum particle diameter: 35 g m) was employed. The viscosity of the resin was 50 cps (25° C.).

The distance "G" between the semiconductor chip and the wiring circuit board after the mounting was 50 μm, and the maximum distance $L_0$ between the center of the semiconductor chip and the center of the bump electrode was set to 13.43 mm. The bump electrodes were disposed such that the center of the bump electrode is positioned 500 μm inward from the edge of the semiconductor chip. The modulus of rigidity and coefficient of thermal expansion of the resin after curing were 510 kg/mm² and $23 \times 10^{-6}(/^\circ C.)$, respectively.

Various kinds of resins whose modulus of rigidity were varied by changing the molecular weight of the resin or by changing the content of the filler were employed and treated in the same manner as described above to obtain semiconductor devices, each mounting a semiconductor chip (10 mm×10 mm) mounted on a wiring circuit board. The semiconductor devices obtained were subjected to a heat cycle test, and the relationship between the modulus of rigidity of the resin after curing and the fatigue failure cycle number was plotted to obtain a curve $a_7$ in FIG. 49. The number of the sample employed was 1,000, and the heat cycle was conducted under a condition of −55° C. (30 minutes) to 25° C. (5 minutes) to 125° C. (30 minutes) to 25° C. (5 minutes).

Various kinds of resins were employed and treated in the same manner as described above except that the size of the semiconductor chip was changed, thereby obtaining semiconductor devices. The semiconductor devices obtained were subjected to a heat cycle test, and the relationship between the modulus of rigidity of the resin after curing and the fatigue failure cycle number was plotted to obtain a curve $a_7$ in FIG. 49 The results obtained are indicated by curves $b_7$ and $c_7$ in FIG. 49. The conditions for these curves $b_7$ and $c_7$ are shown in the following Table 6.

TABLE 6

|  | Size of chips | $L_0$ |
| --- | --- | --- |
| Curve $b_7$ | 5 mm × 5 mm | 6.36 mm |
| Curve $c_7$ | 10 mm × 10 mm | 27.58 mm |

Figure 49:
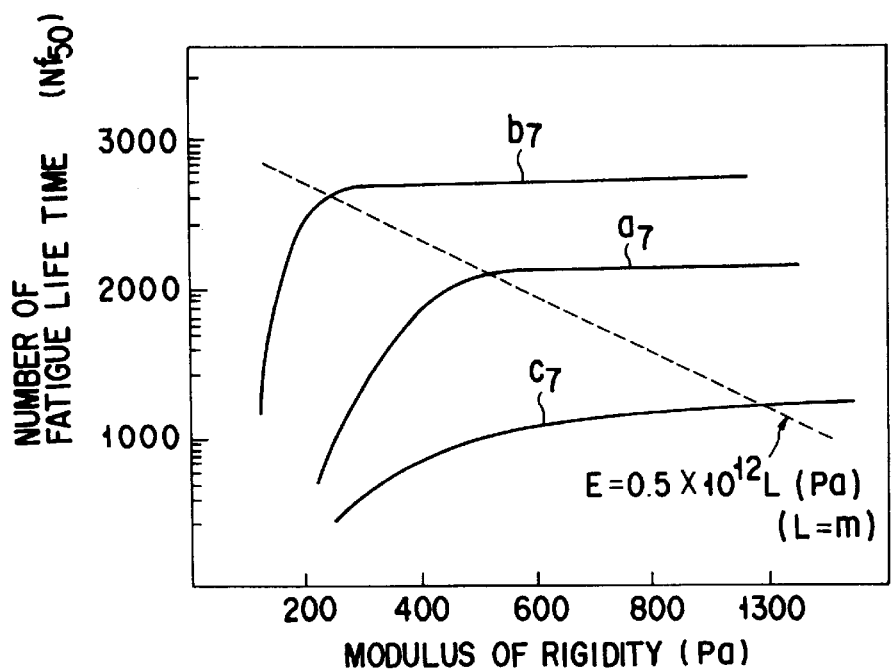
FIG. 49 is a graph showing the relationships between the modulus of rigidity and the number of cycles in fatigue life.

As shown in FIG. 49, the larger the size of the semiconductor chip is, the reliability of the device was found more decreased. Further, irrespective of the size of the semiconductor chip mounted, when the modulus of rigidity reached to a certain point, the fatigue failure cycle number was not increased but saturated to become constant. When the inflection point indicating the saturation of the fatigue failure cycle number was generalized by using the distance $L_0$ between the center of the semiconductor chip and the bump electrode located remotest from the semiconductor chip, the following formula was obtained.

$$E=0.5\times10^{12}\times L_0 (Pa)$$

Namely, when the modulus of rigidity E (Pa) of a resin for sealing a space between the semiconductor chip and the wiring circuit board meets the following condition shown below, the reliability life of the semiconductor device can be improved.

$$E>0.5\times10^{12}\times L_0 (Pa)$$

Figure 50:
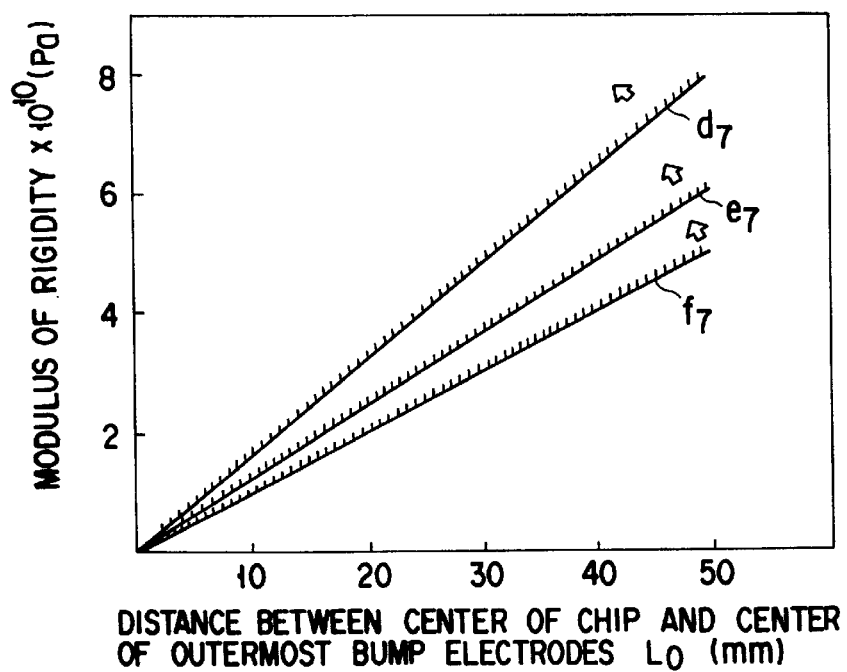
FIG. 50 is a graph showing the relationships between the modulus of rigidity and a distance between the center of a semiconductor chip and the center of a bump electrode disposed remotest from the semiconductor chip.

FIG. 50 illustrates an optimum range of the modulus of rigidity of a resin which has been calculated using the finite element method. These results were obtained under the same conditions except that the space "G" between the semiconductor chip and the wiring circuit board was changed as follows. Namely, lines $d_7$, $e_7$ and $f_7$ represent the results where the space "G" was changed to G=25 μm, G=50 μm and G=100 μm, respectively.

Further, the above calculations were performed under the conditions of $L_0$=4.2 mm, coefficient of thermal expansion: $39\times10^{-6}$(/°C.) and temperature: 155° C. to −65° C. The displacement ($\Delta L_0$) in each dimension is summarized in the following Table 7.

TABLE 7

| G (μm) | Displacement ($\Delta L_0$) generated |
|---|---|
| 25 | 1.2% |
| 50 | 0.9% |
| 100 | 0.75% |

If all of $\Delta L_0$ are assumed to be of shear strain γ under the conditions of $\Delta L_0 = \kappa_1/E$, and $\Delta L_0 = \kappa_2/E$, the accumulative percent defective $Nf_{50}$ becomes 3,000 cycles under the condition of equivalent strain $\epsilon \leq 1.5\%$. In this case, each of $\kappa_1$ and $\kappa_2$ represents a constant. Therefore, the modulus of rigidity required under various conditions to achieve the equivalent strain $\epsilon \leq 1.5\%$ can be summarized as shown in Table 8.

TABLE 8

| G (μm) | Modulus of rigidity |
|---|---|
| 25 | $E \geq 1.6 \times 10^{12} \times L_0$ (Pa) |
| 50 | $E \geq 1.2 \times 10^{12} \times L_0$ (Pa) |
| 100 | $E \geq 1.0 \times 10^{12} \times L_0$ (Pa) |

It has been found from the above calculations that an optimum range of the modulus of rigidity of a resin depends on the dimension "G" of the space between a semiconductor chip and a wiring circuit board, so that if the dimension "G" is very small, the modulus of rigidity is required to be increased. Specifically, a correction in the range of 25/G to 100/G was required to $L_0$, and the coefficient of thermal expansion required for achieving the condition of $\epsilon \leq 1.5\%$ was $5.0\times10^{-5}$ to $4.0\times10^{-6}$(/°C.).

Figure 51:
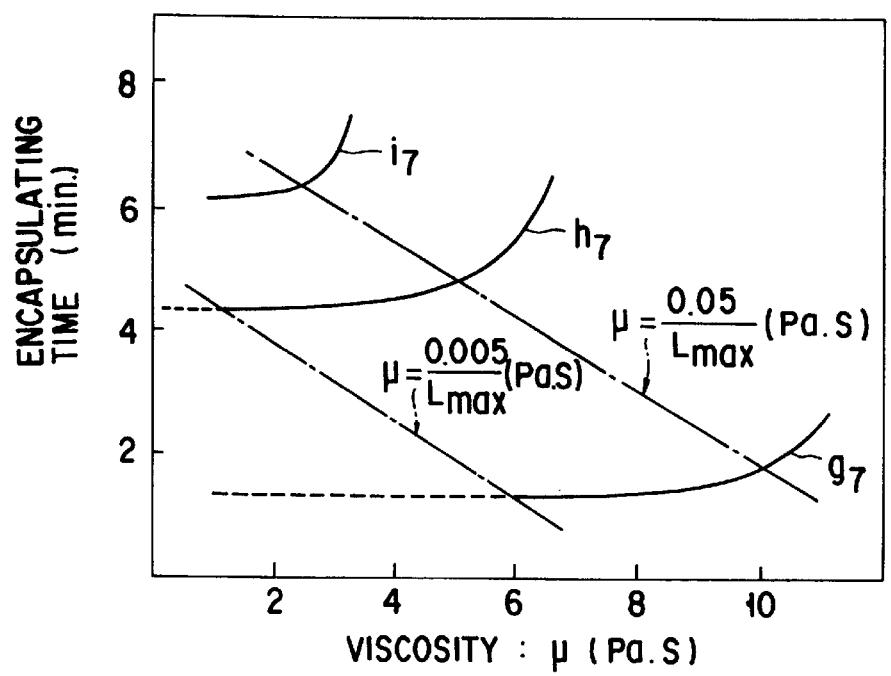
FIG. 51 is a graph showing the relationships between the viscosity of a resin and the encapsulating time of the resin.

FIG. 51 is a graph wherein a relationship between the viscosity of the resin encapsulating a space between the semiconductor chip and the wiring circuit board, and the time required for filling the space is plotted on the semiconductor chips of various sizes. Curves $g_7$, $h_7$ and $i_7$ represent the results on the semiconductor chips having the size of 5 mm×5 mm, 10 mm×10 mm and 20 mm×20 mm, respectively. The time required for filling the space mentioned above was determined by measuring the time required for uniformly disposing a resin on the whole peripheral surface of the semiconductor chip, starting from the potting thereof on one side of the semiconductor chip.

As seen from FIG. 51, the smaller the size of the semiconductor chip was, i.e. in the order of the chip of 20 mm×20 mm (curve $i_7$), the chip of 10 mm×10 mm (curve $h_7$) and the chip of 5 mm×5 mm (curve $g_7$), the shorter the time required for filling a resin became. Further, irrespective of the size of the semiconductor chip mounted, when the viscosity of the resin is lowered to less than a certain degree, the time required for the filling was not decreased but saturated to become constant. This can be ascribed mainly to the fact that the time required for the filling is influenced mainly by the time required for a resin to reach to the periphery of the semiconductor chip, rather than by the flow velocity of the resin passing through a space between the semiconductor chip and the wiring circuit board. Thus, the time required for the filling is considered to be determined by the time required for uniformly disposing a resin on the whole peripheral surface of the semiconductor chip.

When the viscosity that makes the filling time constant was generalized by using the size "$L_{max}$" of the semiconductor chip, the formula of $\rho \leq 0.05/L_{max}$ was obtained. By the way, this chip size "$L_{max}$" means the dimension of a longer side among the two sides $L_1$ and $L_2$ of the semiconductor chip. However, when the viscosity of the encapsulation resin is extremely low, the resin may be formed extending over a wide region around the periphery of the semiconductor chip, e.g. extending as wide as a half of the chip size. Therefore, the viscosity of the resin should preferably be controlled to at least $0.005/L_{max}$.

Figure 52:
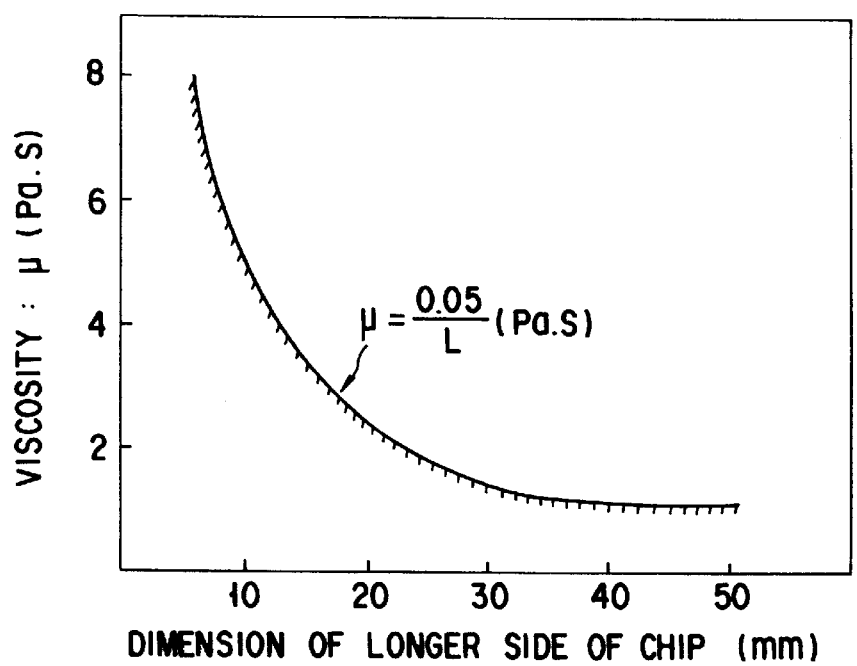
FIG. 52 is a graph showing the relationships between the viscosity of a resin and the length of a longer side of a semiconductor chip.

FIG. 52 illustrates a relationship between the dimension of a longer side of a semiconductor chip and the viscosity required for achieving the encapsulating of the space between the chip and the circuit board. In this FIG. 52, the calculation was performed by setting the filling velocity to 1.0(mm/sec.). In this case, the filling distance $L_x$ can be represented by;

$$L_x = (NG/3\rho t)^{1/2}$$

wherein ρ represents the viscosity of the resin, N is the wettability of the resin, G is the dimension of the gap, and t is an encapsulating time.

Therefore, under the conditions of N=0.05 (N/m), G=50 μm, the filling velocity $L_x/t=1.0$ (mm/sec), a viscosity of $\rho=0.05/L_x$ (Pa·s) was obtained, indicating almost the same result as described above.

It has been confirmed from these results that a semiconductor device excellent in reliability as compared with the conventional device can be obtained according to this Example, and that encapsulating with a resin can be performed within a shorter period of time as compared with the conventional device.

In the prior art, with a view of effectively utilizing a capillarity for shortening the encapsulating period of time, a relatively large amount of resin in relative to the volume of the space was potted. Therefore, in the case of the prior art, the encapsulation resin was extensively disposed around the periphery of a semiconductor chip. For example, it is reported in "Flip-chip Encapsulation on Ceramic Substrate", Proceeding of 1994 Electronic Components and Technology Conference, p.175–181 that a resin having a high viscosity in the range of 10 to 20 kcps will be used.

In the manufacture of a semiconductor device according to this Example, a resin having a low viscosity was employed in an amount twice as much as that of the space between a semiconductor chip and a wiring circuit board. This volume of resin is a minimum volume which makes it possible to increase the filling velocity, so that the amount of resin to be disposed around the semiconductor device can be reduced.

Specifically, when a resin in an amount about 1.5 times as high as the volume of space between the semiconductor chip and the wiring circuit board was potted on a wiring circuit board, the filling velocity thereof was 10.0 (mm/sec). However, when the volume of the resin was increased to twice the volume of the space, the filling velocity thereof was 1.0 (mm/sec). On the other hand, when the volume of the resin was increased to four times the volume of the space, the filling velocity thereof was still 2.0 (mm/sec). Thus, it has been found that when about twice as much resin as that of the space is employed, it is possible to increase the filling velocity while making it possible to employ a minimum useful volume of resin. In this case, the resin can be selectively formed on the four sides of the semiconductor chip by making the most of the surface tension of the resin formed around the semiconductor chip.

Further, since the modulus of rigidity of the encapsulation resin is limited according to this Example, a shear strain of resin due to a heat cycle can be reduced, and at the same time, when the coefficient of thermal expansion of the resin is confined to a specific range, the mechanical properties of the resin can be improved. Moreover, when the viscosity of the resin is confined to a specific range while taking the chip size into consideration, the filling of the resin can be performed within a shorter period of time as compared with the prior art, even if the filling is to be performed on a semiconductor chip of larger size.

Further, with the employment of a resin having limited physical properties, the size of the resin to be formed on the periphery of the semiconductor chip could be made uniform, so that the reliability of semiconductor device, when it is subjected to a heat cycle, was improved by about six times.

Moreover, when the edge portion of the resin on the wiring circuit board is formed into a concave shape, the resultant shape would be stabilized, so that the size of the edge portion "D" would become more uniform. When a semiconductor device encapsulated with a resin whose edge portion around the semiconductor chip was formed into a concave shape was subjected to a heat cycle test to evaluate the reliability thereof together with a semiconductor device encapsulated with a resin whose edge portion around the semiconductor chip was formed into a convex shape, the reliability of the former semiconductor device was found to be about twice as better as that of the latter semiconductor device.

It has been also found that even if the content of the filler in the resin used in this Example was changed to 45 to 55% by weight, a satisfactory effect could be obtained likewise.

Moreover, since the size "D" of the edge portion of the resin was limited to lower than a prescribed set value, the density of the mounting could be increased. Specifically, according to the conventional technique, 16 pieces of semiconductor chips could be mounted on a wiring circuit board having a size of 10 mm×10 mm. Whereas, according to this Example, 25 pieces of semiconductor chips can be mounted on such a circuit board. Namely, the densification of mounting can be improved by 1.5 times according to this Example.

EXAMPLE VIII

FIGS. 53A to 53D illustrate steps manufacturing a semiconductor device of Example VIII-1.

In these FIGS., the reference numeral 201 represents a semiconductor chip; 202, a wiring circuit board carrying thereon the semiconductor chip 201; 203, a bump electrode; 206, a third resin constituting a laminate of encapsulation resin; 207, a polymer film to be formed on the semiconductor chip 201; and 208, a polymer film to be formed on the wiring circuit board 202.

As shown in FIG. 53A, there is prepared a semiconductor chip 201 comprising a silicone substrate 261, an aluminum bonding pad 224 formed on the silicone substrate 261, a barrier metal layer 225 formed on the bonding pad 224, bump electrodes 203 formed on the barrier metal layer 225, and a passivation film 223 composed of PSG (phosphorus silicate glass) and SiN (silicon nitride) and formed on the surface of the substrate 261.

The bump electrodes 203 may be formed by the known vapor deposition method or electroplating method as shown in U.S. Pat. No. 3,458,925, Japanese Patent Unexamined Publication Shou/47-24765 or Japanese Patent Unexamined Publication Hei/2-232928. The material for the bump electrode useful in this Example may be a solder in general, but may be other kind of metal having a higher rigidity as compared with the solder such for example as Au and Cu.

The size of each bump electrode is 100 $\mu$m in diameter, and a plurality of which, or 256 pins in total, are arrayed along the periphery of the semiconductor chip. The size of the semiconductor chip is 10 mm×10 mm, and the bump electrodes consisting of Pb/Sn (40/60) and having a height of 75 $\mu$m±5 $\mu$m are formed on Cu/Ti barrier metal layer 225.

On the passivation film 223 of the semiconductor chip is formed a polymer film 208 which is excellent in wettability with the encapsulation resin, such as a hydrocarbon wax, a fatty acid type wax, a fatty amide type wax or an ester type wax. For example, an ester type wax such as carnauba wax or montan wax is preferable in view of their excellent moisture resistance. Other examples useful in this Example are a long chain carboxylic acid or a metal salt thereof, such as stearic acid, palmitic acid, zinc stearate and calcium stearate; and a low molecular polyethylene wax. These polymers may be employed singly or in combination thereof. Other adhesion assistants may also be coated on the passivation film 223. For example, amine, imidazole, diazabicycloalkene, organic phosphine, zirconium alcoholate and zirconium chelate may be preferably employed. Examples of amine are N,N-dimethyl cyclohexyl amine, N-methyl dicyclohexyl amine, triethylene diamine, diaminophenyl sulfone, dimethylaminomethyl phenol, benzylmethyl amine and tris-dimethylaminomethyl phenol. Examples of imidazole are 2-methyl imidazole, 2-phenyl imidazole, heptadecyl imidazole, 2-heptadecy imidazole, 2-ethyl imidazole and 2-ethyl-4-methyl imidazole. Examples of diazacycloalkene are 1,8-diazabicyclo(5,4,0) undecene-7(DBU) and phenolate of (DUB) (for example, U-CATSA No.1). Examples of organic phosphine are triphenyl phosphine (TPP), tributyl phosphine, tricyclohexyl phosphine and dimethyl diphenyl phosphine.

The wiring circuit board 202 for carrying a semiconductor chip may be formed in accordance with the known method such as described in U.S. Pat. No. 4,811,082 or in the same manner as employed for forming an ordinary glass/epoxy laminate substrate.

Therefore, there is no restriction as to the material and structure of the wiring circuit board 202. In the following explanation, a printed SLC (Surface Laminar Circuit) board comprising a glass/epoxy substrate on which an insulating layer and a conductive layer are build-up is exemplified as the substrate.

Namely, an opening 110 µm in diameter is formed in a connecting terminal area 221 of the wiring circuit board 202 to conform with the location of the bump electrode of the semiconductor chip, thereby exposing Cu as a terminal material. All of the area other than the connecting terminal area 221 was covered with a solder resist 222.

Then, as shown in FIG. 53B, the semiconductor chip 201 is aligned, by making use of a conventional flip-chip bonder provided with a half mirror for performing an alignment, on the wiring circuit board 202, thereby electrically and mechanically contacting the bump electrodes 203 with the connecting terminal 221 of the wiring circuit board 202. At this moment, the wiring circuit board 202 is held on a stage provided with a heating means and preliminarily heated in an atmosphere of nitrogen at a temperature of 200° C. which is higher than the melting point of Pb/Sn (40/60).

While keeping the semiconductor chip 201 contacted with the wiring circuit board 202, a collet 231 sustaining the semiconductor chip 201 is heated in a nitrogen atmosphere at the same temperature of 200° C. as in the case of the stage 232. As a result of this heating, the solder is molten to achieve an electrical and mechanical temporary connection between the semiconductor chip 201 and the electrodes 221 of the wiring circuit board 202. Finally, the wiring circuit board 202 mounting the semiconductor chip 201 thereon is passed through a reflow furnace which is heated to 250° C. and in which nitrogen is filled so as to electrically and mechanically connect the semiconductor chip 201 with the wiring circuit board 202 thereby obtaining a semiconductor device as shown in FIG. 53C.

During this heating step, a self-alignment effect was developed by the surface tension of the solder so that the dislocation more or less of the semiconductor chip 201 brought about during the mounting step can be corrected, thus realizing an accurately aligned bonding of semiconductor chip 201.

In this semiconductor device mounting the semiconductor chip 201 through the flip-chip mounting, the space formed between the semiconductor chip 201 and the wiring circuit board 202 has a height of 50 µm, which is 25 µm smaller than the height of the bump electrode 203 formed in advance on the semiconductor chip 201 before performing the flip-chip mounting.

Then as shown in FIG. 53D, a potting of for example 10 ml of an encapsulation resin 206 into the space formed between the semiconductor chip 201 and the wiring circuit board 202 is performed by using a dispenser 233. As a result, the resin diffuses through a capillarity thereby encapsulating the region encircled by the bump electrodes 203. This potting method of resin may be performed in any manner as long as it is possible to uniformly form a resin layer throughout the space formed between the semiconductor chip 201 and the wiring circuit board 202. For example, the potting method may be performed by potting a resin on a single location or in the shape of L as described in Japanese Patent Unexamined Publication Shou/60-147140.

As for the resin to be useful in this Example, for example, a composition comprising a bisphenol type epoxy resin, an imidazole curing catalyst, an acid anhydride curing agent and 45% by weight of a spherical quartz filler (an average particle diameter: 10 µm, and a maximum particle diameter: 35 µm) will be employed. The viscosity of the resin may be 50 cps (25° C.).

Alternatively, an encapsulation resin composition comprising a main material selected from a novolak type epoxy resin, an alicyclic epoxy resin and a glycidyl ester type resin; a curing agent selected from an acid anhydride, amic acid, aliphatic acid and alkyd resin; and 40 to 50% by weight of a filler (an average particle diameter: 9 µm, a maximum particle diameter: 35 µm and viscosity: 50 to 100 cps (25° C.)) will be employed.

In order to cure the resin, the semiconductor device thus obtained is kept in a clean oven for four hours at a temperature of 80° C. Through these treatments, a semiconductor device shown in FIG. 54 can be obtained. FIG. 55 is a perspective view of the semiconductor device of FIG. 54 as viewed from the top.

FIGS. 56A to 56D illustrate steps manufacturing a semiconductor device of Example VIII-2.

In these FIGS., the reference numeral 201 represents a semiconductor chip; 202, a wiring circuit board carrying thereon the semiconductor chip 201; 203, a bump electrode; 204, a first resin constituting a laminate of encapsulation resin; 205, a second resin constituting a laminate of encapsulation resin; 206, a third resin constituting a laminate of encapsulation resin; 207, a polymer film to be formed on the semiconductor chip 201; and 208, a polymer film to be formed on the wiring circuit board 202.

First, in the same manner as explained above, a semiconductor chip 201 provided with bump electrodes 203 and a glass/epoxy resin substrate (SLC substrate) were prepared.

On the passivation film 223 of the semiconductor chip 201 provided with the bump electrodes 203 was coated a 10 µm-thick a first epoxy encapsulation resin comprising 100 parts by weight of cresol novolak type epoxy resin (ECON-195XL; Sumitomo Kagaku Co.), 54 parts by weight of phenol resin as a curing agent, 100 parts by weight of fused silica as a filler, 0.5 part by weight of benzylmethyl amine as a catalyst, 3 parts by weight of carbon black as an additive and 3 parts by weight of silane coupling agent, these components being pulverized, mixed and molten together, thereby forming a first encapsulation resin layer 204. The coating method of the first encapsulation resin may be arbitrary selected. For example, a screen printing method or a dipping method may be employed. It is also possible to lay a sheet on the surface of the semiconductor chip excluding the portions where the bump electrodes are to be disposed, the sheet being produced by rolling a fused epoxy resin.

The coefficient of thermal expansion of this first encapsulation resin was found to be $40 \times 10^{-6} (°C.^{-1})$. Further, a 10 µm-thick a second epoxy encapsulation resin comprising 350 parts by weight of cresol novolak type epoxy resin (ECON-195XL; Sumitomo Kagaku Co.) containing a different content of a filler from that in the first encapsulation resin, 54 parts by weight of phenol resin as a curing agent, 100 parts by weight of fused silica as a filler, 0.5 part by weight of benzylmethyl amine as a catalyst, 3 parts by weight of carbon black as an additive and 3 parts by weight of silane coupling agent, these components being pulverized, mixed and molten together, was coated on the surface of the wiring circuit board 202 covered in advance with a solder resist 222, thereby forming a second encapsulation resin layer 205. The coating method of this second encapsulation resin may be arbitrary selected.

The coefficient of thermal expansion of this second encapsulation resin was found to be $20 \times 10^{-6} (°C.^{-1})$.

Figure 56A:
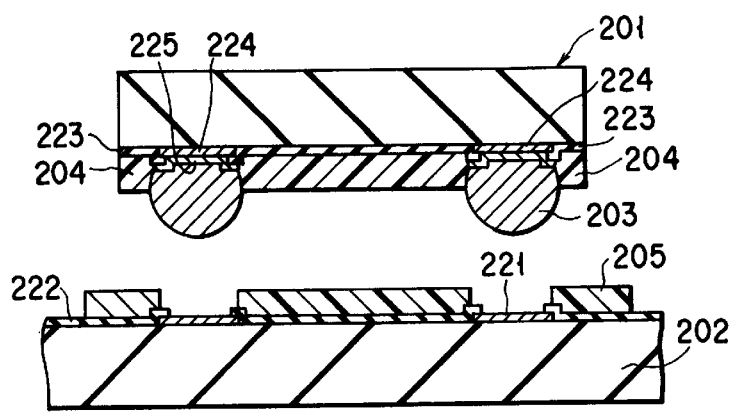
FIGS. 56A to 56D are cross-sectional views illustrating an example of manufacturing process of a semiconductor device according to Example VIII-2 of this invention.
Figure 56B:
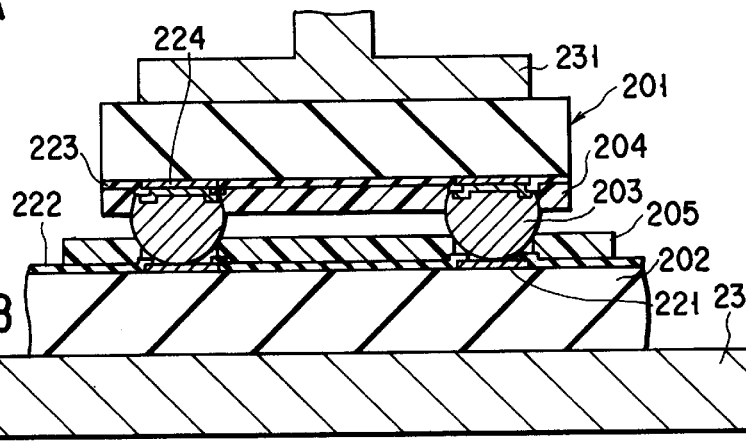
Figure 56C:
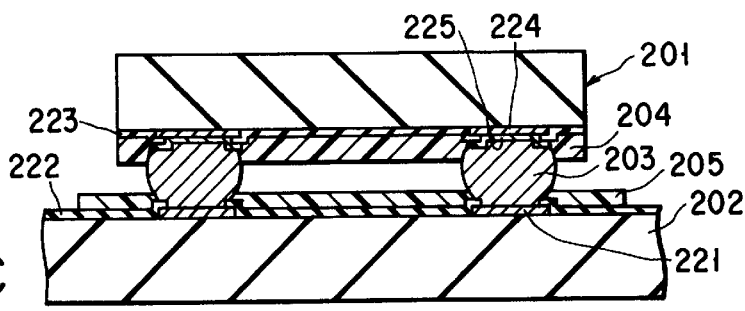

Then, as shown in FIG. 56B, the semiconductor chip 201 is aligned, by making use of a conventional flip-chip bonder provided with a half mirror for performing an alignment, on the wiring circuit board 202, thereby electrically and mechanically contacting the bump electrodes 203 with the connecting terminal 221 of the wiring circuit board 202. While keeping the semiconductor chip 201 contacted with the wiring circuit board 202, a collet 231 sustaining the semiconductor chip 201 is heated in a nitrogen atmosphere at the same temperature of 200° C. as in the case of the stage 232. As a result of this heating, the solder is molten to achieve an electrical and mechanical temporary connection between the semiconductor chip 201 and the electrodes 221 of the wiring circuit board 202. Finally, the wiring circuit board 202 mounting the semiconductor chip 201 thereon is passed through a reflow furnace which is heated to 250° C. and in which nitrogen is filled so as to electrically and mechanically connect the semiconductor chip 201 with the wiring circuit board 202 thereby obtaining a semiconductor device as shown in FIG. 56C.

Figure 56D:
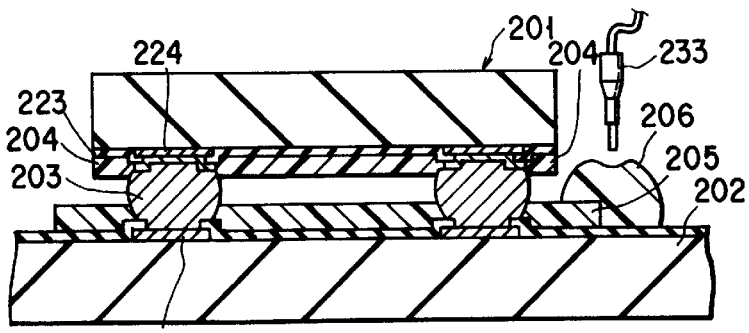

Then as shown in FIG. 56D, a potting of for example 10 ml of an encapsulation resin 206 into the space formed between the semiconductor chip 201 and the wiring circuit board 202 is performed by using a dispenser 233. As a result, the resin diffuses through a capillarity thereby encapsulating the region encircled by the bump electrodes 203.

As for the resin 206, a composition comprising a bisphenol type epoxy resin, an imidazole curing catalyst, an acid anhydride curing agent and 45% by weight of a spherical quartz filler (an average particle diameter: 10 $\mu$m, and a maximum particle diameter: 35 $\mu$m), and having a viscosity of 50 cps (25° C.) and coefficient of thermal expansion of $30 \times 10^{-6} (°C.^{-1})$ may be employed.

It is also possible to laminate another third epoxy resin comprising a third epoxy encapsulation resin comprising 200 parts by weight of cresol novolak type epoxy resin (ECON-195XL; Sumitomo Kagaku Co.) containing a different content of a filler from those in the first and second encapsulation resins, 54 parts by weight of phenol resin as a curing agent, 200 parts by weight of fused silica as a filler, 0.5 part by weight of benzylmethyl amine as a catalyst, 3 parts by weight of carbon black as an additive and 3 parts by weight of silane coupling agent, these components being pulverized, mixed and molten together, and having a coefficient of thermal expansion of $35 \times 10^{-6} (°C.^{-1})$. There is no limitation on this third epoxy encapsulation resin as far as it is possible to ultimately dispose a laminate consisting of layers having a different content of a filler from each other in a space formed between the semiconductor chip and the wiring circuit board.

In order to cure the resin, the semiconductor device thus obtained is kept in a clean oven for four hours at a temperature of 80° C. Through these treatments, a semiconductor device shown in FIG. 57 can be obtained.

FIG. 58 illustrates a cross-sectional view of a semiconductor device of Example VIII-3. As shown in FIG. 58, an annular projection 209 is formed on the surface of the wiring circuit board 202, and then an encapsulating with an encapsulation resin is performed to obtain the semiconductor device of Example VIII-3. The size of the annular projection 209 is 15% to 25% larger than that of the semiconductor chip 201 as to accommodate the chip 202 therein. This method is also applicable to the devices of Examples VIII-1 and VIII-2.

In the Example VIII-3, an annular projection 209 formed of epoxy resin and having an inner diameter of 120 mm×120 mm, an outer diameter of 122 mm×122 mm, a thickness of 2 mm and a height of 75 mm was employed for the convenience of explanation. However, the material and dimension of the annular projection is not limited to such, but can be suitably selected. In this example, an annular projection 209 comprising 200 parts by weight of cresol novolak type epoxy resin (ECON-195XL; Sumitomo Kagaku Co.), 54 parts by weight of phenol resin as a curing agent, 100 parts by weight of fused silica as a filler, 0.5 part by weight of benzylmethyl amine as a catalyst, 3 parts by weight of carbon black as an additive and 3 parts by weight of silane coupling agent, these components being pulverized, mixed and molten together, was employed to shape it into a sheet and then formed into a frame.

In the alignment of the semiconductor chip 201, a conventional flip-chip bonder provided with a half mirror was not used, but this annular projection 209 was used as a guide for achieving a reflow soldering.

As a result, owing to the self-alignment by the solder, an accurate connection of all of the bump electrodes could be achieved, thus inhibiting the generation of defective connection between the bump electrodes and the connection terminals of the wiring circuit board.

Moreover, owing to the presence of the annular projection 209 made of epoxy resin, it was possible to prevent the encapsulation resin 206 on the wiring circuit board 206 from extending excessively around the periphery of the semiconductor chip 201. Thus, the annular projection 209 functions as a stopper frame, making it possible to uniformly dispose the encapsulation resin around the periphery of the semiconductor chip 201.

Then, the reliability of the semiconductor device shown in FIG. 57 illustrating the Example VIII-2 out of Examples VIII-1 to VIII-3 was evaluated, the result being explained as follows.

FIG. 59 illustrates the results of the reliability test, i.e. the relationship between the number of cycle and the accumulative percent defective, performed on a sample wherein 256 pins of bumps, each formed of Pb/Sn (40/60) and having a diameter of 100 $\mu$m, were formed on a semiconductor chip 10 mm×10 mm in size, which was then mounted through a flip-chip mounting on an SLC substrate.

In this FIG. 59, a curve $d_8$ is of a sample wherein an encapsulating with resin was not performed, a curve $c_8$ is of a sample wherein a resin not containing a filler was employed for the encapsulating, a curve $b_8$ is of a sample wherein a resin containing 40% by weight of a filler was employed for the encapsulating, and a curve $a_8$ is of a sample according to Example VIII-2. The number of the sample employed was 1,000, and the heat cycle was conducted under a condition of −55° C. (30 minutes) to 25° C. (5 minutes) to 125° C. (30 minutes) to 25° C. (5 minutes). In this test, any sample exhibiting even one failure of connection of the bump electrode out of 256 pins of the bump electrodes was assumed to be defective. The axis of ordinate represents the accumulative percent defective, and the axis of abscissa represents the number of heat cycle.

In the case of a sample which was not encapsulated with a resin (curve $d_8$), the generation of a defective product was recognized after only 500 cycles, and when the heat cycle was increased to 2,000 cycles, 100% of the samples were recognized as being defective. On the other hand, in the case of a sample which was encapsulated with a resin (curve $c_8$), the reliability of the device was improved as compared with the sample where a resin-encapsulating was not performed, but when a filler was added to the encapsulation resin, the reliability of the device was further improved.

By contrast, when various kinds of resins having their coefficient of thermal expansion varied through the employment of varied content of filler are employed as in Example VIII-2, the generation of a defective product was not recognized even when the heat cycle was increased to 3,000 cycles, indicating the prominent improvement of reliability of the device.

FIG. 60 shows a relationship between the size of the resin disposed in a space between the semiconductor chip and the wiring circuit board and protruded out around the periphery of the semiconductor chip and the reliability life of the resultant semiconductor device, i.e. a relationship between the ratio of the resin protruded out around the semiconductor chip to the size of the semiconductor chip and the number of fatigue life cycle. This evaluation was performed under the same conditions with respect to the shape and number of sample and test environment as those of FIG. 59, i.e. only the kind of substrate was varied. In this FIG. 60, a curve $e_8$ is of a sample wherein an AlN substrate was used, a curve $f_8$ is of a sample wherein a glass substrate was used, and a curve $g_8$ is of a sample wherein an epoxy resin substrate was used. The reliability was evaluated on the basis of $Nf_{50}$ indicating 50% of accumulative percent defective of the samples.

When the size of the extruded resin around the semiconductor chip was less than 15%, a defective of sample wherein the semiconductor chip was peeled from the wiring circuit board was recognized. When the size of the extruded resin around the semiconductor chip was larger than 25%, a defective of sample wherein the resin was entirely peeled from the wiring circuit board was recognized. Whereas, When the size of the extruded resin around the semiconductor chip was within the range of 15% to 25% of chip size, the reliability of the resultant device was always improved. It has been also found that the reliability life of the semiconductor device can be improved when the difference in coefficient of thermal expansion between the resin and the semiconductor chip becomes smaller, i.e. the reliability life decreases as the difference in coefficient of thermal expansion becomes higher.

According to Example VIII-1, since at least either one of the semiconductor chip and the wiring circuit board was covered with a polymer excellent in wettability to the resin, the filling velocity was improved to 1.0 mm/min. as compared with the filling velocity of 0.1 mm/min. in the conventional device, thus the filling time of the resin was accelerated by 10 times. Further, in the case of conventional device, about 10 voids, each about 2 mm×2 mm in size, were generated at the probability of 50%. However, it is possible according to this Example to avoid the generation of such a void.

The pressure distribution over a resin disposed in a space between the semiconductor chip and the wiring circuit board can be represented by the following formula on the basis of the viscous fluid flowing between parallel planes.

$$L=\{(R^2h^4+48\mu Nht)^{1/2}-Rh^2\}/12\mu$$

wherein N is a wet strength, R is a passage resistance at the bump electrodes, L is a filling distance, $\mu$ represents viscosity, t represents time, and h is a dimension of the gap.

As apparent from the above formula that the filling velocity is dependent on the passage resistance, viscosity of the resin and wet strength.

The relationship between the filling distance and encapsulating time was measured on the basis of the above formula, the results being shown in FIG. 61. In FIG. 61, a curve $h_8$ is of a sample wherein the encapsulating with a resin was performed by injecting the encapsulation resin of low viscosity into a space between the semiconductor chip and the wiring circuit board, the surfaces of both being coated with a polymer, a curve $i_8$ is of a sample wherein the encapsulation resin of the ordinary viscosity was injected into a space between the semiconductor chip and the wiring circuit board, the surfaces of both being coated with a polymer, and a curve $j_8$ is of a sample wherein the encapsulation resin was injected into a space between the semiconductor chip and the wiring circuit board, the surfaces of both being not coated with a polymer.

It will be seen from these results that when both of the semiconductor chip and the wiring circuit board were not coated with a polymer, the filling velocity was very slow as shown in the curve $j_8$. In this case, the filling of the resin was sometimes impossible. Whereas, when a polymer excellent in wettability to the encapsulation resin was coated on the surfaces of the semiconductor chip and the wiring circuit board, the filling velocity was accelerated, making it possible to satisfactory perform the filling of resin. Moreover, when the viscosity of the encapsulation resin was lowered for example by heating it in the filling step, the filling velocity of the resin was extremely accelerated.

As for the heat radiation, the heat conductivity of the resin could be improved by adjusting the content of the filler, for example to 20° C./W. Therefore, as compared with the conventional semiconductor device wherein the provision of a heat radiation fin is required, the thickness of semiconductor device according this invention can be diminished to 1/10 of the conventional device.

From these results of tests, it has been found that the reliability of semiconductor device according to this Example is fully satisfactory as compared with the conventional device.

This Example is not limited to those described above, but may be varied in various aspects. For example, the material and structure of the wiring circuit board are not restricted to those described above. The thickness of the resin to be disposed in relative to the height of the bump electrode is not restricted to those described above. The materials for the encapsulation resin may be arbitrary selected as long as they can be relatively varied with respect to the coefficient of thermal expansion. Therefore, the coefficient of thermal expansion of each resin layer can be gradually varied from the semiconductor chip side to the wiring circuit board side, or vice versa.

As explained above, since a polymer excellent in wettability to the encapsulation resin is coated on the surface of at least either one of the semiconductor chip and the wiring circuit board according to Example VIII-1, a uniform sealing of the periphery of semiconductor chip with a resin can be achieved by optimizing the coating area of the polymer. Therefore, where the sealing with a resin of low viscosity is required due to the fine pitch of bump electrodes to be formed on the semiconductor chip, an excessive extension of the encapsulation resin around the periphery of the semiconductor chip can be prevented, hence it is possible to further densify the mounting of a plurality of semiconductor chips.

Since a laminate of resin layers, each differing in the content of filler, is disposed in a space between the semiconductor chip and the wiring circuit board, and around the periphery of the semiconductor chip according to Example VIII-2, it is possible to gradually alleviate the stress strain, hence the reliability of the resultant semiconductor device can be further improved as compared with the conventional semiconductor device.

According to this Example, it is possible to alleviate in stepwise the stress on the peripheral portion of the resin layers thereby preventing the fracture of the resin layers, hence the fracture of the semiconductor device, due to the concentration of the stress on the peripheral portion of the resin layers.

EXAMPLE IX

A semiconductor device according to Example IX-1 will be explained with reference to the drawings.

Figure 62:
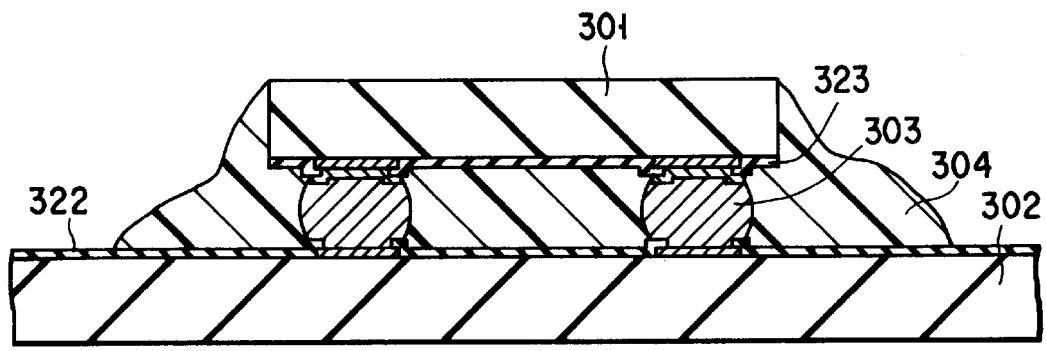
FIG. 62 is a cross-sectional view of a semiconductor device according to Example IX of this invention.
Figure 63:
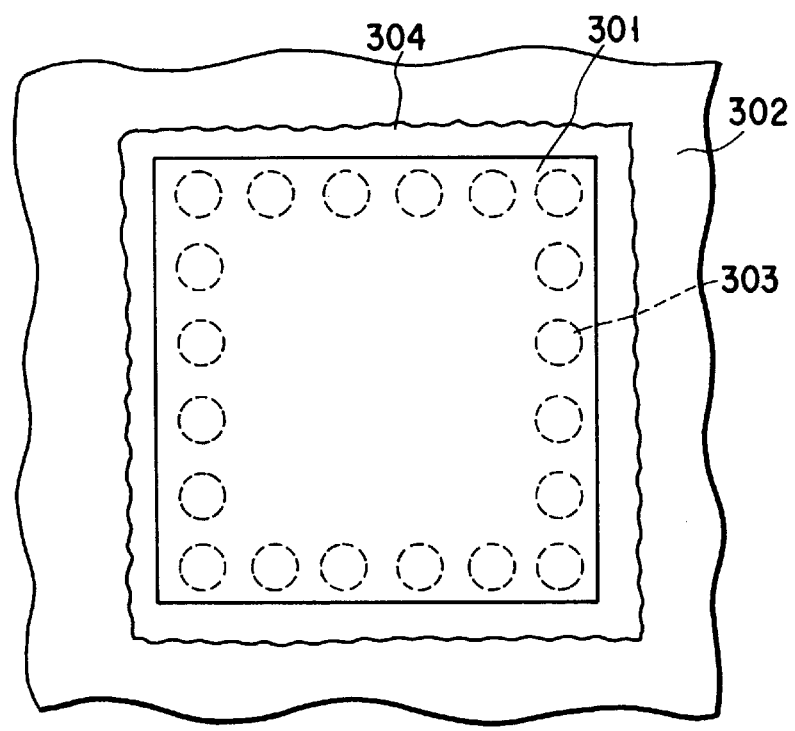
FIG. 63 is a plan view of a semiconductor device according to Example IX of this invention.

FIG. 62 is a cross-sectional view showing an example of the semiconductor device according to Example IX-1, and FIG. 63 is a plan view of the semiconductor device according to Example IX-1. FIGS. 64A to 64D illustrate steps manufacturing the semiconductor device of Example IX-1.

In these FIGS., the reference numeral 301 represents a semiconductor chip; 302, a wiring circuit board carrying thereon the semiconductor chip 301; 303, a bump electrode; 304, an encapsulation resin.

Figure 64A:
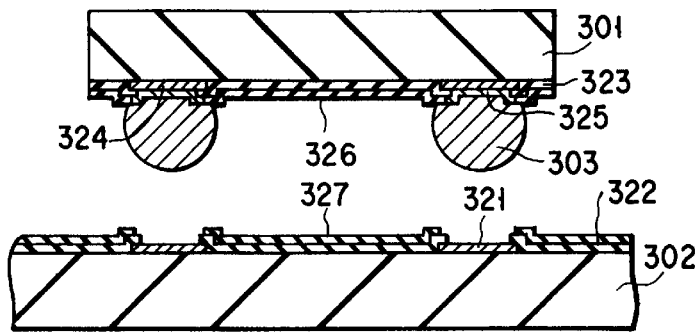
FIGS. 64A to 64D are a cross-sectional view illustrating an example of manufacturing process of a semiconductor device according to Example IX of this invention.

As shown in FIG. 64A, there was prepared a semiconductor chip 301 comprising a substrate, an aluminum bonding pad 324 formed on the substrate, a barrier metal layer 325 formed on the bonding pad 324, bump electrodes 303 formed on the barrier metal layer 325, a passivation film 323 composed of PSG (phosphorus silicate glass) and SiN (silicon nitride) and an adhesion assistant layer 326.

Additionally, a wiring circuit board provided with a connecting terminal 321, a solder resist layer 322 formed on a surface portion of the circuit board other than the connecting terminal 321, and an adhesion assistant layer 327 was prepared.

The bump electrodes 303 may be formed by the known vapor deposition method or electroplating method as shown in U.S. Pat. No. 3,458,925, Japanese Patent Unexamined Publication Shou/47-24765 or Japanese Patent Unexamined Publication Hei/2-232928. The material for the bump electrode 303 useful in this Example may be a solder in general, but may be other kind of metal having a higher rigidity as compared with the solder such for example as Au and Cu.

The size of each bump electrode was 100 μm in diameter, and a plurality of which, or 256 pins in total, were arrayed along the periphery of the semiconductor chip 301. The size of the semiconductor chip 301 was 10 mm×10 mm, and the bump electrodes 303 consisting of Pb/Sn (40/60) and having a height of 78 μm±5 μm were formed on Cu/Ti barrier metal layer 325.

On the passivation film 323 of the semiconductor chip 301 was coated an adhesion assistant layer 326. For example, amine, imidazole, diazabicycloalkene, organic phosphine, zirconium alcoholate and zirconium chelate may be preferably employed as the adhesion assistant layer 326. Examples of amine are N,N-dimethyl cyclohexyl amine, N-methyl dicyclohexyl amine, triethylene diamine, diaminodiphenyl sulfone, dimethylaminomethyl phenol, benzyldimethyl amine and tris-dimethylaminomethyl phenol. Examples of imidazole are 2-methyl imidazole, 2-phenyl imidazole, heptadecyl imidazole, 2-heptadecy imidazole, 2-ethyl imidazole and 2-ethyl-4-methyl imidazole. Examples of diazacycloalkene are 1,8-diazabicyclo(5,4,0) undecene-7(DBU) and phenolate of (DUB) (for example, U-CATSA No.1). Examples of organic phosphine are triphenyl phosphine (TPP), tributyl phosphine, tricyclohexyl phosphine and dimethyl diphenyl phosphine.

The wiring circuit board 302 for carrying a semiconductor chip 301 may be formed in accordance with the known method such as described in U.S. Pat. No. 4,811,082 or in the same manner as employed for forming an ordinary glass/epoxy laminate substrate.

Therefore, there is no restriction as to the material and structure of the wiring circuit board 302. In the following explanation, a printed SLC (Surface Laminar Circuit) board comprising a glass/epoxy substrate on which an insulating layer and a conductive layer are build-up is exemplified as the substrate.

Namely, an opening 110 μm in diameter is formed in a connecting terminal area 321 of the wiring circuit board 302 to conform with the location of the bump electrode of the semiconductor chip 301, thereby exposing Cu as a terminal material. All of the area other than the connecting terminal area 321 was covered with a solder resist 322.

If required, another adhesion assistant such as a hydrocarbon wax, a fatty acid type wax, a fatty amide type wax or an ester type wax may be coated on the solder resist 322. For example, an ester type wax such as carnauba wax or montan wax is preferable in view of their excellent moisture resistance. Other examples useful in this Example are a long chain carboxylic acid or a metal salt thereof, such as stearic acid, palmitic acid, zinc stearate and calcium stearate; and a low molecular polyethylene wax. These polymers may be employed singly or in combination thereof.

Figure 64B:
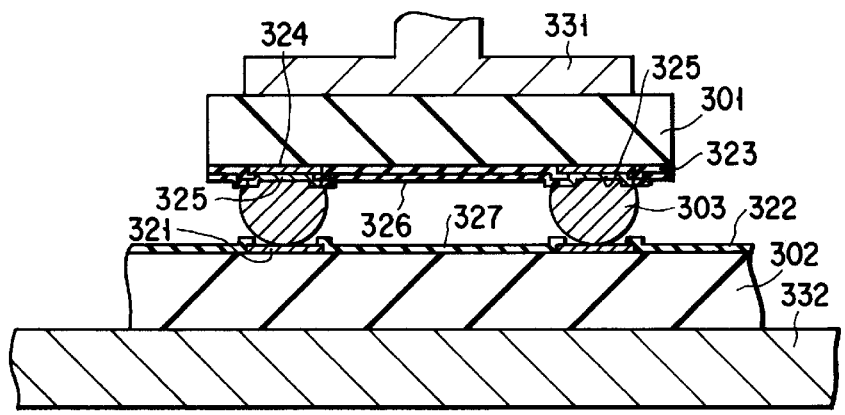

Then, as shown in FIG. 64B, the semiconductor chip 301 was aligned, by making use of a conventional flip-chip bonder provided with a half mirror for performing an alignment, on the wiring circuit board 302, thereby electrically and mechanically contacting the bump electrodes 303 with the connecting terminal 321 of the wiring circuit board 302. At this moment, the wiring circuit board 302 was held on a stage provided with a heating means and preliminarily heated in an atmosphere of nitrogen at a temperature of 200° C. which is higher than the melting point of Pb/Sn (40/60).

While keeping the semiconductor chip 301 contacted with the wiring circuit board 302, a collet 331 sustaining the semiconductor chip 301 was heated in a nitrogen atmosphere at the same temperature of 200° C. as in the case of the stage 332 as shown in FIG. 64B. As a result of this heating, the solder was molten to achieve an electrical and mechanical temporary connection between the semiconductor chip 301 and the electrodes 321 of the wiring circuit board 302. Finally, the wiring circuit board 302 mounting the semiconductor chip 301 thereon was passed through a reflow furnace which is heated to 250° C. and in which nitrogen is filled so as to electrically and mechanically connect the semiconductor chip 301 with the wiring circuit board 302 thereby obtaining a semiconductor device as shown in FIG. 64C.

Figure 64C:
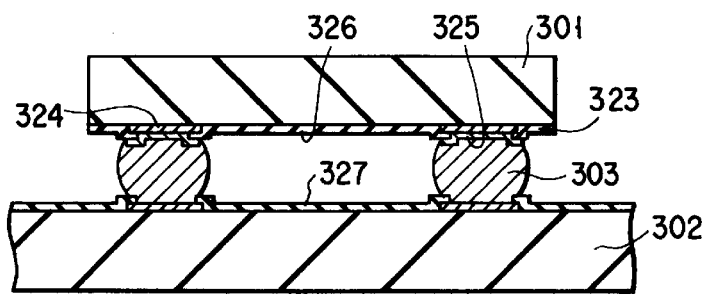

During this heating step, a self-alignment effect was developed by the surface tension of the solder so that the dislocation more or less of the semiconductor chip 301 brought about during the mounting step could be corrected, thus realizing an accurately aligned bonding of semiconductor chip 301 thereby obtaining a semiconductor device as shown in FIG. 64C.

In this semiconductor device mounting the semiconductor chip 301 through the flip-chip mounting, the space formed between the semiconductor chip 301 and the wiring circuit board 302 had a height of 50 μm, which was 25 μm smaller than the height of the bump electrode 303 formed in advance on the semiconductor chip 301 before performing the flip-chip mounting.

Figure 64D:
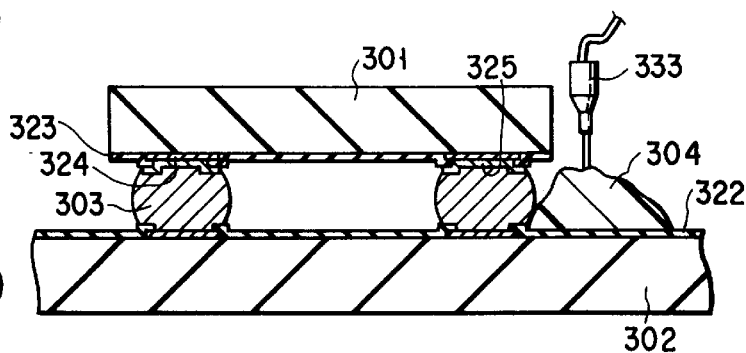

Then as shown in FIG. 64D, a potting of for example 10 ml of an encapsulation resin into the space formed between the semiconductor chip 301 and the wiring circuit board 302 was performed by using a dispenser 333. As a result, the resin diffused through a capillarity thereby sealing the region encircled by the bump electrodes 303. This potting method of resin may be performed in any manner as long as it is possible to uniformly form a resin layer throughout the space formed between the semiconductor chip 301 and the wiring circuit board 302. For example, the potting method may be performed by potting a resin on a single location or in the shape of L as described in Japanese Patent Unexamined Publication Shou/60-147140.

As for the resin to be useful in this Example, for example, a composition comprising a bisphenol type epoxy resin, an imidazole curing catalyst, an acid anhydride curing agent and 45% by weight of a spherical quartz filler (an average particle diameter: 10 µm, and a maximum particle diameter: 35 µm) may be employed. The viscosity of the resin employed in this Example was 50 cps (25° C.).

In order to cure the resin, the semiconductor device thus obtained was kept in a clean oven for four hours at a temperature of 80° C. Through these treatments, a semiconductor device shown in FIGS. 62 and 63 was obtained.

The modulus of rigidity and coefficient of thermal expansion after curing of the resin disposed in the space between the semiconductor chip and the circuit board were found to be 510 kg/mm$^2$ and 23×10$^{-6}$(/°C.), respectively.

Figure 65:
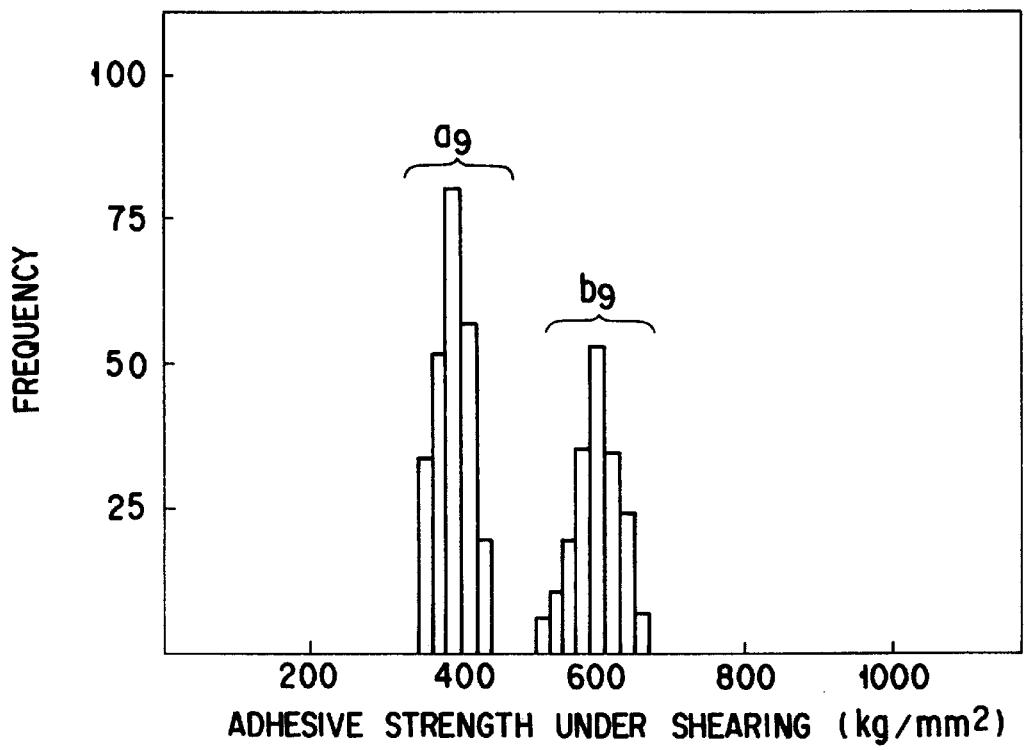
FIG. 65 is a bar graph showing the results of an adhesive strength under shear test performed on the semiconductor device according to Example IX-1 of this invention.
Figure 66:
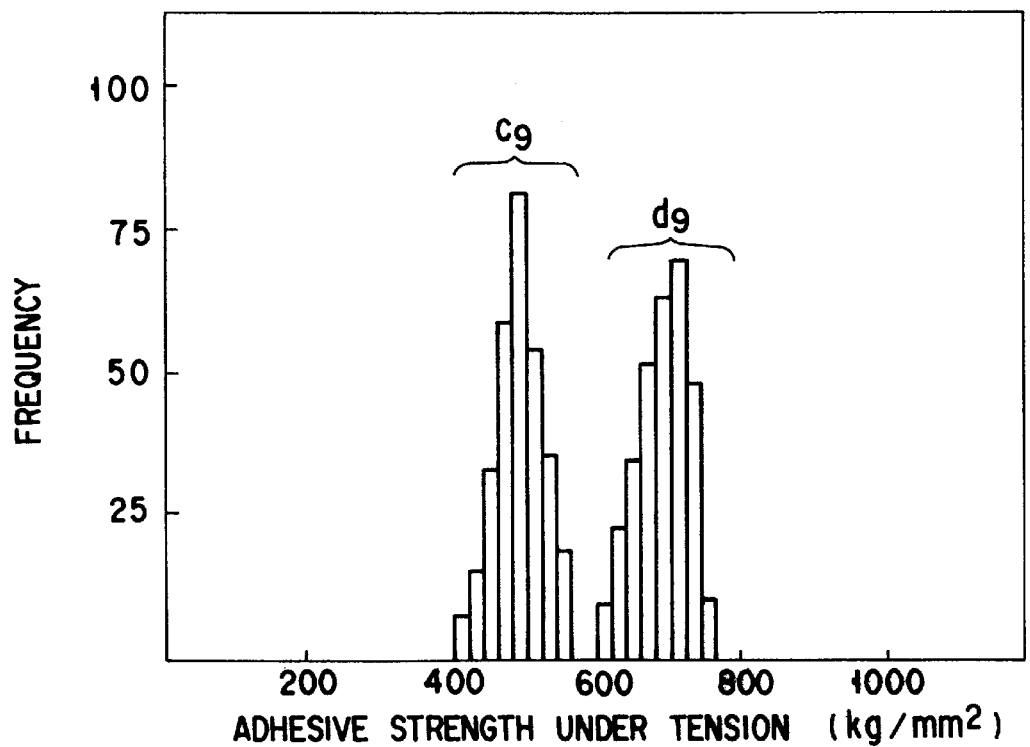
FIG. 66 is a bar graph showing the results of an adhesive strength under tension test performed on the semiconductor device according to Example IX-1 of this invention.

Another adhesion test was performed on the semiconductor device thus obtained. FIG. 65 shows the results of the test regarding adhesive strength under shear thereof. FIG. 66 shows the results of the test regarding adhesive strength under tension thereof. In FIG. 65, a bar graph $a_9$ shows the adhesive strength under shear between the encapsulation resin and the semiconductor chip, and a bar graph $b_9$ shows the adhesive strength under shear between the encapsulation resin and the wiring circuit board. On the other hand, in FIG. 66, a bar graph $c_9$ shows the adhesive strength under tension between the encapsulation resin and the semiconductor chip, and a bar graph $d_9$ shows the adhesive strength under tension between the encapsulation resin and the wiring circuit board. As shown in FIG. 65, the adhesive strength under shear between the encapsulation resin and the semiconductor chip was in the range of 350 kg/mm$^2$ to 450 kg/mm$^2$, while the adhesive strength under shear between the encapsulation resin and the wiring circuit board was in the range of 510 kg/mm$^2$ or more. On the other hand, as shown in FIG. 66, the adhesive strength under tension between the encapsulation resin and the semiconductor chip was in the range of 400 kg/mm$^2$ to 550 kg/mm$^2$, while the adhesive strength under tension between the encapsulation resin and the wiring circuit board was in the range of 600 kg/mm$^2$ or more.

As is well known, the modulus of rigidity and the coefficient of thermal expansion of an encapsulation resin can be easily controlled by adjusting the content of a filler, 45% by weight of a quartz filler (an average particle diameter: 10 µm, and a maximum particle diameter: 35 µm) was added to the resin so as to adjust the modulus of rigidity to 510 kg/mm$^2$ and the coefficient of thermal expansion to 23×10$^{-6}$(°C.$^{-1}$).

Further, the adhesive strength between the encapsulation resin and the semiconductor chip was controlled by changing the kinds of the adhesion assistant 326 to be coated on the surface of the semiconductor chip.

The magnitude of effect of the adhesion assistant on the adhesive strength under shear between the encapsulation resin and the semiconductor chip can be expressed as follows: amine and imidazole>diazacyclo alkene>organic phosphine>zirconium alcoholate>zirconium chelate. The adhesive strength under shear between the encapsulation resin and the semiconductor chip was in the range of about 350 kg/mm$^2$ to 450 kg/mm$^2$. The same magnitude of effect of the adhesion assistant can be obtained on the adhesive strength under tension. Therefore, the adhesive strength under tension between the encapsulation resin and the semiconductor chip was in the range of about 400 kg/mm$^2$ to 550 kg/mm$^2$.

On the other hand, the adhesive strength between the encapsulation resin and the wiring circuit board was controlled by changing the kinds of the adhesion assistant 327 to be coated on the surface of the wiring circuit board.

The magnitude of effect of the adhesion assistant on the adhesive strength under shear between the encapsulation resin and the wiring circuit board can be expressed as follows: hydrocarbon wax>fatty acid type wax>fatty amide type wax>ester type wax. The adhesive strength under tension between the encapsulation resin and the wiring circuit board was about 600 kg/mm$^2$. In this adhesion strength test, imidazole and fatty acid type wax were employed as the adhesion assistants.

The method of sealing a space between the semiconductor chip and the wiring circuit board with a resin is not restricted to the above method of utilizing capillarity, but may be the method as described in Japanese Patent Publication Hei/6-71029 wherein an encapsulation resin is potted in advance on the surface of a wiring circuit board, and then the semiconductor chip is mounted through a flip-chip mounting. Namely, there is no limitation on the method of encapsulating a space between the semiconductor chip and the wiring circuit board, and in a region around the periphery of the semiconductor chip with the use of a resin.

The semiconductor device shown in FIGS. 62 and 63 was evaluated with respect to the reliability thereof, the results being explained below.

FIG. 67 illustrates the results of the reliability test to evaluate the fracture mode, i.e. the relationship between the number of cycle and the accumulative percent defective, performed on a sample wherein 256 pins of bumps, each formed of Pb/Sn (40/60) and having a diameter of 100 µm, were formed on a semiconductor chip 10 mm×10 mm in size, which was then mounted through a flip-chip mounting on an SLC substrate. The heat cycle was conducted under a condition of −55° C. (30 minutes) to 25° C. (5 minutes) to 125° C. (30 minutes) to 25° C. (5 minutes), and the number of the sample employed was 1,000.

In this FIG. 67, any sample exhibiting even one failure of connection of the bump electrode out of 256 pins of the bump electrodes was assumed to be defective. The axis of ordinate represents the accumulative percent defective, and the axis of abscissa represents the number of heat cycle. In this FIG. a curve $e_9$ is of a sample wherein an encapsulating with resin was not performed, a curve $f_9$ is of a sample wherein the sealing with a resin was performed according to the conventional method, and a curve $g_9$ is of a sample according to this invention.

In the case of a sample which was not encapsulated with a resin, the generation of a defective product was recognized after only 500 cycles, and when the heat cycle was increased to 1,000 cycles or more, 100% of the samples were recognized as being defective as shown in the curve $e_9$.

On the other hand, in the case of the conventional sample wherein the magnitude of adhesion strength was made identical on both of the semiconductor chip side and the circuit board side (curve $f_9$), a defective product was recognized at the 3,000th cycle. Whereas, in the sample of this invention (curve $g_9$), a defective product was not recognized until the 5,000th cycle.

This can be attributed to the fact that in the case of this invention, even if a peeling of the resin is generated between the encapsulation resin and the semiconductor chip, the circuit board is not fractured thus improving the reliability of the device.

FIGS. 68 and 69 illustrate the shear stress and the tensile stress. As shown in FIG. 68, a stress in the direction of shearing due to a heat cycle is generated in the direction shown by an arrow on the resin encapsulating the semiconductor chip mounted on the surface of the wiring circuit board. Moreover, as shown in FIG. 69, a tensile stress due to a heat cycle is generated in the direction shown by an arrow on the resin.

Figure 70A:
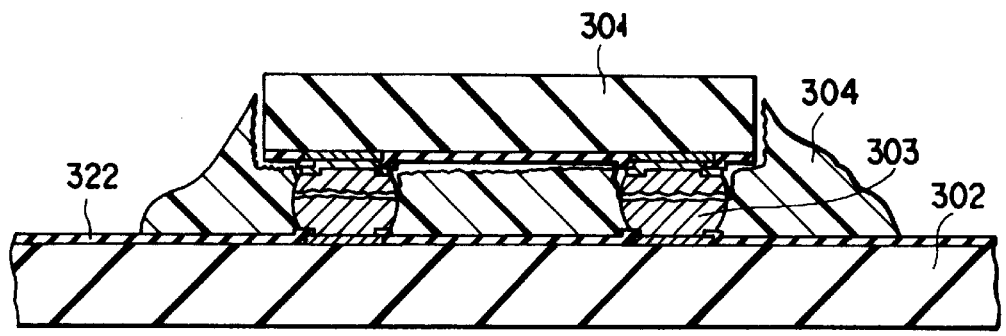
FIGS. 70A and 70B are cross-sectional views illustrating how a fracture will be generated in a semiconductor device as a result of a temperature cycle test.
Figure 70B:
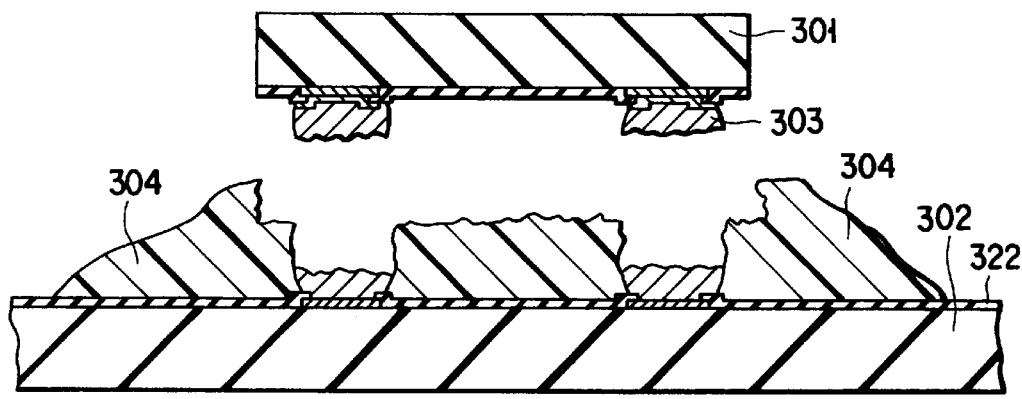

FIGS. 70A and 70B illustrate the manner of fracture of semiconductor device due to a heat cycle. As shown in FIGS. 70A and 70B, when a heat cycle was performed, the semiconductor device formed through a flip-chip mounting exhibited a fracture in the encapsulation resin after 5,000 cycles, but the fracture of the surface of the wiring circuit board as shown in FIGS. 4A and 4B was not recognized. This semiconductor device endured the repeated heat cycle which was equal to or larger than that of the conventional device indicating an improvement in reliability of the device. Thus, a phenomenon of decrease in reliability was not recognized even if the magnitude of adhesion strength between the encapsulation resin and the semiconductor chip was changed from that between the encapsulation resin and the circuit board.

Figure 71:
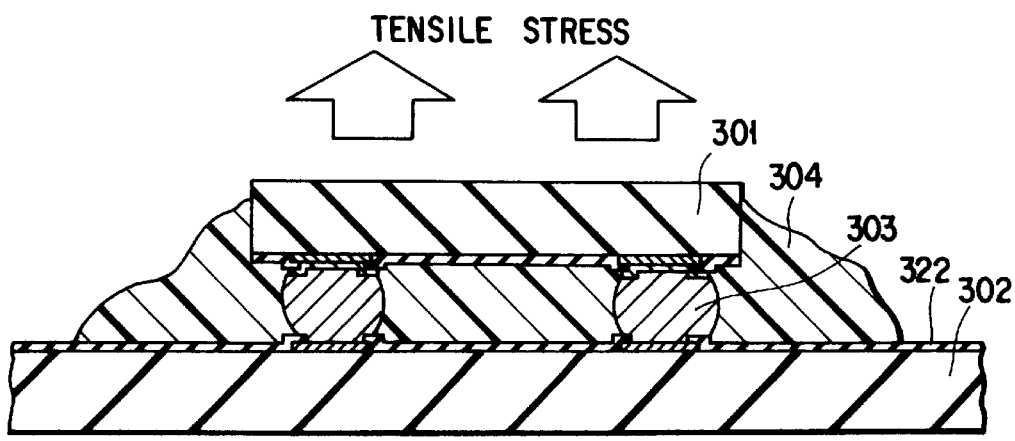
FIG. 71 is a cross-sectional view illustrating a state of a semiconductor device when a tensile stress is applied on a semiconductor chip.
Figure 72:
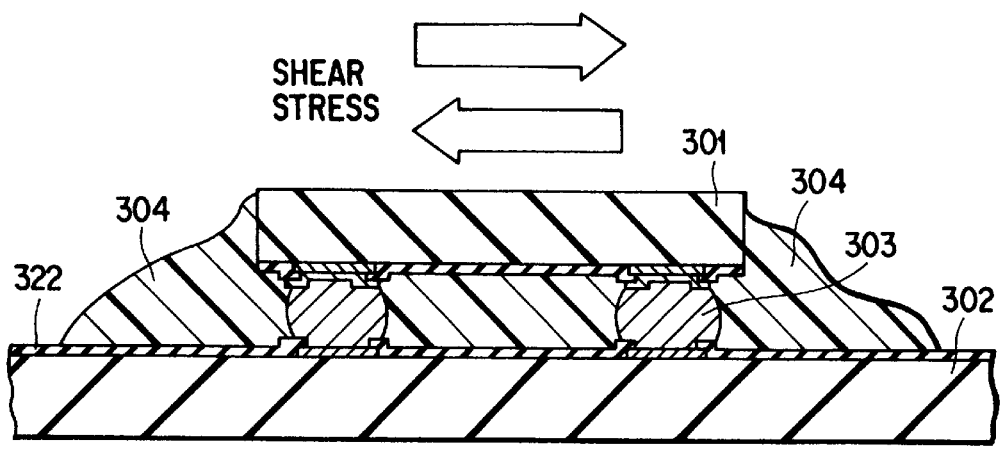
FIG. 72 is a cross-sectional view illustrating a state of a semiconductor device when a shear stress is applied on a semiconductor chip.

In order to repair the semiconductor device, a semiconductor chip was removed with the collet 331 holding a semiconductor chip as shown in FIG. 64B by applying a force on the semiconductor chip in the direction of tensility, in the direction of shearing or in both directions of tensility and shearing. FIGS. 71 and 72 show the manner of applying a force on the semiconductor chip in the direction of tensility and in the direction of shearing, respectively. As a result of the removal of the semiconductor chip, a peeling was caused at the interface between the encapsulation resin and the semiconductor chip, but the fracture of the surface of wiring circuit board as shown in FIGS. 4A and 4B was not recognized.

Figure 73:
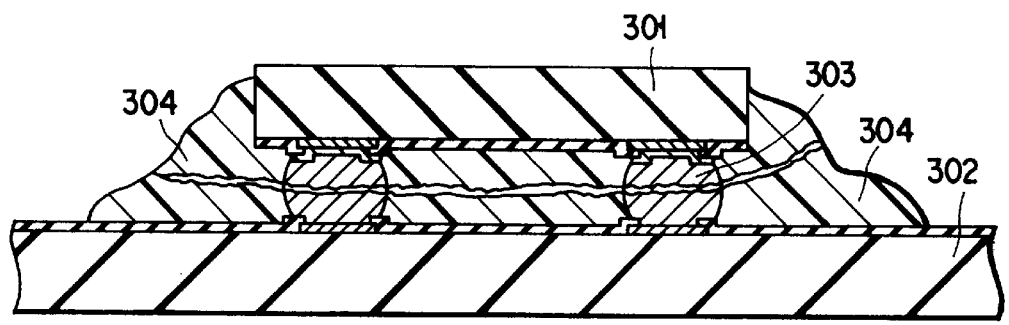
FIG. 73 is a cross-sectional view illustrating how a fracture will be generated in a semiconductor device as a result of a temperature cycle test.
Figure 74:
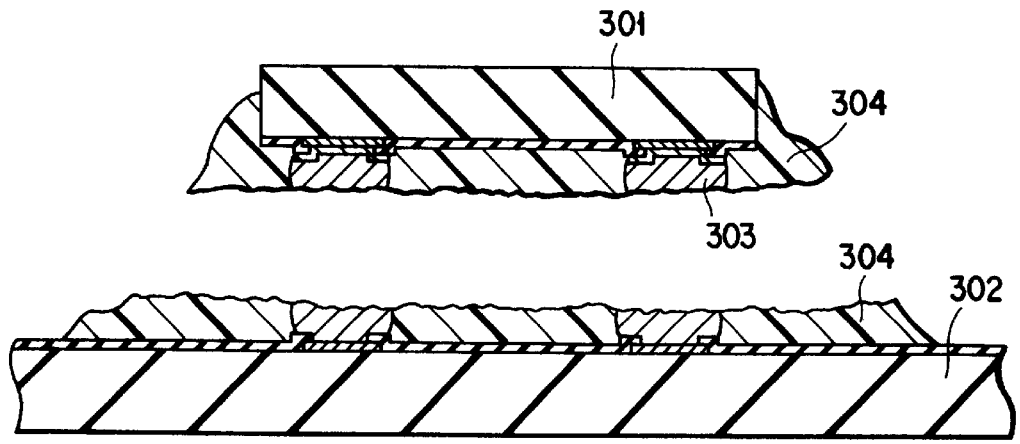
FIG. 74 is a cross-sectional view illustrating how a fracture will be generated in a semiconductor device as a result of a temperature cycle test.

When the semiconductor device was subjected to a heat cycle test, a fracture in the encapsulation resin as shown in FIG. 73 was generated at a ratio of 30%, and a fracture as shown in FIG. 70A was generated at a ratio of 70%. When the semiconductor chip thus fractured was removed using a collet as employed above, the states as shown in FIGS. 70B and 74 were resulted.

In the above explanation, a semiconductor chip was removed through a mechanical means. However, the solder in the device may be fused under the same condition as used for performing the flip-chip mounting of the semiconductor chip so as to remove the semiconductor chip.

Figure 75:
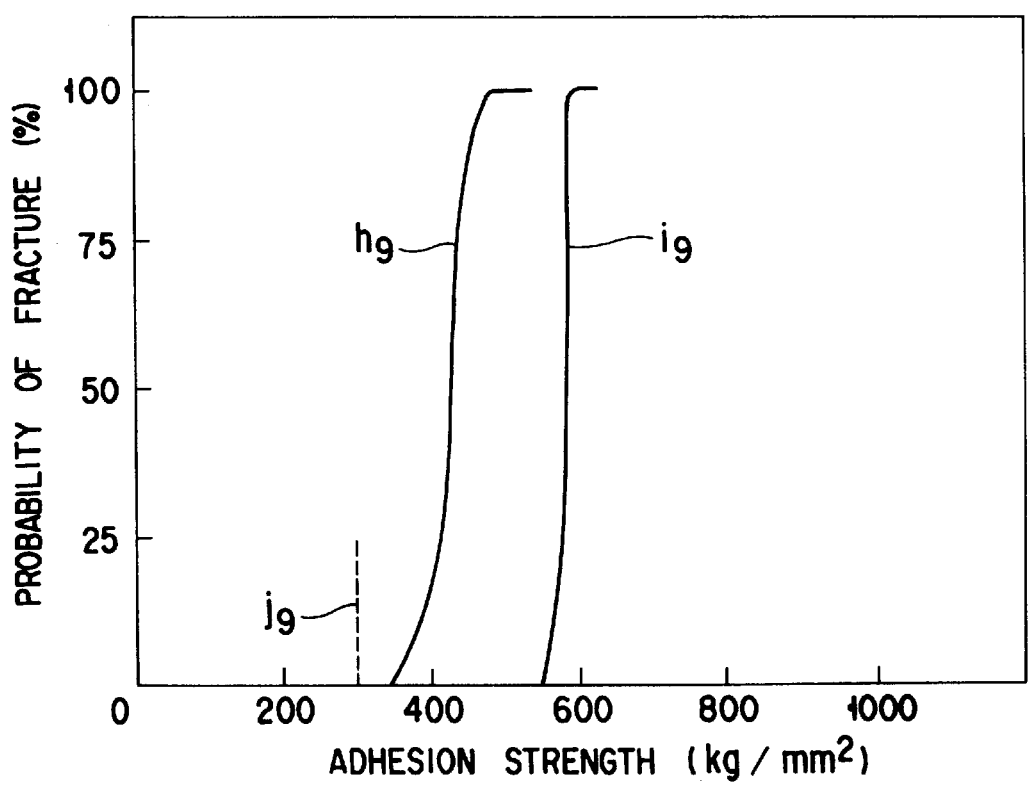
FIG. 75 is a graph showing the relationships between the adhesive strength of an encapsulation resin and the probability of fracture of a semiconductor device.

FIG. 75 is a graph showing a relationship between the adhesion strength of the encapsulation resin and the probability of fracture. In FIG. 75, a curve $h_9$ represents an adhesive strength under shearing, a curve $i_9$ represents an adhesive strength under tension and a dotted line $j_9$ represents the shear strength of the encapsulation resin.

The adhesive strength of the encapsulation resin was controlled by changing the kinds of the adhesion assistant to be coated on the surface of the wiring circuit board.

The magnitude of effect of the adhesion assistant on the adhesive strength between the encapsulation resin and the semiconductor chip can be expressed as follows: amine>imidazole>diazacyclo alkene>organic phosphine>zirconium alcoholate>zirconium chelate. Therefore, the adhesion assistant 326 was suitably selected taking into account the above relationship. Likewise, the magnitude of effect of the adhesion assistant on the adhesive strength between the encapsulation resin and the wiring circuit board can be expressed as follows: hydrocarbon wax>fatty acid type wax>fatty amide type wax>ester type wax. Therefore, the adhesion assistant 327 was suitably selected taking into account the above relationship.

In the graph showing a relationship between the adhesion strength of the encapsulation resin and the probability of fracture in FIG. 75, amine was used as the adhesion assistant 326, and a hydrocarbon wax was used as the adhesion assistant 327.

The shear fracture of the encapsulation resin was generated when the adhesive strength under shearing was in the range of 450 kg/mm$^2$ to 500 kg/mm$^2$, while the peel fracture of the resin between the encapsulation resin and the surface of semiconductor chip was generated when the adhesive strength under tension was in the range of 550 kg/mm$^2$ to 580 kg/mm$^2$.

Therefore, it was found that the fracture of the surface of the wiring circuit board due to the fractures of the semiconductor chip and the encapsulation resin can be prevented if the adhesive strength under shearing between the semiconductor chip and the encapsulation resin was made less than 450 kg/mm$^2$ to 500 kg/mm$^2$, the adhesive strength under tension thereof was made less than 550 kg/mm$^2$ to 580 kg/mm$^2$, the adhesive strength under shearing between the wiring circuit board and the encapsulation resin was made higher than 450 kg/mm$^2$ to 500 kg/mm$^2$, and the adhesive strength under tension thereof was made higher than 550 kg/mm$^2$ to 580 kg/mm$^2$.

A semiconductor device according to Example IX-2 will be explained with reference to the drawings.

In this Example IX-2, a semiconductor device was manufactured in the same manner as in Example IX-1 except that the kind of the adhesion assistant 326 to be coated on the surface of a semiconductor chip and the kind of the adhesion assistant 327 to be coated on the surface of a wiring circuit board were reversed from those in Example IX-1, and at the same time, the content of the filler was changed to 55% weight.

FIGS. 62 and 63 show the semiconductor device thus obtained. The modulus of rigidity and coefficient of thermal expansion after curing of the resin disposed in the space between the semiconductor chip and the circuit board were found to be 710 kg/mm$^2$ and 23×10$^{-6}$(/°C.), respectively.

Another adhesion test was performed on the semiconductor device thus obtained. FIG. 76 shows the results of the test regarding adhesive strength under shear thereof. FIG. 77 shows the results of the test regarding adhesive strength under tension thereof. In FIG. 76, a bar graph $k_9$ shows the adhesive strength under shear between the encapsulation resin and the wiring circuit board, a bar graph $l_9$ shows the adhesive strength under shear between the encapsulation resin and the semiconductor chip, and a bar graph $m_9$ shows the adhesive strength under shear between the wiring circuit board and the interconnecting portion formed on the circuit board. On the other hand, in FIG. 77, a bar graph $n_9$ shows the adhesive strength under tension between the encapsulation resin and the wiring circuit board, a bar graph $o_9$ shows the adhesive strength under tension between the encapsulation resin and the semiconductor chip, and a bar graph $p_9$ shows the adhesive strength under tension between the wiring circuit board and the interconnecting portion formed on the circuit board.

The adhesive strength under shear between the encapsulation resin and the wiring circuit board was in the range of 350 kg/mm² to 450 kg/mm², while the adhesive strength under shear between the encapsulation resin and the semiconductor chip was in the range of 510 kg/mm² to 650 kg/mm². On the other hand, the adhesive strength under tension between the encapsulation resin and the wiring circuit board was in the range of 400 kg/mm² to 550 kg/mm², while the adhesive strength under tension between the encapsulation resin and the semiconductor chip was in the range of 600 kg/mm² to 630 kg/mm². Further, the adhesive strength under shear between the wiring circuit board and the interconnecting portion formed on the circuit board was in the range of 720 kg/mm² or more, while the adhesive strength under tension between the wiring circuit board and the interconnecting portion formed on the circuit board was in the range of 690 kg/mm² or more.

As is well known, the modulus of rigidity and the coefficient of thermal expansion of an encapsulation resin can be easily controlled by adjusting the content of a filler, 45% by weight of a quartz filler (an average particle diameter: 10 μm, and a maximum particle diameter: 35 μm) was added to the resin so as to adjust the modulus of rigidity to 510 kg/mm² and the coefficient of thermal expansion to $23 \times 10^{-6}$(°C.$^{-1}$).

Further, the adhesive strength between the encapsulation resin and the semiconductor chip was controlled by changing the kinds of the adhesion assistant 326 to be coated on the surface of the semiconductor chip.

The magnitude of effect of the adhesion assistant on the adhesive strength under shear between the encapsulation resin and the semiconductor chip can be expressed as follows: hydrocarbon wax>fatty acid type wax>fatty amide type wax>ester type wax. The adhesive strength under shear between the encapsulation resin and the semiconductor chip was in the range of about 600 kg/mm² to 630 kg/mm².

On the other hand, the adhesive strength between the encapsulation resin and the wiring circuit board was controlled by changing the kinds of the adhesion assistant 327 to be coated on the surface of the wiring circuit board.

The magnitude of effect of the adhesion assistant on the adhesive strength under shear between the encapsulation resin and the wiring circuit board can be expressed as follows: amine and imidazole>diazacyclo alkene>organic phosphine>zirconium alcoholate>zirconium chelate. The adhesive strength under tension between the encapsulation resin and the wiring circuit board was about 350 kg/mm² to 450 kg/mm². The same magnitude of effect of the adhesion assistant can be obtained on the adhesive strength under tension. Therefore, the adhesive strength under tension between the encapsulation resin and the wiring circuit board was in the range of about 400 kg/mm² to 550 kg/mm².

In this adhesion strength test, imidazole and fatty acid type wax were employed as the adhesion assistants.

FIG. 78 illustrates the results of the reliability test to evaluate the fracture mode, i.e. the relationship between the number of cycle and the accumulative percent defective, performed on a sample wherein 256 pins of bumps, each formed of Pb/Sn (40/60) and having a diameter of 100 μm, were formed on a semiconductor chip 10 mm×10 mm in size, which was then mounted through a flip-chip mounting on an SLC substrate.

In this FIG. 78, a curve $q_9$ is of a sample wherein an encapsulating with resin was not performed, a curve $r_9$ is of a sample wherein the sealing with a resin was performed according to the conventional method, and a curve $s_9$ is of a sample according to this invention.

In this test, any sample exhibiting even one failure of connection of the bump electrode out of 256 pins of the bump electrodes was assumed to be defective. The axis of ordinate represents the accumulative percent defective, and the axis of abscissa represents the number of heat cycle.

In the case of a sample which was not encapsulated with a resin ($q_9$), the generation of a defective product was recognized after only 500 cycles, and when the heat cycle was increased to 1,000 cycles or more, 100% of the samples were recognized as being defective.

On the other hand, in the case of the conventional sample wherein the magnitude of adhesion strength was made identical on both of the semiconductor chip side and the circuit board side (curve $r_9$), a defective product was recognized at the 3,000th cycle. Whereas, in the sample of this invention (curve $s_9$), a defective product was not recognized until the 5,000th cycle.

This can be attributed to the fact that in the case of this invention, even if a peeling of the resin is generated between the encapsulation resin and the semiconductor chip, the circuit board is not fractured thus improving the reliability of the device.

As for the conditions for heat cycle and the manner of the fracture on this Example IX-2 were the same as those in Example IX-1. Any phenomenon of decrease in reliability was not recognized even if the magnitude of adhesion strength between the encapsulation resin and the semiconductor chip was changed from that between the encapsulation resin and the circuit board.

In order to repair the semiconductor device, a semiconductor chip was removed with the collet 331 holding a semiconductor chip as shown in FIG. 64B by applying a force on the semiconductor chip in the direction of tensility, in the direction of shearing or in both directions of tensility and shearing. FIGS. 71 and 72 show the manner of applying a force on the semiconductor chip in the direction of tensility and in the direction of shearing, respectively. As a result of the removal of the semiconductor chip, a peeling was caused at the interface between the encapsulation resin and the semiconductor chip, but the fracture of the surface of wiring circuit board as shown in FIGS. 4A and 4B was not recognized.

When the semiconductor device was subjected to a heat cycle test, a fracture in the encapsulation resin as shown in FIG. 70A was generated at a ratio of 100%. When the semiconductor chip thus fractured was removed using a collet as employed above, the state as shown in FIG. 70B was resulted.

FIG. 79 is a graph showing a relationship between the adhesion strength of the encapsulation resin and the probability of fracture. The adhesion strength of the encapsulation resin is controlled by varying the adhesion assistant to be coated on the surface of the semiconductor chip and the surface of the wiring circuit board. In FIG. 79, a curve $t_9$ represents an adhesive strength under shearing, a curve $u_9$ represents an adhesive strength under tension and a dotted line $v_9$ represents the shear strength of the encapsulation resin.

The magnitude of effect of the adhesion assistant on the adhesive strength between the encapsulation resin and the semiconductor chip can be expressed as follows: hydrocarbon wax>fatty acid type wax>fatty amide type wax>ester type wax. Therefore, the adhesion assistant 326 was suitably selected taking into account the above relationship.

Likewise, the magnitude of effect of the adhesion assistant on the adhesive strength between the encapsulation resin and the wiring circuit board can be expressed as follows: amine>imidazole>diazacyclo alkene>organic phosphine>zirconium alcoholate>zirconium chelate. Therefore, the adhesion assistant 327 was suitably selected taking into account the above relationship.

In the graph showing a relationship between the adhesion strength of the encapsulation resin and the probability of fracture in FIG. 79, amine was used as the adhesion assistant 326, and a hydrocarbon wax was used as the adhesion assistant 327.

The shear fracture at the interface between the encapsulation resin and the wiring circuit board was generated when the adhesive strength under shearing was in the range of 450 $kg/mm^2$ to 500 $kg/mm^2$, while the peel fracture of the resin between the encapsulation resin and the surface of semiconductor chip was generated when the adhesive strength under tension was in the range of 550 $kg/mm^2$ to 580 $kg/mm^2$.

Therefore, it was found that the fracture of the surface of the wiring circuit board due to the removal of the semiconductor chip and the encapsulation resin can be prevented, and at the same time, the residual of the encapsulation resin on the circuit board in the removal thereof can be prevented, if the adhesive strength under shearing between the wiring circuit board and the encapsulation resin was made less than 450 $kg/mm^2$ to 500 $kg/mm^2$, the adhesive strength under tension thereof was made less than 550 $kg/mm^2$ to 580 $kg/mm^2$, the adhesive strength under shearing between the semiconductor chip and the encapsulation resin was made higher than 450 $kg/mm^2$ to 500 $kg/mm^2$, the adhesive strength under tension thereof was made higher than 550 $kg/mm^2$ to 580 $kg/mm^2$, the adhesive strength under shear between the wiring circuit board and the interconnecting portion formed on the circuit board was in the range of 500 $kg/mm^2$ or more, and the adhesive strength under tension between the wiring circuit board and the interconnecting portion formed on the circuit board was in the range of 580 $kg/mm^2$ or more.

Since the magnitude of the modulus of rigidity of the encapsulation resin is made smaller than the adhesive strength between the encapsulation resin and the circuit board in this Example IX, there was no possibility of the circuit board being fractured by the action of the resin during a heat cycle thereof.

Moreover, since the magnitude of the modulus of rigidity of the encapsulation resin is not lower than that of the resin used in the prior art and at the same time, the coefficient of thermal expansion thereof is controlled through the adjustment in content of a filler to the same level as that of the conventionally used resin, the reliability of the semiconductor device can be retained to a high level at least as that of the conventional semiconductor device of the seal-type structure. This excellency in reliability was also confirmed through a heat cycle test.

It has been found possible according to the above method to prevent a wiring circuit board from being fractured even if a thermal stress due to a heat cycle is acted thereon or a semiconductor chip is removed therefrom.

It was possible to remove any residual encapsulation resin on the surface of a wiring circuit board by dissolving it with an organic solvent. It was possible to remove any solder remaining on the connecting terminal to be contacted with a semiconductor chip of a wiring circuit board by way of the conventional method using a porous copper block. Therefore, it has become possible to clean the connecting terminal or the semiconductor-mounting portion on the surface of a wiring circuit board by way of these methods, thus making it possible to reassemble a semiconductor chip on the wiring circuit board.

The yield of the reassembling of a semiconductor chip on the original wiring circuit board was 95% which was almost equivalent to the assembling yield of initially mounting a semiconductor chip on a wiring circuit board. When this reassembled semiconductor device was subjected to a heat cycle test, the number of cycle was almost the same as that of the semiconductor device which was not repaired, thus indicating that the repair of a semiconductor chip would not brought about any deterioration of reliability of the semiconductor device.

This Example is not limited to those described in above, but may be modified. For example, the size of a semiconductor chip, the number and pitch of bump electrode may be arbitrarily selected. The layout may be of an realized form. The encapsulation resin should preferably be a thermosetting resin of non-solvent type in general, but the resin is not limited to bisphenol type epoxy resin.

According to this Example, a fracture due to heat strain if any would be generated either the semiconductor chip side or the wiring circuit board side, but would never be generated at both of the semiconductor chip and circuit board sides simultaneously.

It is possible according to this Example to avoid the fracture of an encapsulation resin at the location of the interconnecting portion of a wiring circuit board, so that a semiconductor chip can be easily repaired.

Moreover, when the removal of a semiconductor chip is found required to repair it after an electrical examination of a flip-chip mounted semiconductor device encapsulated with a resin, the semiconductor chip will be removed together with the encapsulation resin without causing a fracture of interconnecting layer and insulating layer on a wiring circuit board as well as without leaving the cured encapsulation resin on the wiring circuit board, thus assuring a reliable repair of the semiconductor chip.

As explained above, the semiconductor device according to this Example is excellent in reliability as compared with the conventional semiconductor device, and can be easily repaired.

As explained above, it is possible according to this invention to reduce any stress strain or distortion that might be generated at the connection portions of the bump electrodes contacting with a semiconductor chip and a wiring circuit board, and to extremely improve the reliability life of the semiconductor device.

The semiconductor device according to this invention can be applied to various kinds of apparatus, thus making it very valuable in industrial point of view.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising a wiring circuit board and a semiconductor chip mounted through bump electrodes to the circuit board, a space between the circuit board and the semiconductor chip as well as a periphery of the semiconductor chip being encapsulated with a resin containing a filler, wherein the resin comprises a first resin and a second resin which are divided by the bump electrodes located on an outermost periphery of said semiconductor chip, the first resin is surrounded by the bump electrodes and a content of the filler in the first resin is smaller than the content of the filler in the second resin.

2. The semiconductor device according to claim 1, wherein said content of the filler in the first resin is in the range of 5% by weight to 45% by weight and said content of the filler in the second resin is in the range of 20% by weight to 60% by weight.

3. The semiconductor device according to claim 1, wherein said content of the filler in the first resin is in the range of 20% by weight to 40% by weight and said content of the filler in the second resin is in the range of 30% by weight to 45% by weight.

4. The semiconductor device according to claim 1, wherein the content of at least one of sodium ions and chlorine ions is lower in the first resin than in the second resin.

5. The semiconductor device according to claim 4, wherein the content of each of sodium ions and chlorine ions in the first resin is 1 ppm or less and 5 ppm or less, respectively, and the content of each of sodium ions and chlorine ions in the second resin is 10 ppm or less.

6. The semiconductor device according to claim 1, wherein the first resin has a higher coefficient of thermal expansion and a lower elastic modulus than the second resin.

7. A semiconductor device comprising a wiring circuit board and a semiconductor chip mounted through bump electrodes to the circuit board, a space between the circuit board and the semiconductor chip as well as a periphery of the semiconductor chip being encapsulated with a resin containing a filler, wherein the resin comprises a first resin and a second resin which are divided by the bump electrodes located on an outermost periphery of said semiconductor chip, the first resin is surrounded by the bump electrodes and a maximum particle diameter of said filler in the first resin is smaller than the maximum particle diameter of the filler in the second resin.

8. The semiconductor device according to claim 7, wherein said maximum particle diameter of the filler in the first resin is 7 $\mu$m to 45 $\mu$m and said maximum particle diameter of the filler in the second resin is 15 $\mu$m to 60 $\mu$m.

9. The semiconductor device according to claim 7, wherein said maximum particle diameter of the filler in the first resin is 15 $\mu$m to 40 $\mu$m and said maximum particle diameter of the filler in the second resin is 30 $\mu$m to 50 $\mu$m.

10. The semiconductor device according to claim 7, wherein the content of at least one of sodium ions and chlorine ions is lower in the first resin than in the second resin.

11. The semiconductor device according to claim 10, wherein the content of sodium ions and chlorine ions in the first resin is 1 ppm or less and 5 ppm or less, respectively, and the content of each of sodium ions and chlorine ions in the second resin is 10 ppm or less.

12. The semiconductor device according to claim 7, wherein the first resin has a higher coefficient of thermal expansion and a lower elastic modulus than the second resin.

13. A semiconductor device comprising a wiring circuit board and a semiconductor chip mounted through bump electrodes to the circuit board, a space between the circuit board and the semiconductor chip as well as a periphery of the semiconductor chip is encapsulated with a resin containing a filler, wherein the resin comprises a first resin and a second resin which are divided by the bump electrodes located on an outermost periphery of said semiconductor chip, the first resin is surrounded by the bump electrodes and an average particle diameter of said filler in the first resin is smaller than the average particle diameter of the filler in the second resin.

14. The semiconductor device according to claim 13, wherein said average particle diameter of the filler in the first resin is 5 $\mu$m to 25 $\mu$m and said average particle diameter of the filler in the second resin is 10 $\mu$m to 45 $\mu$m.

15. The semiconductor device according to claim 13, wherein said average particle diameter of the filler in the first resin is 7 $\mu$m to 20 $\mu$m and said average particle diameter of the filler in the second resin is 15 $\mu$m to 40 $\mu$m.

16. The semiconductor device according to claim 13, wherein the content of at least one of sodium ions and chlorine ions is lower in the first resin than in the second resin.

17. The semiconductor device according to claim 16, wherein the content of sodium ions and chlorine ions in the first resin is 1 ppm or less and 5 ppm or less, respectively, and the content of each of sodium ions and chlorine ions in the second resin is 10 ppm or less.

18. The semiconductor device according to claim 13, wherein the first resin has a higher coefficient of thermal expansion and a lower elastic modulus than the second resin.

* * * * *

UNITED STATES PATENT AND TRADEMARK OFFICE
CERTIFICATE OF CORRECTION

PATENT NO. : 5,864,178
DATED : January 26, 1999
INVENTOR(S) : Hiroshi YAMADA, et al.

It is certified that error appears in the above-indentified patent and that said Letters Patent is hereby corrected as shown below:

On the title page, Item [30], the Foreign Application Priority Data, should read:

--Jan. 12, 1995 [JP] Japan.............7-003518
  Jun. 29, 1995 [JP] Japan.............7-163393
  Jul. 17, 1995 [JP] Japan.............7-180441
  Aug. 29, 1995 [JP] Japan.............7-220642--

Signed and Sealed this

Twenty-eighth Day of September, 1999

Attest:

Q. TODD DICKINSON

*Attesting Officer*  *Acting Commissioner of Patents and Trademarks*